(12) United States Patent
Choi et al.

(10) Patent No.: US 12,243,493 B2
(45) Date of Patent: Mar. 4, 2025

(54) DISPLAY PANEL AND DISPLAY DEVICE

(71) Applicant: LG Display Co., Ltd., Seoul (KR)

(72) Inventors: Jaeyi Choi, Paju-si (KR); SooHong Choi, Paju-si (KR); HongJae Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/585,820

(22) Filed: Feb. 23, 2024

(65) Prior Publication Data
US 2024/0290280 A1   Aug. 29, 2024

(30) Foreign Application Priority Data
Feb. 28, 2023   (KR) ........................ 10-2023-0027297

(51) Int. Cl.
*G09G 3/3266* (2016.01)
*G09G 3/3241* (2016.01)
*H10K 59/131* (2023.01)

(52) U.S. Cl.
CPC ......... *G09G 3/3266* (2013.01); *G09G 3/3241* (2013.01); *H10K 59/131* (2023.02); *G09G 2300/0819* (2013.01); *G09G 2300/0842* (2013.01); *G09G 2310/0291* (2013.01)

(58) Field of Classification Search
None
See application file for complete search history.

(56) References Cited

U.S. PATENT DOCUMENTS

| | | | |
|---|---|---|---|
| 2017/0139292 A1 | 5/2017 | Yu et al. | |
| 2019/0043405 A1 | 2/2019 | Noh et al. | |
| 2020/0066203 A1 | 2/2020 | Kim | |
| 2020/0327854 A1 | 10/2020 | Park et al. | |
| 2024/0290277 A1* | 8/2024 | Seo | G09G 3/32 |
| 2024/0290797 A1* | 8/2024 | Jang | H01L 27/1244 |

FOREIGN PATENT DOCUMENTS

CN   104900206 A   9/2015

OTHER PUBLICATIONS

Extended European Search Report issued on Jun. 3, 2024 for Europe Patent Application No. 24160244.0.

* cited by examiner

*Primary Examiner* — Stephen T. Reed
(74) *Attorney, Agent, or Firm* — Morgan, Lewis & Bockius LLP

(57) ABSTRACT

The present disclosure relates to a display panel and a display device, and can provide a display panel and a display device that have a clock signal line arrangement structure that is advantageous to electrostatic discharge.

20 Claims, 43 Drawing Sheets

DISPLAY PANEL AND DISPLAY DEVICE

CROSS-REFERENCE TO RELATED APPLICATION

This application claims the priority benefit of Republic of Korea Patent Application No. 10-2023-0027297, filed on Feb. 28, 2023, in the Korean Intellectual Property Office, which is incorporated herein by reference for all purposes as if fully set forth herein.

BACKGROUND

Technical Field

The present disclosure relates to electronic devices with a display, and more specifically, to a display panel and a display device.

Description of the Related Art

A display device may include a display panel in which a plurality of data lines and a plurality of gate lines are disposed, a data driving circuit for outputting data signals to the plurality of data lines, a gate driving circuit for outputting gate signals to the plurality of gate lines, and the like.

In order for images to be displayed normally on the display device, gate signals are desired to be supplied normally through the plurality of gate lines. That is, in order to present images normally, it is necessary for gate driving to be performed normally. However, in a situation where gate driving is not performed normally, image quality may be degraded.

SUMMARY

One or more embodiments of the present disclosure may provide a gate driving panel circuit having a structure suitable for a gate-in-panel (GIP) type, and a display device including the gate driving panel circuit.

One or more embodiments of the present disclosure may provide a display panel and a display device that have an effective electrostatic discharge structure.

One or more embodiments of the present disclosure may provide a display panel and a display device that have a clock signal line arrangement structure that is advantageous to electrostatic discharge.

One or more embodiments of the present disclosure may provide a display panel and a display device that have a scan pull-up transistor that is advantageous to electrostatic discharge.

One or more embodiments of the present disclosure may provide a display device have a wiring structure for stably supplying various types of signals or power to a gate driving panel circuit disposed in a display panel.

According to aspects of the present disclosure, a display device can be provided that includes a substrate including a display area in which images can be displayed and a non-display area different from the display area, a gate driving panel circuit disposed in the non-display area, configured to output a carry signal based on a carry clock signal, and configured to output a scan signal based on a scan clock signal, a carry clock signal line disposed in the non-display area and delivering the carry clock signal to the gate driving panel circuit, and a scan clock signal line disposed in the non-display area and delivering the scan clock signal to the gate driving panel circuit.

The scan clock signal line may be located further outwardly than the carry clock signal line.

The carry clock signal line may be located further outwardly than the gate driving panel circuit.

The gate driving panel circuit may include an output buffer block including a scan output buffer for outputting the scan signal based on the scan clock signal and a carry output buffer for outputting the carry signal based on the carry clock signal, and a logic block for controlling operation of the output buffer block.

The scan output buffer may include a scan pull-up transistor connected between a scan clock node to which the scan clock signal is input and a scan output node from which the scan signal is output, and a scan pull-down transistor connected between a first gate low voltage node and the scan output node.

The carry output buffer may include a carry pull-up transistor connected between a carry clock node to which the carry clock signal is input and a carry output node from which the carry signal is output, and a carry pull-down transistor connected between a gate low voltage node different from the first gate low voltage node and the carry output node.

The gate driving panel circuit includes a Q node to which respective gate nodes of the carry pull-up transistor and the scan pull-up transistor are electrically connected, and a QB node to which respective gate nodes of the carry pull-down transistor and the scan pull-down transistor are electrically connected.

The logic block can control respective voltages of the Q node and the QB node.

A channel width of the scan pull-up transistor may be greater than a channel width of the carry pull-up transistor.

In one or more embodiments, the display device may further include a carry electrostatic discharge circuit electrically connected to the carry clock signal line, and a scan electrostatic discharge circuit electrically connected to the scan clock signal line.

The carry electrostatic discharge circuit and the scan electrostatic discharge circuit may have different circuit configurations from each other.

The carry electrostatic discharge circuit may include at least one first diode connected between a point electrically connected to the carry clock signal line and an electrostatic discharge high level voltage node, and at least one second diode connected between the point electrically connected to the carry clock signal line and an electrostatic discharge low level voltage node.

Compared with the carry electrostatic discharge circuit, the scan electrostatic discharge circuit may include at least one third diode connected between a point electrically connected to the scan clock signal line and an electrostatic discharge high level voltage node.

In an embodiment, the display device may further include an electrostatic discharge circuit electrically connected to only the carry clock signal line among the carry clock signal line and the scan clock signal line.

In one or more embodiments, the display device may further include a plurality of scan output buffers connected to the scan clock signal line.

Each of the plurality of scan output buffers may include a scan pull-up transistor connected between a scan output node and the scan clock signal line, and a scan pull-down transistor connected between a first gate low voltage node and the scan output node.

When first static electricity with an under-peak flows into the scan clock signal line, the first static electricity can be discharged from the scan clock signal line to the first gate low voltage node through the scan pull-up transistor and scan pull-down transistor included in each of the plurality of scan output buffers.

When second static electricity with an over-peak flows into the scan clock signal line, the second static electricity can be discharged into the active layer of the scan pull-up transistor included in one of the plurality of scan output buffers.

A width of the scan clock signal line may be greater than a width of the carry clock signal line.

A scan signal may be applied to the display area, and a carry signal may not be applied to the display area.

In one or more embodiments, the display device may include at least one gate high voltage line disposed between the carry clock signal line and the gate driving panel circuit, and at least one gate low voltage line disposed between the gate driving panel circuit and the display area.

According to aspects of the present disclosure, a display panel can be provided that includes a substrate including a display area in which images can be displayed and a non-display area different from the display area, a gate driving panel circuit disposed over the substrate, disposed in the non-display area, configured to output a first signal based on a first clock signal, and configured to output a second signal based on a second clock signal, a first clock signal line disposed over the substrate, disposed in the non-display area, and delivering the first clock signal to the gate driving panel circuit, and a second clock signal line disposed over the substrate, disposed in the non-display area, and delivering the second clock signal to the gate driving panel circuit.

The second clock signal line may be disposed further outwardly than the first clock signal line, and a width of the second clock signal line may be greater than a width of the first clock signal line.

The first signal may be a signal not applied to the display area, and the second signal may be a signal applied to the display area.

According to one or more embodiments of the present disclosure, a gate driving panel circuit having a structure suitable for the gate-in-panel (GIP) type and a display device including the gate driving panel circuit may be provided.

According to one or more embodiments of the present disclosure, a display panel and a display device may be provided that have an effective electrostatic discharge structure.

According to one or more embodiments of the present disclosure, a display panel and a display device may be provided that have a clock signal line arrangement structure that is advantageous to electrostatic discharge.

According to one or more embodiments of the present disclosure, a display panel and a display device may be provided that have a scan pull-up transistor that is advantageous to electrostatic discharge.

According to one or more embodiments of the present disclosure, a display device may be provided that has a wiring structure for stably supplying various types of signals or power to a gate driving panel circuit disposed in a display panel.

According to example embodiments described herein, since a display panel and a display device are designed to include a gate driving panel circuit disposed on a substrate of the display panel and formed during the manufacturing process of the display panel or the display device, an advantage of enabling process optimization of the display panel and the display device can be provided.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION

Figure 1:
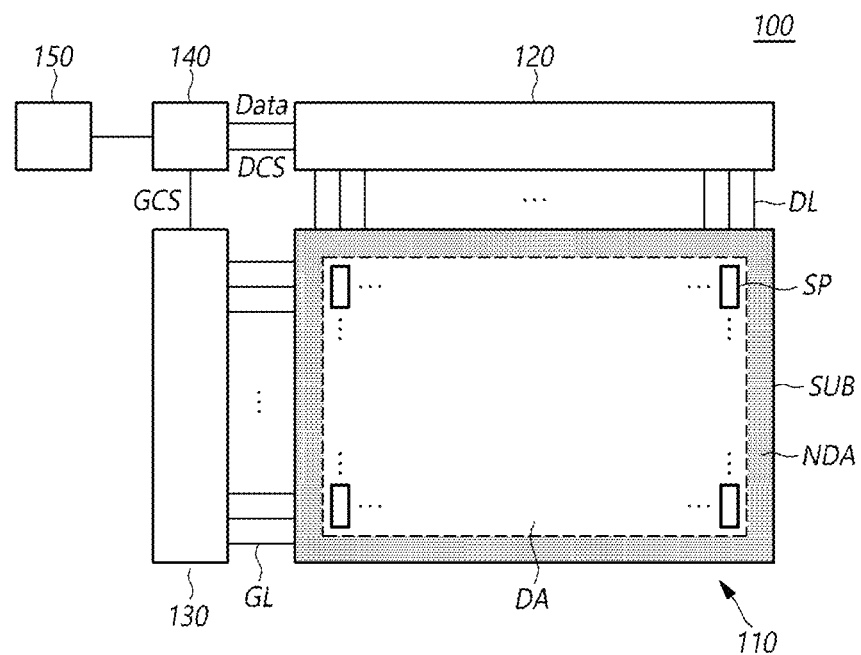
FIG. 1 illustrates an example system configuration of a display device according to aspects of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

In the following description, where the detailed description of the relevant known function or configuration may unnecessarily obscure aspects of the present disclosure, a detailed description of such known function or configuration may be omitted.

The shapes, sizes, ratios, angles, numbers, and the like, which are illustrated in the drawings to describe various example embodiments of the present disclosure, are merely given by way of example. Therefore, the present disclosure is not limited to the illustrations in the drawings.

Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," "A", "B", "(a)", or "(b)", and the like may be used herein to describe various elements, these elements should not be interpreted to be limited by these terms as they are not used to define a particular order or precedence. These terms are used only to distinguish one element from another; thus, related elements should not be interpreted to be limited by these terms as they are not used to define a particular order or precedence.

Further, the expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. Further, another element may be included in one or more of the two or more elements connected, combined, coupled, or contacted (to) one another.

For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference.

In describing a temporal relationship, when the temporal order is described as, for example, "after," "subsequent," "next," or "before," a case which is not continuous may be included unless a more limiting term, such as "just," "immediate(ly)," or "direct(ly)," is used.

In construing an element, the element is to be construed as including an error or tolerance range even where no explicit description of such an error or tolerance range is provided. Further, the term "may" fully encompasses all the meanings of the term "can."

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

Hereinafter, various example embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

Hereinafter, various embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

FIG. 1 illustrates an example system configuration of a display device 100 according to aspects of the present disclosure.

Referring to FIG. 1, in one or more embodiments, the display device 100 according to aspects of the present disclosure may include a display panel 110 including a plurality of subpixels SP and at least one driving circuit for driving the plurality of subpixels SP included in the display panel 110.

The at least one driving circuit may include a data driving circuit 120, a gate driving circuit 130, and the like, and further include a controller 140 for controlling the data driving circuit 120 and the gate driving circuit 130.

The display panel 110 may include a substrate SUB, and signal lines such as a plurality of data lines DL, a plurality of gate lines GL, and the like disposed over the substrate SUB. The plurality of data lines DL and the plurality of gate lines GL may be connected to the plurality of subpixels SP.

The display panel 110 may include a display area DA in which one or more images can be displayed and a non-display area NDA in which an image is not displayed. A plurality of subpixels SP for displaying images may be disposed in the display area DA of the display panel 110. Driving circuits (e.g., 120, 130, and 140) may be electrically connected to, or be mounted in, the non-display area NDA of the display panel 110. Further, a pad portion including one or more pads to which one or more integrated circuits or one or more printed circuits are connected may be disposed in the non-display area NDA.

The data driving circuit 120 may be a circuit for driving the plurality of data lines DL, and can supply data signals to the plurality of data lines DL.

The gate driving circuit 130 may be a circuit for driving the plurality of gate lines GL, and can supply gate signals to the plurality of gate lines GL.

The controller 140 can supply a data control signal DCS to the data driving circuit 120 in order to control operation timing of the data driving circuit 120. The controller 140 can supply a gate control signal GCS to the gate driving circuit 130 in order to control operation timing of the gate driving circuit 130.

The controller 140 can start to scan pixels according to respective timings set in each frame, convert image data inputted from external devices or external image providing sources (e.g. host systems) in a data signal form readable by the data driving circuit 120 and then supply image data Data resulting from the converting to the data driving circuit 120, and in line with the scan of at least one pixel (or at least one pixel array) among the pixels, control the loading of the image data to the at least one pixel at a time at which the illumination of at least one corresponding light emitting element of the at least one pixel is intended.

The controller 140 can receive, in addition to input image data, several types of timing signals including a vertical synchronous signal VSYNC, a horizontal synchronous signal HSYNC, an input data enable signal DE, a clock signal CLK, and the like from external devices, networks, or systems (e.g., a host system 150).

In order to control the data driving circuit 120 and the gate driving circuit 130, the controller 140 can receive one or more of the timing signals such as the vertical synchronization signal VSYNC, the horizontal synchronization signal HSYNC, the input data enable signal DE, the clock signal CLK, and the like, generate several types of control signals DCS and GCS, and output the generated signals to the data driving circuit 120 and the gate driving circuit 130.

For example, in order to control the gate driving circuit 130, the controller 140 can output several types of gate control signals GCS including a gate start pulse GSP, a gate shift clock GSC, a gate output enable signal GOE, and the like.

Further, to control the data driving circuit 120, the controller 140 can output several types of data control signals DCS including a source start pulse SSP, a source sampling clock SSC, a source output enable (SOE) signal, and the like.

The controller 140 may be implemented in a separate component from the data driving circuit 120, or integrated with the data driving circuit 120, so that the controller 140 and the data driving circuit 120 can be implemented in a single integrated circuit.

The data driving circuit 120 can drive a plurality of data lines DL by supplying data voltages corresponding to image data Data received from the controller 140 to the plurality of data lines DL. The data driving circuit 120 may also be referred to as a source driving circuit.

The data driving circuit 120 may include, for example, one or more source driver integrated circuits SDIC.

Each source driver integrated circuit SDIC may include a shift register, a latch circuit, a digital-to-analog converter DAC, an output buffer, and the like. In one or more embodiments, each source driver integrated circuit SDIC may further include an analog-to-digital converter ADC.

In one or more embodiments, each source driver integrated circuit SDIC may be connected to the display panel 110 using a tape-automated-bonding (TAB) technique, or connected to a conductive pad such as a bonding pad of the display panel 110 using a chip-on-glass (COG) technique or a chip-on-panel (COP) technique, or connected to the display panel 110 using a chip-on-film (COF) technique.

The gate driving circuit 130 can supply a gate signal of a turn-on level voltage or a gate signal of a turn-off level voltage according to the control of the controller 140. The gate driving circuit 130 can sequentially drive a plurality of gate lines GL by sequentially supplying gate signals of the turn-on level voltage to the plurality of gate lines GL.

In one or more embodiments, the gate driving circuit 130 may be connected to the display panel 110 using the tape-automated-bonding (TAB) technique, or connected to a conductive pad such as a bonding pad of the display panel 110 using the chip-on-glass (COG) technique or the chip-on-panel (COP) technique, or connected to the display panel 110 using the chip-on-film (COF) technique. In one or more embodiments, the gate driving circuit 130 may be disposed in the non-display area NDA of the display panel 110 using the gate-in-panel (GIP) technique. The gate driving circuit 130 may be disposed on a substrate SUB, or connected to the substrate SUB. In an example where the gate driving circuit 130 is implemented with the GIP technique, the gate driving circuit 130 may be disposed in the non-display area NDA of the substrate SUB. The gate driving circuit 130 may be connected to the substrate SUB in examples where the gate driving circuit 130 is implemented with the chip-on-glass (COG) technique, the chip-on-film (COF) technique, or the like.

In an embodiment, at least one of the data driving circuit 120 and the gate driving circuit 130 may be disposed in the display area DA. For example, at least one of the data driving circuit 120 and the gate driving circuit 130 may be disposed not to overlap with subpixels SP, or disposed to overlap with one or more, or all, of the subpixels SP.

When a specific gate line is selected and driven by the gate driving circuit 130, the data driving circuit 120 can convert image data Data received from the controller 140 into data voltages in an analog form and supply the data voltages resulting from the converting to a plurality of data lines DL.

The data driving circuit 120 may be located in, and/or electrically connected to, but not limited to, only one side or portion (e.g., an upper edge or a lower edge) of the display panel 110. In one or more embodiments, the data driving circuit 120 may be located in, and/or electrically connected to, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 130 may be located in, and/or electrically connected to, but not limited to, only one side or portion (e.g., a left edge or a right edge) of the display panel 110. In one or more embodiments, the gate driving circuit 130 may be located in, and/or electrically connected to, but not limited to, two sides or portions (e.g., a left edge and a right edge) of the panel 110 or at least two of four sides or portions (e.g., an upper edge, a lower edge, the left edge, and the right edge) of the panel 110 according to driving schemes, panel design schemes, or the like.

The controller 140 may be a timing controller used in the typical display technology or a control apparatus/device capable of additionally performing other control functionalities in addition to the typical function of the timing controller. In one or more embodiments, the controller 140 may be one or more other control circuits different from the timing controller, or a circuit or component in the control apparatus/device. The controller 140 may be implemented using various circuits or electronic components such as an integrated circuit (IC), a field programmable gate array (FPGA), an application specific integrated circuit (ASIC), a processor, and/or the like.

The controller 140 may be mounted on a printed circuit board, a flexible printed circuit, or the like, and may be electrically connected to the data driving circuit 120 and the gate driving circuit 130 through the printed circuit board, the flexible printed circuit, or the like.

The controller 140 can transmit signals to, and receive signals from, the data driving circuit 120 via one or more predetermined interfaces. For example, such interfaces may include a low voltage differential signaling (LVDS) interface, an embedded clock point-point interface (EPI), a serial peripheral interface (SPI), and the like.

The controller 140 may include a storage medium such as one or more registers.

In one or more aspects, the display device 100 may be a display including a backlight unit such as a liquid crystal display device, or may be a self-emissive display such as an organic light emitting diode (OLED) display device, a quantum dot (QD) display device, a micro light emitting diode (M-LED) display device, a light emitting diode (LED) display device based on an inorganic material, or the like.

In an embodiment where the display device 100 is an organic light emitting display device, each subpixel SP may include, as a light emitting element, an organic light emitting diode (OLED), which is a self-emissive element.

In an embodiment where the display device 100 is a quantum dot display device, each subpixel SP may include a light emitting element configured with quantum dots, which are self-emissive semiconductor crystals.

In an embodiment where the display device 100 is an inorganic light emitting display device, each subpixel SP may include, as a light emitting element, an inorganic light emitting diode, which is a self-emissive element and includes an inorganic material. In this embodiment, the inorganic light emitting diode may be referred to as a micro light emitting diode (LED), and the inorganic light emitting display device may be referred to as a micro light emitting diode (LED) display device.

Figure 2:
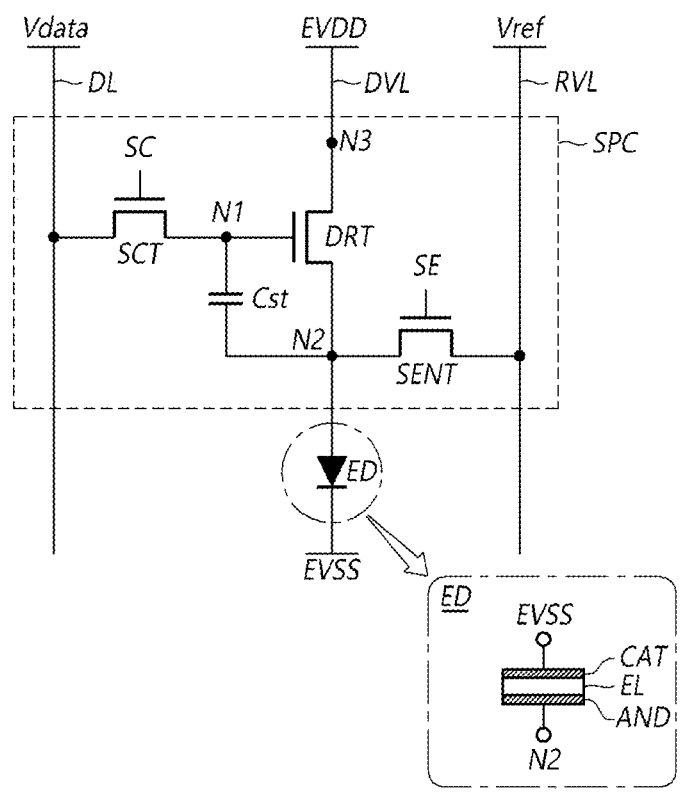
FIG. 2 illustrates an example equivalent circuit of a subpixel in a display panel according to aspects of the present disclosure.

FIG. 2 illustrates an example equivalent circuit of a subpixel in the display panel 110 according to aspects of the present disclosure.

Referring to FIG. 2, in one or more embodiments, each of a plurality of subpixels SP disposed in the display panel 110 of the display device 100 according to aspects of the present disclosure may include a light emitting element ED and a subpixel circuit SPC for driving the light emitting element ED.

For example, the corresponding subpixel circuit SPC of each subpixel SP may include a driving transistor DRT, a scan transistor SCT, a sensing transistor SENT, and a storage capacitor Cst. In this example, as the corresponding subpixel circuit SPC of each subpixel SP is configured with three transistors (3T: DRT, SCT and SENT) and one capacitor (1C: Cst), this structure of subpixel circuit SPC may be referred to as a "3T1C structure".

Referring to FIG. 2, the light emitting element ED may include an anode electrode AND and a cathode electrode CAT, and include an emission layer EL located between the anode electrode AND and the cathode electrode CAT.

One of the anode electrode AND and the cathode electrode CAT may be a pixel electrode connected to a transistor such as the driving transistor DRT, and the other may be a common electrode to which a common voltage is applied.

The pixel electrode may be an electrode disposed in each subpixel SP, and the common electrode may be an electrode commonly disposed in all or two or more of subpixels SP. For example, the common voltage may be a high voltage EVDD, which is a high level common voltage, or be a low voltage EVSS, which is a low level common voltage. In this example, the high voltage EVDD may be sometimes referred to as a driving voltage, and the low voltage EVSS may be sometimes referred to as a base voltage.

According to the example of FIG. 2, the anode electrode AND may be a pixel electrode connected to a transistor such as the driving transistor DRT, and the cathode electrode CAT may be a common electrode to which the low potential voltage EVSS is applied.

For example, the light emitting element ED may be an organic light emitting diode (OLED), a light emitting diode (LED) based on an inorganic material, a quantum dot light emitting element, or the like.

Referring to FIG. 2, the driving transistor DRT may be a transistor for driving the light emitting element ED, and may include a first node N1, a second node N2, and a third node N3.

The first node N1 of the driving transistor DRT may be the gate node of the driving transistor DRT, and may be electrically connected to the source node or drain node of the scan transistor SCT. The second node N2 of the driving transistor DRT may be the source node or drain node of the driving transistor DRT, be electrically connected to the source node or drain node of the sensing transistor SENT, and be electrically connected to the anode electrode AND of the light emitting element ED. The third node N3 of the driving transistor DRT may be electrically connected to a high voltage line DVL for carrying the high voltage EVDD.

Referring to FIG. 2, the scan transistor SCT can be controlled by a scan signal SC, which is a type of gate signal, and may be connected between the first node N1 of the driving transistor DRT and a data line DL. In other words, the scan transistor SCT can be turned on or turned off depending on a scan signal SC carried through a scan signal line SCL, which is a type of the gate line GL, and control an electrical connection between the data line DL and the first node N1 of the driving transistor DRT.

The scan transistor SCT can be turned on by a scan signal SC having a turn-on level voltage, and thereby, pass a data voltage Vdata carried through the data line DL to the first node N1 of the driving transistor DRT.

In an example where the scan transistor SCT is an n-type transistor, the turn-on level voltage of the scan signal SC may be a high level voltage. In another example where the scan transistor SCT is an p-type transistor, the turn-on level voltage of the scan signal SC may be a low level voltage. Hereinafter, for simplicity, discussions are provided based on the example where the scan transistor SCT is an n-type transistor. Accordingly, in discussions that follow, the turn-on level voltage of a sensing transistor SENT can be a high level voltage.

Referring to FIG. 2, the sensing transistor SENT can be controlled by a sensing signal SE, which is a type of gate signal, and may be connected between the second node N2 of the driving transistor DRT and a reference voltage line RVL. In other words, the sensing transistor SENT can be turned on or turned off depending on a sensing signal SE carried through a sensing signal line SENL, which is another type of the gate line GL, and control an electrical connection between the second node N2 of the driving transistor DRT and the reference voltage line RVL.

The sensing transistor SENT can be turned on by a sensing signal SE having a turn-on level voltage, and thereby, pass a reference voltage Vref carried through the reference voltage line RVL to the second node N2 of the driving transistor DRT. The sensing signal SE may be referred to as a second scan signal that is different from the scan signal SC.

Further, the sensing transistor SENT can be turned on by a sensing signal SE having the turn-on level voltage, and thereby, pass a voltage at the second node N2 of the driving transistor DRT to the reference voltage line RVL.

In an embodiment where the sensing transistor SENT is an n-type transistor, the turn-on level voltage of the sensing signal SE may be a high level voltage. In another example where the sensing transistor SENT is an p-type transistor, the turn-on level voltage of the sensing signal SE may be a low level voltage. Hereinafter, for simplicity, discussions are provided based on the example where the sensing transistor SENT is an n-type transistor. Accordingly, in discussions that follow, the turn-on level voltage of a sensing transistor SENT can be a high level voltage.

For example, the function of the sensing transistor SENT configured to pass the voltage of the second node N2 of the driving transistor DRT to the reference voltage line RVL can be used when the corresponding subpixel SP is driven to sense one or more characteristic values of the subpixel SP. In this example, the voltage passed to the reference voltage line RVL may be a voltage to determine a characteristic value of the subpixel SP or a voltage where the characteristic value of the subpixel SP is contained.

Herein, the characteristic value of the subpixel SP may be a characteristic value of the driving transistor DRT or the light emitting element ED. For example, the characteristic value of the driving transistor DRT may include a threshold voltage and/or mobility of the driving transistor DRT. The characteristic value of the light emitting element ED may include a threshold voltage of the light emitting element ED.

Referring to FIG. 2, the storage capacitor Cst may be connected between the first node N1 and the second node N2 of the driving transistor DRT. The storage capacitor Cst can store an amount of electric charge corresponding to a voltage difference between both terminals and maintain the voltage difference between both terminals for a predetermined frame time. As a result, the corresponding subpixel SP can emit light for the predetermined frame time.

Referring to FIG. 2, each of the driving transistor DRT, the scan transistor SCT, and the sensing transistor SENT may be an n-type transistor, or a p-type transistor. Herein, for convenience of description, discussions are provided based on an example where each of the driving transistor DRT, the scan transistor SCT, and the sensing transistor SENT is an n-type transistor.

The storage capacitor Cst may be an external capacitor intentionally designed to be located outside of the driving transistor DRT, other than an internal capacitor, such as a parasitic capacitor (e.g., a Cgs or a Cgd), that may be formed between the gate node and the source node (or the drain node) of the driving transistor DRT.

It should be noted that FIG. 2 illustrates just one example subpixel SP. For example, the subpixel SP may be modified in various ways by further including one or more transistors or one or more capacitors according to design requirements.

Figure 3:
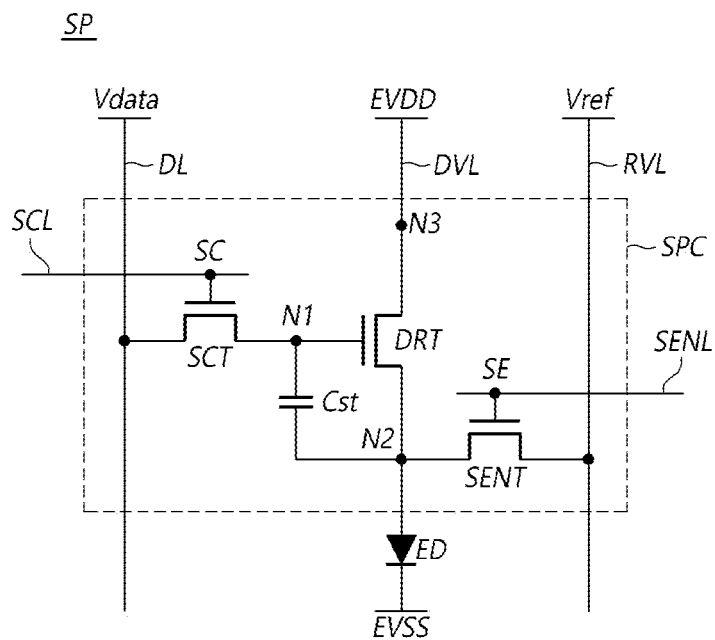
FIG. 3 illustrates an example equivalent circuit of a subpixel having a two-gate driven structure in the display panel according to aspects of the present disclosure.

FIG. 3 illustrates an example equivalent circuit of a subpixel SP having a two-gate driven structure in the display panel 110 according to aspects of the present disclosure.

The subpixel circuit SPC of the subpixel SP of FIG. 3 may have the same 3T1C structure as the subpixel circuit SPC of the subpixel SP of FIG. 2. The subpixel SP of FIG. 3 may have a two-gate driven structure.

As shown in FIG. 3, in examples where a subpixel SP has the two-gate driven structure, the subpixel SP may be connected to two gate lines GL serving as a scan signal line SCL and a sensing signal line SENL, respectively.

Referring to FIG. 3, in the subpixel circuit SPC of the two-gate driven structure-based subpixel SP, the gate node of a scan transistor SCT may be connected to the scan signal line SCL, and the gate node of a sensing transistor SEN may be connected to the sensing signal line SENL. As a result, the scan transistor SCT and the sensing transistor SENT can operate independently of each other.

Referring to FIG. 3, the subpixel circuit SPC of the two-gate driven structure-based subpixel SP can receive a scan signal SC through the scan signal line SCL, and receive a sensing signal SE through the sensing signal line SENL. In this manner, in the subpixel circuit SPC of the two-gate driven structure-based subpixel SP, the gate node of the scan transistor SCT can receive a scan signal SC through the scan signal line SCL, and the gate node of the sensing transistor SENT can receive a sensing signal SE through the sensing signal line SENL.

Referring to FIG. 3, in examples where a subpixel SP has the two-gate driven structure, on and/or off timings of a scan transistor SCT and on and/or off timings of a sensing transistor SENT in one subpixel SP may be independent of each other. That is, when a subpixel SP has the two-gate driven structure, on and/or off timings of a scan transistor SCT and on and/or off timings of a sensing transistor SENT in one subpixel SP may be different from, or be the same as, each other according to design requirements.

Figure 4:
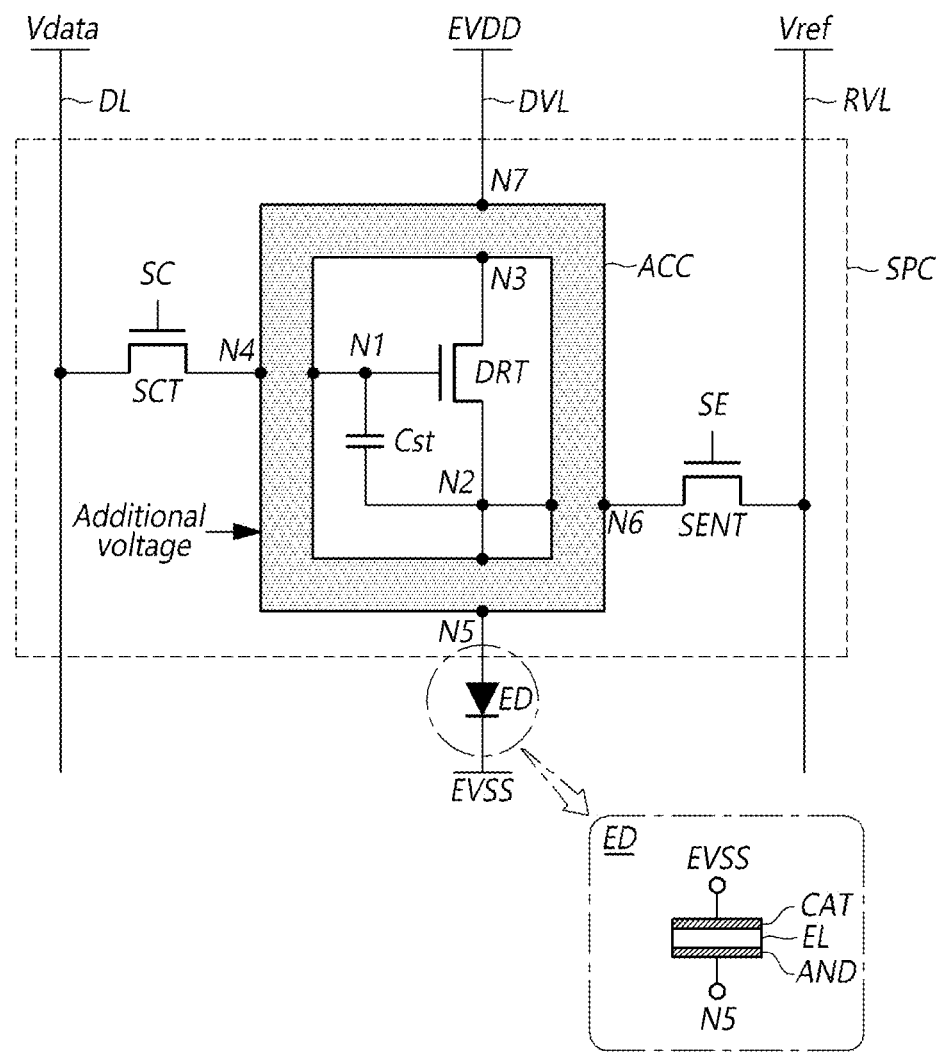
FIG. 4 illustrates another example equivalent circuit of a subpixel in the display panel according to aspects of the present disclosure.

FIG. 4 illustrates another example equivalent circuit of a subpixel in the display panel 110 according to aspects of the present disclosure.

Referring to FIG. 4, a subpixel SP may include a light emitting element ED and a subpixel circuit SPC for driving the light emitting element ED. The subpixel circuit SPC may include a driving transistor DRT, a scan transistor SCT, a sensing transistor SENT, and a storage capacitor Cst, and in addition, include an additional control circuit ACC.

The additional control circuit ACC may include one or more transistors and/or one or more capacitors.

The additional control circuit ACC may include a fourth node N4 electrically connected to the source node or drain node of the scan transistor SCT, a fifth node N5 electrically connected to the anode electrode AND of the light emitting element ED, a sixth node N6 electrically connected to the source node or drain node of the sensing transistor SENT, and a seventh node N7 electrically connected to a high voltage line DVL.

The additional control circuit ACC can be supplied with an additional voltage, when needed or desired.

Referring to FIG. 4, when the fourth node N4 and the first node N1 are electrically connected to each other, the fifth node N5, the sixth node N6, and the second node N2 are electrically connected to each other, and the seventh node N7 and the third node N3 are electrically connected to each other, by the additional control circuit ACC, the subpixel SP of FIG. 4 may be the same as the subpixel SP of FIG. 2.

For example, the additional control circuit ACC may include a light emitting control transistor configured to control a connection between the second node N2 and the fifth node N5. In another example, the additional control circuit ACC may include a light emitting control transistor configured to control a connection between the seven node N7 and the third node N3.

Figure 5:
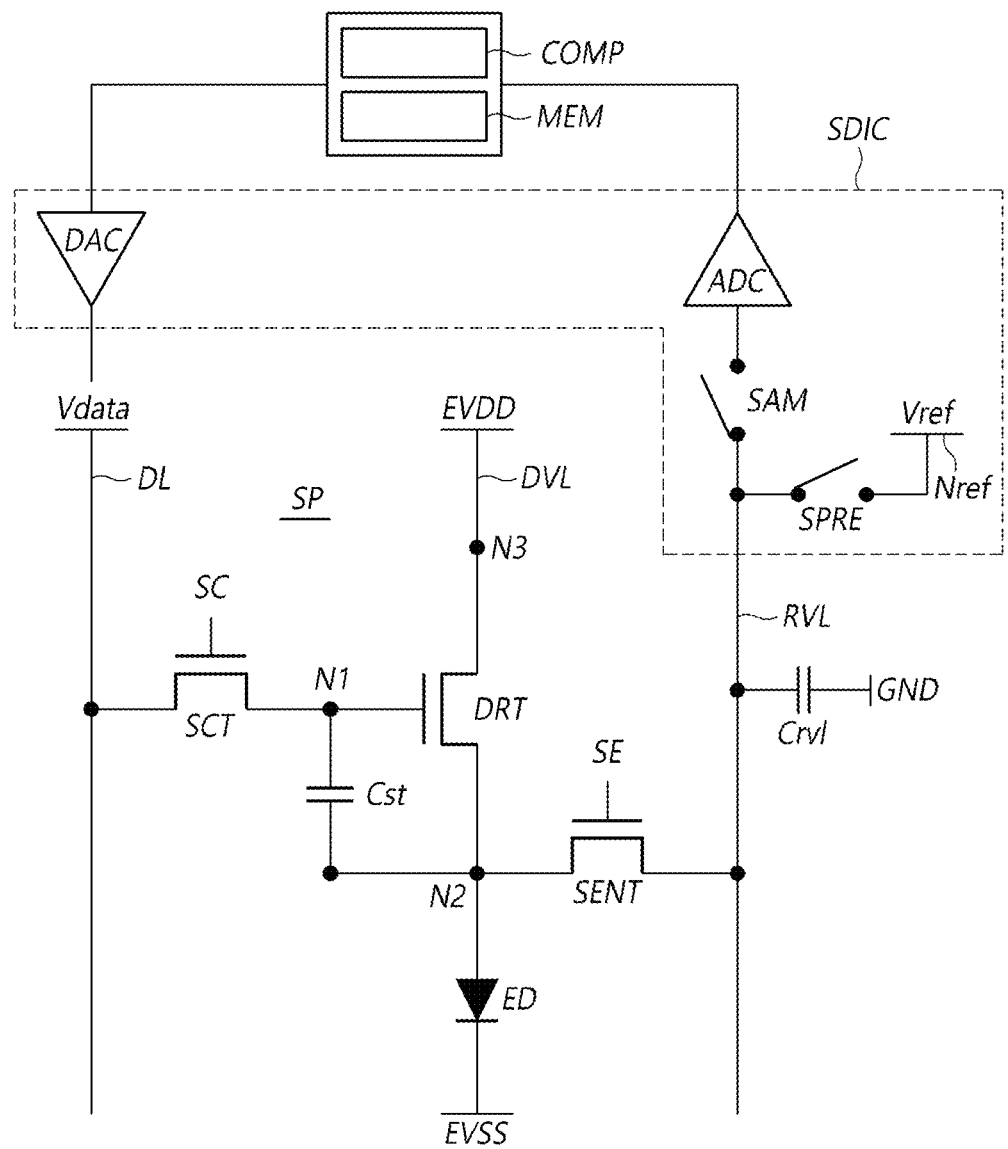
FIG. 5 illustrates an example compensation circuit of the display device according to aspects of the present disclosure.

FIG. 5 illustrates an example compensation circuit of the display device 100 according to aspects of the present disclosure. It should be noted here that the subpixel SP of FIG. 5 represents the subpixel SP of FIG. 2 as an example.

Referring to FIG. 5, the compensation circuit can be configured to perform sensing operation for characteristic values of circuit elements in the subpixel SP and an associated compensation process. In an embodiment, the circuit elements may include light emitting elements ED, driving transistors DRT, and the like.

The compensation circuit may include a power switch SPRE, a sampling switch SAM, an analog-to-digital converter ADC, a compensator COMP, a memory MEM, and the like. In an embodiment, the compensation circuit may further include a subpixel SP (e.g., the subpixel SP of FIG. 2 or 5).

The power switch SPRE can control a connection between the reference voltage line RVL and a reference voltage supply node Nref. A reference voltage Vref supplied by a power supply can be applied to the reference voltage supply node Nref, and the reference voltage Vref applied to the reference voltage supply node Nref can be passed to the reference voltage line RVL via the power switch SPRE.

The sampling switch SAM can control a connection between the analog-to-digital converter ADC and the reference voltage line RVL. When the analog-to-digital converter ADC is connected to the reference voltage line RVL by a sampling switch SAM, the analog-to-digital converter ADC can convert a voltage (analog voltage) of the connected reference voltage line RVL into a sensing value in the form of digital value.

As the subpixel SP is driven, a line capacitor Crv1 can be formed between the reference voltage line RVL and the ground GND. The voltage of the reference voltage line RVL can correspond to an amount of electric charges stored across the line capacitor Crv1.

The analog-to-digital converter ADC can provide sensing data containing the sensing value to the compensator COMP.

The compensator COMP can determine at least one corresponding characteristic value of at least one circuit element (e.g., the light emitting element ED, the driving transistor DRT, and/or the like) included in the subpixel SP based on the sensing data from the analog-to-digital converter ADC. Thereafter, the compensator COMP can determine a compensation value to reduce or eliminate a difference in characteristic values between circuit elements based on the at least one characteristic value, and store the compensation value in the memory MEM.

For example, the compensation value may be information determined to reduce or eliminate a difference in characteristic values between light emitting elements ED or a difference in characteristic values between driving transistors DRT, and include an offset and/or a gain for modifying data.

The controller 140 can modify image data using the compensation value stored in the memory MEM, and supply the modified image data to the data driving circuit 120.

The data driving circuit 120 can convert the changed image data into a data voltage Vdata in the form of analog voltage by using a digital-to-analog converter DAC, and output the data voltage Vdata. In this manner, the compensation process can be executed.

Referring to FIG. 5, in an embodiment, the analog-to-digital converter ADC, the power switch SPRE, and the sampling switch SAM may be included in a source driver integrated circuit SDIC. In this embodiment, the source driver integrated circuit SDIC may be an integrated circuit serving as the data driving circuit 120 or a part of the data driving circuit 120, and include the digital-to-analog converter DAC.

In an embodiment, the compensator COMP may be included in the controller 140.

As described above, the display device 100 can perform the compensation process to reduce a difference in characteristic values between the driving transistors DRT. Further, in order to perform the compensation process, the display device 100 can perform sensing driving to acquire information on a difference in characteristic values between the driving transistors DRT.

In an embodiment, the display device 100 according to aspects of the present disclosure can perform sensing driving in two sensing modes (a first sensing mode and a second sensing mode). Hereinafter, sensing driving in two sensing modes (the first sensing mode and the second sensing mode) will be described with reference to FIGS. 6A and 6B.

Figure 6A:
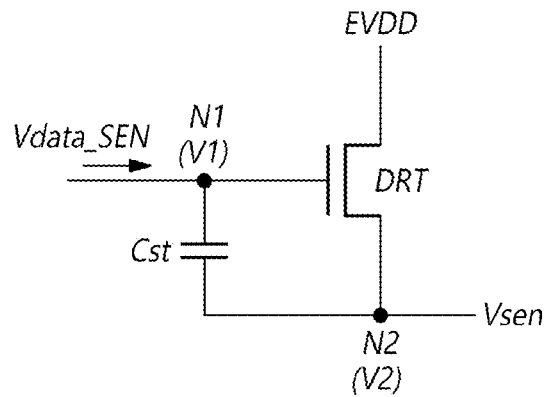
FIGS. 6A and 6B illustrate an example first sensing mode and an example second sensing mode used in the display device according to aspects of the present disclosure.
Figure 6A:
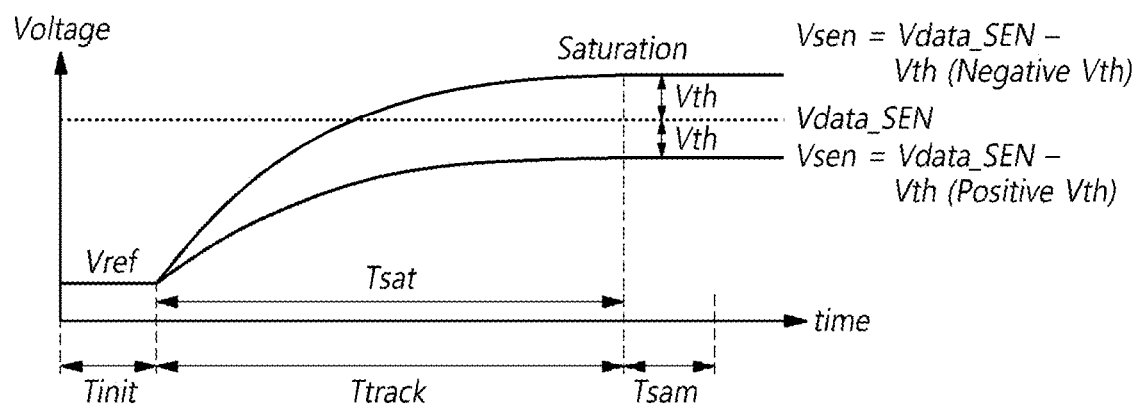
Figure 6B:
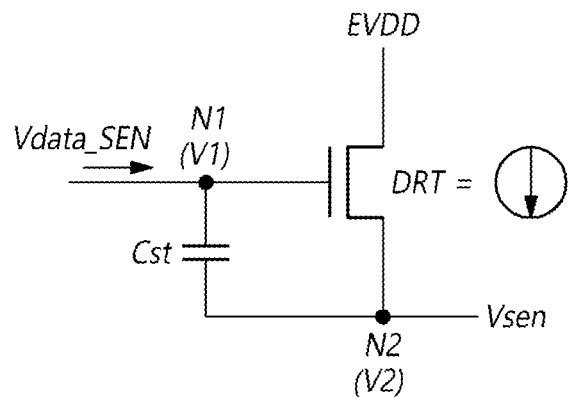
Figure 6B:
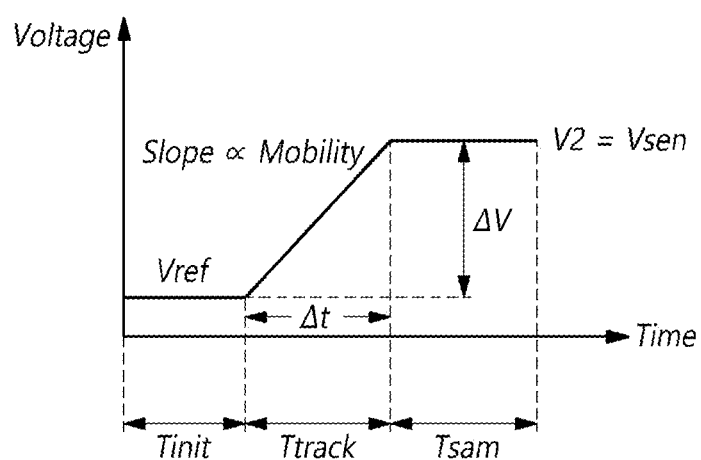

FIGS. 6A and 6B illustrate an example first sensing mode and an example second sensing mode used in the display device 100 according to aspects of the present disclosure.

Referring to FIG. 6A, the "first sensing mode" may be a sensing mode for sensing a threshold voltage, which requires a relatively long sensing time, among the characteristic values (e.g., the threshold voltage and the mobility) of the driving transistor DRT. The first sensing mode may also be referred to as a "slow sensing mode" or a "threshold voltage sensing mode."

Referring to FIG. 6B, the "second sensing mode" may be a sensing mode for sensing mobility, which requires a relatively short sensing time, among the characteristic values (e.g., the threshold voltage and the mobility) of the driving transistor DRT. The second sensing mode may also be referred to as a "fast sensing mode" or a "mobility sensing mode."

Hereinafter, sensing driving in the first sensing mode and sensing driving in the second sensing mode will be described with reference to the compensation circuit of FIG. 5, as well as FIGS. 6A and 6B.

First, sensing driving in the first sensing mode will be described with reference to FIG. 6A.

Referring to FIG. 6A, a sensing driving period of the first sensing mode may include an initialization sub-period Tinit, a tracking sub-period Ttrack, and a sampling sub-period Tsam.

Referring to FIG. 6A, the initialization sub-period Tinit of the sensing driving period in the first sensing mode may be a period for initializing the first node N1 and the second node N2 of the driving transistor DRT.

During the initialization sub-period Tinit, a voltage V1 of the first node N1 of the driving transistor DRT can be initialized to a sensing driving data voltage Vdata_SEN, and a voltage V2 of the second node N2 of the driving transistor DRT can be initialized to a sensing driving reference voltage Vref.

During the initialization sub-period Tinit, the scan transistor SCT and the sensing transistor SENT can be turned on, and the power switch SPRE can be turned on.

Referring to FIG. 6A, the tracking sub-period Ttrack of the sensing driving period in the first sensing mode may be a period for tracking a voltage V2 of the second node N2 of the driving transistor DRT containing a threshold voltage Vth of the driving transistor DRT or a shift ΔVth in the threshold voltage Vth.

During the tracking sub-period Ttrack, the power switch SPRE can be turned off or the sensing transistor SENT can be turned off.

Accordingly, during the tracking sub-period Ttrack, while the first node N1 of the driving transistor DRT is in a constant voltage state with the sensing driving data voltage Vdata_SEN, the second node N2 of the driving transistor DRT can be electrically floating. Accordingly, during the tracking sub-period Ttrack, the voltage V2 of the second node N2 of the driving transistor DRT can vary.

During the tracking sub-period Ttrack, the voltage V2 of the second node N2 of the driving transistor DRT can increase until the voltage V2 of the second node N2 of the driving transistor DRT contains a threshold voltage Vth of the driving transistor DRT (i.e., until the voltage V2 of the second node N2 of the driving transistor DRT reaches a saturation point at which the threshold voltage Vth of the driving transistor DRT (or a shift ΔVth in the threshold voltage Vth) is contained in the voltage V2 of the second node N2 of the driving transistor DRT).

During the initialization sub-period Tinit, a voltage difference between the first node N1 and the second node N2 of the driving transistor DRT, which has been initialized, can be greater than or equal to the threshold voltage Vth of the driving transistor DRT. Accordingly, when the tracking sub-period Ttrack is initiated, the driving transistor DRT can be turned on and allow current to flow. Thereby, when the tracking sub-period Ttrack is initiated, the voltage V2 of the second node N2 of the driving transistor DRT can increase.

During the tracking sub-period Ttrack, the voltage V2 of the second node N2 of the driving transistor DRT cannot continuously increase.

As the latter part of the tracking sub-period Ttrack progresses, an increasing width of the voltage V2 of the second node N2 of the driving transistor DRT can be reduced, and the voltage V2 of the second node N2 of the driving transistor DRT can be eventually saturated.

A saturated voltage V2 of the second node N2 of the driving transistor DRT can correspond to a difference (Vdata_SEN−Vth) between the sensing driving data voltage Vdata_SEN and the threshold voltage Vth or a difference (Vdata_SEN−ΔVth) between the sensing driving data voltage Vdata_SEN and a shift in the threshold voltage ΔVth. The threshold voltage Vth may be a negative threshold voltage (−Vth) or a positive threshold voltage (+Vth).

When the voltage V2 of the second node N2 of the driving transistor DRT is saturated, the sampling sub-period Tsam can be initiated.

Referring to FIG. 6A, the sampling sub-period Tsam of the sensing driving period in the first sensing mode may be a period for measuring a voltage (i.e., Vdata_SEN−Vth, Vdata_SEN−ΔVth) containing the threshold voltage Vth of the driving transistor DRT or a shift in the threshold voltage Vth.

During the sampling sub-period Tsam of the sensing driving period in the first sensing mode, a voltage of the reference voltage line RVL can be sensed by the analog-to-digital converter ADC. The voltage of the reference voltage line RVL can correspond to the voltage of the second node N2 of the driving transistor DRT, and correspond to a charging voltage of a line capacitor Crv1 formed on the reference voltage line RVL.

During the sampling sub-period Tsam, a voltage Vsen sensed by the analog-to-digital converter ADC can be the voltage (Vdata_SEN−Vth) resulting from subtracting the threshold voltage Vth from the sensing driving data voltage Vdata_SEN or the voltage (Vdata_SEN−ΔVth) resulting from subtracting the threshold voltage shift ΔVth from the sensing driving data voltage Vdata_SEN. The Vth may be a positive threshold voltage or a negative threshold voltage.

Referring to FIG. 6A, during the tracking sub-period Ttrack of the sensing driving period in the first sensing mode, a saturation time Tsat taken until the voltage V2 of the second node N2 of the driving transistor DRT increases and then reaches saturation can be a time period of the tracking sub-period Ttrack of the sensing driving period in the first sensing mode, and be a time taken until the threshold voltage Vth or threshold voltage shift ΔVth of the driving transistor DRT is contained in the voltage (V2=Vdata_SEN−Vth, or V2=Vdata_SEN−ΔVth) of the second node N2 of the driving transistor DRT.

This saturation time Tsat may occupy most of the entire time period of the sensing driving period in the first sensing mode. Thus, in the case of the first sensing mode, it may take quite a long time (saturation time Tsat) for the voltage V2 of the second node N2 of a driving transistor DRT to reach saturation after increasing.

As described above, the sensing driving method for sensing the threshold voltage of a driving transistor DRT (i.e., the first sensing mode) is sometimes referred to as a slow mode since a long saturation time Tsat is required until the voltage of the second node N2 of the driving transistor DRT contains the threshold voltage of the driving transistor DRT.

Next, sensing driving in the second sensing mode will be described with reference to FIG. 6B.

Referring to FIG. 6B, a sensing driving period of the second sensing mode may include an initialization sub-period Tinit, a tracking sub-period Ttrack, and a sampling sub-period Tsam.

Referring to FIG. 6B, the initialization sub-period Tinit of the sensing driving period in the second sensing mode may be a period for initializing the first node N1 and the second node N2 of the driving transistor DRT.

During the initialization sub-period Tinit, the scan transistor SCT and the sensing transistor SENT can be turned on, and the power switch SPRE can be turned on.

During the initialization sub-period Tinit, a voltage V1 of the first node N1 of the driving transistor DRT can be initialized to a sensing driving data voltage Vdata_SEN, and a voltage V2 of the second node N2 of the driving transistor DRT can be initialized to a sensing driving reference voltage Vref.

Referring to FIG. 6B, the tracking sub-period Ttrack of the sensing driving period in the second sensing mode may be a period for changing the voltage V2 of the second node N2 of the driving transistor DRT for a preset tracking time Δt until the voltage V2 of the second node N2 of the driving transistor DRT reaches a voltage containing mobility of the driving transistor DRT or a shift in the mobility.

During the tracking sub-period Ttrack, the preset tracking time Δt may be set to a relatively short time. Therefore, it may be difficult for the voltage V2 of the second node N2 of the driving transistor DRT to contain the threshold voltage Vth of the driving transistor DRT for a short tracking time Δt. To address this issue, the voltage V2 of the second node N2 of the driving transistor DRT can be changed enough to determine the mobility of the driving transistor DRT for such a short tracking time Δt.

Accordingly, the second sensing mode may be a sensing driving method for sensing the mobility of a driving transistor DRT.

During the tracking sub-period Ttrack, as the power switch SPRE is turned off or the sensing transistor SENT is turned off, the second node N2 of the driving transistor DRT can be electrically floating.

During the tracking sub-period Ttrack, the scan transistor SCT can be turned off by a scan signal SC of a turn-on level voltage, and the first node N1 of the driving transistor DRT can be also electrically floating.

During the initialization sub-period Tinit, a voltage difference between the first node N1 and the second node N2 of the driving transistor DRT, which has been initialized, can be greater than or equal to the threshold voltage Vth of the driving transistor DRT. Accordingly, when the tracking sub-period Ttrack is initiated, the driving transistor DRT can be turned on and allow current to flow.

The voltage difference between the first node N1 and the second node N2 of the driving transistor DRT may be denoted by Vgs when the first node N1 and the second node N2 of the driving transistor DRT are the gate node and the source node, respectively.

Accordingly, during the tracking sub-period Ttrack, the voltage V2 of the second node N2 of the driving transistor DRT can increase. In this situation, the voltage V1 of the first node N1 of the driving transistor DRT can also increase.

During the tracking sub-period Ttrack, an increasing rate of the voltage V2 of the second node N2 of the driving transistor DRT can vary depending on the current capability (i.e., mobility) of the driving transistor DRT. As the driving transistor DRT has greater current capability (mobility), the voltage V2 of the second node N2 of the driving transistor DRT can increase more steeply.

After the tracking sub-period Ttrack progresses for the preset tracking time Δt, that is, after the voltage V2 of the second node N2 of the driving transistor DRT increases for the preset tracking time Δt, the sampling sub-period Tsam can proceed.

During the tracking sub-period Ttrack, an increasing rate of the voltage V2 of the second node N2 of the driving transistor DRT can corresponds to an amount of voltage variance ΔV in the second node N2 of the driving transistor DRT during the preset tracking time Δt. The amount of voltage variance ΔV in the second node N2 of the driving transistor DRT can correspond to an amount of voltage variance in the reference voltage line RVL.

Referring to FIG. 6B, after the tracking sub-period Ttrack progresses for the preset tracking time Δt, the sampling sub-period Tsam can be initiated. During the sampling sub-period Tsam, the sampling switch SAM can be turned on, and the reference voltage line RVL and the analog-to-digital converter ADC can be electrically connected.

The analog-to-digital converter ADC can sense a voltage of the reference voltage line RVL. The voltage Vsen sensed by the analog-to-digital converter ADC can be a voltage (Vref+ΔV) increased from the reference voltage Vref by the amount of voltage variance ΔV for the preset tracking time Δt.

The voltage Vsen sensed by the analog-to-digital converter ADC can be the voltage of the reference voltage line RVL, and be the voltage of the second node N2 electrically connected to the reference voltage line RVL through the sensing transistor SENT.

Referring to FIG. 6B, in the sampling sub-period Tsam of the sensing driving period in the second sensing mode, the voltage Vsen sensed by the analog-to-digital converter ADC may vary depending on the mobility of the driving transistor DRT. As the driving transistor DRT has higher mobility, the sensing voltage Vsen can increase. As the driving transistor DRT has lower mobility, the sensing voltage Vsen can decrease.

As described above, the sensing driving method for sensing the mobility of a driving transistor DRT (i.e., the second sensing mode) is sometimes referred to as a fast mode since this method can be executed by changing the voltage of the second node N2 of the driving transistor DRT for such a short period of time Δt.

Referring to FIG. 6A, the compensator COMP can detect a threshold voltage Vth or a shift in the threshold voltage Vth of a driving transistor DRT of a corresponding subpixel SP based on sensing data corresponding to a voltage Vsen sensed through the first sensing mode, determine a threshold voltage compensation value for reducing or eliminating a difference in threshold voltages between driving transistors DRT, and store the acquired threshold voltage compensation value in the memory MEM.

Referring to FIG. 6B, the compensator COMP can detect mobility or a shift in the mobility of a driving transistor DRT of a corresponding subpixel SP based on sensing data corresponding to a voltage Vsen sensed through the second sensing mode, determine a mobility compensation value for reducing or eliminating a difference in mobilities between driving transistors DRT, and store the acquired mobility compensation value in the memory MEM.

The controller 140 can modify data Data based on the threshold voltage compensation value Φ and mobility compensation value α stored in the memory MEM, and supply the modified data (Data'=α×Data+Φ) to the data driving circuit 120.

The data driving circuit 120 can convert the data (Data'=α×Data+Φ) supplied by the controller 140 into a data voltage Vdata, and supply the converted data voltage Vdata to the corresponding subpixel SP. The data voltage Vdata supplied to the corresponding subpixel SP may be a data voltage Vdata capable of reducing a difference in threshold voltages and a difference in mobilities.

As described above, since a long sensing time is required for threshold voltage sensing, and a short sensing time is sufficient for mobility sensing, therefore, the threshold voltage sensing can be performed in the first sensing mode corresponding to the slow sensing mode, and the mobility sensing can be performed in the second sensing mode corresponding to the fast sensing mode.

Figure 7:
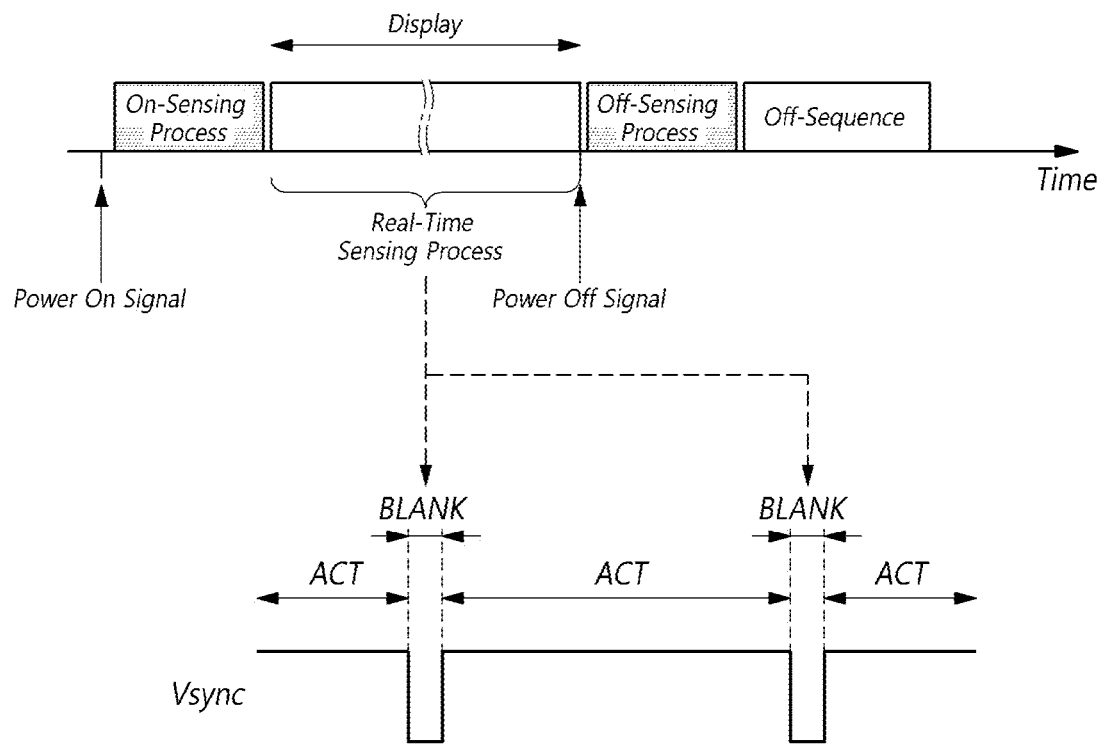
FIG. 7 illustrates various example sensing driving timings of the display device according to aspects of the present disclosure.

FIG. 7 illustrates various sensing driving timings (various sensing periods) defined in the display device 100 according to aspects of the present disclosure.

Referring to FIG. 7, in an embodiment, when a power-on signal is generated, the display device 100 according to aspects of the present disclosure can sense respective characteristic values of corresponding driving transistors of all or one or more of a plurality subpixel SP disposed in the display panel 110. This sensing process may be referred to as an "on-sensing process".

Referring to FIG. 7, in another embodiment, when a power-off signal is generated, before an off-sequence such as switch-off of power proceeds, the display device 100 can also sense respective characteristic values of corresponding driving transistors of all or one or more of the plurality subpixels SP disposed in the display panel 110. This sensing process may be referred to as an "off-sensing process".

Referring to FIG. 7, in further another embodiment, while display driving is being performed after the power-on signal is generated and before the power-off signal is generated, the display device 100 can also sense respective characteristic values of corresponding driving transistors of all or one or more of the plurality subpixels SP. This sensing process may be referred to as a "real-time sensing process".

The real-time sensing process may be performed every blank period BLANK between active periods ACT based on a vertical synchronization signal Vsync.

As discussed above, a relatively short period of time may be sufficient for sensing the mobility of a driving transistor DRT, and therefore, mobility sensing may be performed in the second sensing mode, which is the faster sensing mode among the two sensing modes.

Since a relatively short period of time is sufficient for mobility sensing, mobility sensing may be performed using any one of the on-sensing process, the off-sensing process, and the real-time sensing process. For example, mobility sensing, which may be performed in the second sensing mode, may be performed in the real-time sensing process that can reflect a variance in mobility in real time while the display is being driving. Accordingly, mobility sensing may be performed every blank period BLANK while the display is being driven.

As discussed above, threshold voltage sensing of a driving transistor DRT may require a relatively long sensing time including a long saturation time Vsat. Accordingly, threshold voltage sensing may be performed in the first sensing mode corresponding to the slow sensing mode among the two sensing modes.

Since threshold voltage sensing has a relatively long sensing time, threshold voltage sensing is desired to be performed using timing that does not interfere with the user's viewing. Accordingly, threshold voltage sensing of a driving transistor DRT may be performed after a power-off signal is generated by an input event from a user, and the like. For example, the threshold voltage sensing may be performed in a period during which the display device 100 is not driven for display image or a situation in which the user has no intention of viewing. In this manner, threshold voltage sensing may be performed using the off-sensing process.

Figure 8:
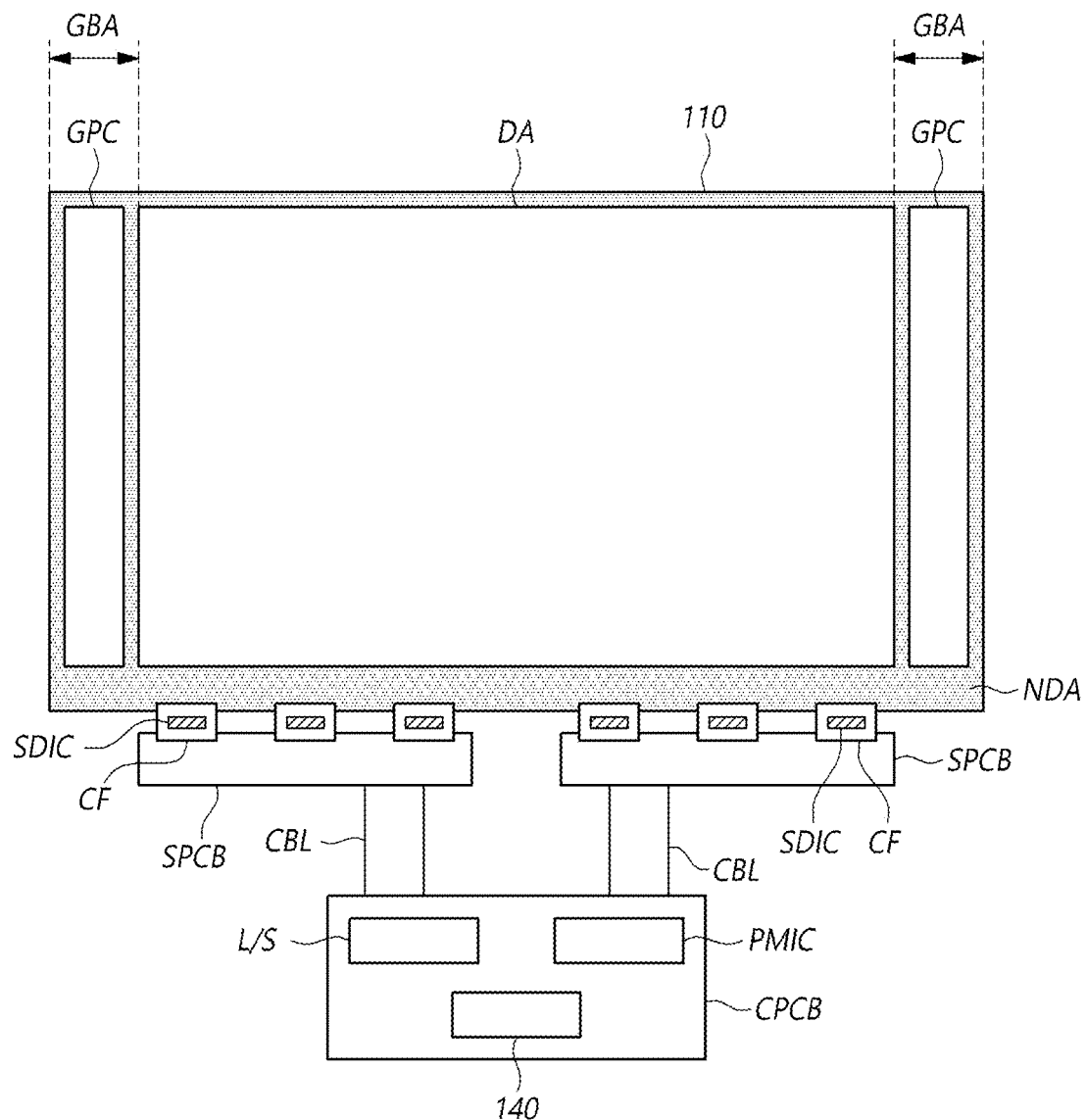
FIG. 8 illustrates an example system configuration of the display device according to aspects of the present disclosure.

FIG. 8 illustrates an example system configuration of the display device 100 according to aspects of the present disclosure.

Referring to FIG. 8, the display panel 110 may include a display area DA in which one or more images can be displayed and a non-display area NDA in which an image is not displayed.

According to the configuration of FIG. 8, a data driving circuit 120 (e.g., the data driving circuit 120 discussed above with reference to FIG. 1) may include a plurality of source driver integrated circuits SDIC and may be implemented using the chip-on-film (COF) technique. For example, each of the plurality of source driver integrated circuits SDIC may be mounted on a corresponding circuit film CF connected to the non-display area NDA of the display panel 110. In this example, the circuit film CF may be also referred to as a flexible printed circuit.

In an embodiment, in the configuration of FIG. 8, one or more gate driving circuits 130 may be implemented using the gate-in-panel (GIP) technique. Hereinafter, a gate driving circuit 130 implemented using the gate-in-panel (GIP) technique may be also referred to as a gate driving panel circuit GPC.

One or more gate driving panel circuit GPC may be located in the non-display area NDA of the display panel 110. In an embodiment, in the configuration of FIG. 8, one or more gate driving panel circuits GPC may be located in, and/or electrically connected to, but not limited to, one or more areas of the non-display area NDA of the display panel 110. For example, the one or more gate driving panel circuits GPC may be located in, and/or electrically connected to, only one side or portion (e.g., a left edge, a right edge, an upper edge, or a lower edge), or two sides or portions (e.g., a left edge and a right edge, an upper edge and a lower edge, or the like) of the display panel 110. Hereinafter, two or more gate driving panel circuits GPC, which are gate driving circuits 130 configured using the GIP technique, may be disposed in the display panel 110 as shown in FIG. 8; however, for merely convenience of description, discussions related to the gate driving panel circuits GPC will be provided by restricting to one gate driving panel circuit GPC unless explicitly stated otherwise. It should be therefore understood that the scope of the present disclosure includes examples where the two or more gate driving panel circuits GPC are disposed in the display panel 110.

The display device 100 may include at least one source printed circuit board SPCB and a control printed circuit board CPCB for a circuital connection between the plurality of source driver integrated circuits SDIC and other devices or components (e.g., 140, a level shifter L/S, a power management integrated circuit PMIC, and the like).

At least one circuit film CF on which a corresponding source driver integrated circuit SDIC is mounted may be connected to a corresponding one of the at least one source printed circuit board SPCB. For example, a first side of each of the at least one circuit film CF on which a corresponding source driver integrated circuit SDIC is mounted may be electrically connected to the display panel 110, and a second opposing side thereof may be electrically connected to the source printed circuit board SPCB.

A controller 140 (e.g., the controller 140 discussed above with reference to FIG. 1) and a power management integrated circuit PMIC may be mounted on the control printed circuit board CPCB.

The controller 140 can perform an overall control function related to the driving of the display panel 110 and control operations of the plurality of source driver integrated circuits SDIC and the gate driving panel circuit GPC.

The power management integrated circuit PMIC can supply various types of voltages or currents to the plurality of source driver integrated circuits SDIC, the gate driving panel circuit GPC, and the like, or control the various types of voltages or currents to be supplied.

A circuital connection between the at least one source printed circuit board SPCB and the control printed circuit board CPCB may be performed through at least one connection cable CBL. For example, the connection cable CBL may be one of a flexible printed circuit (FPC) and a flexible flat cable (FFC).

In an embodiment, the at least one source printed circuit board SPCB and the control printed circuit board CPCB may be integrated into one printed circuit board.

In an embodiment, the display device 100 according to aspects of the present disclosure may further include at least one level shifter L/S for adjusting a voltage level of a signal. For example, the level shifter L/S may be disposed on the control printed circuit board CPCB or the at least one source printed circuit board SPCB.

In an embodiment, in the display device 100 according to aspects of the present disclosure, the level shifter L/S can output signals needed for gate driving to the gate driving panel circuit GPC, which is the gate driving circuit 130 configured using the GIP technique.

For example, the power management integrated circuit PMIC can supply a signal to the level shifter L/S. The level shifter L/S can adjust a voltage level of the signal supplied by the power management integrated circuit PMIC. The signal whose voltage level has been adjusted by the level shifter L/S can be supplied to the gate driving panel circuit GPC.

For example, the level shifter L/S can supply a plurality of clock signals with different phases to the gate driving panel circuit GPC. The gate driving panel circuit GPC can generate a plurality of gate signals (e.g., at least one scan signal SC, at least one sensing signal SE, and the like) based on the plurality of clock signals supplied by the level shifter L/S, and output the generated gate signals to a plurality of gate lines (e.g., at least one scan signal line SCL, at least one sensing signal line SENL, and the like).

Referring to FIG. 8, the non-display area NDA of the display panel 110 may include one or more gate bezel areas GBA. FIG. 8 illustrates two or more gate bezel areas GBA disposed in the non-display area NDA, but for merely convenience of description, discussions related to the gate bezel areas GBA will be provided by restricting to one gate bezel area GBA unless explicitly stated otherwise. It should be therefore understood that the scope of the present disclosure includes examples where the two or more gate bezel areas GBA are disposed in the non-display area NDA. The gate bezel area GBA may refer to an area where the gate driving panel circuit GPC, which is the gate driving circuit 130 configured using the GIP technique, and several types of lines connected to the gate driving panel circuit GPC are disposed.

Referring to FIG. 8, the several types of lines connected to the gate driving panel circuit GPC may include one or more clock lines, one or more high level gate voltage lines, and one or more low level gate voltage lines, and the like.

Hereinafter, discussions are provided on an example configuration of the gate driving panel circuit GPC and an example structure of the gate bezel area GBA where the gate driving panel circuit GPC is disposed in the display device 100 according to aspects of the present disclosure.

Figure 9:
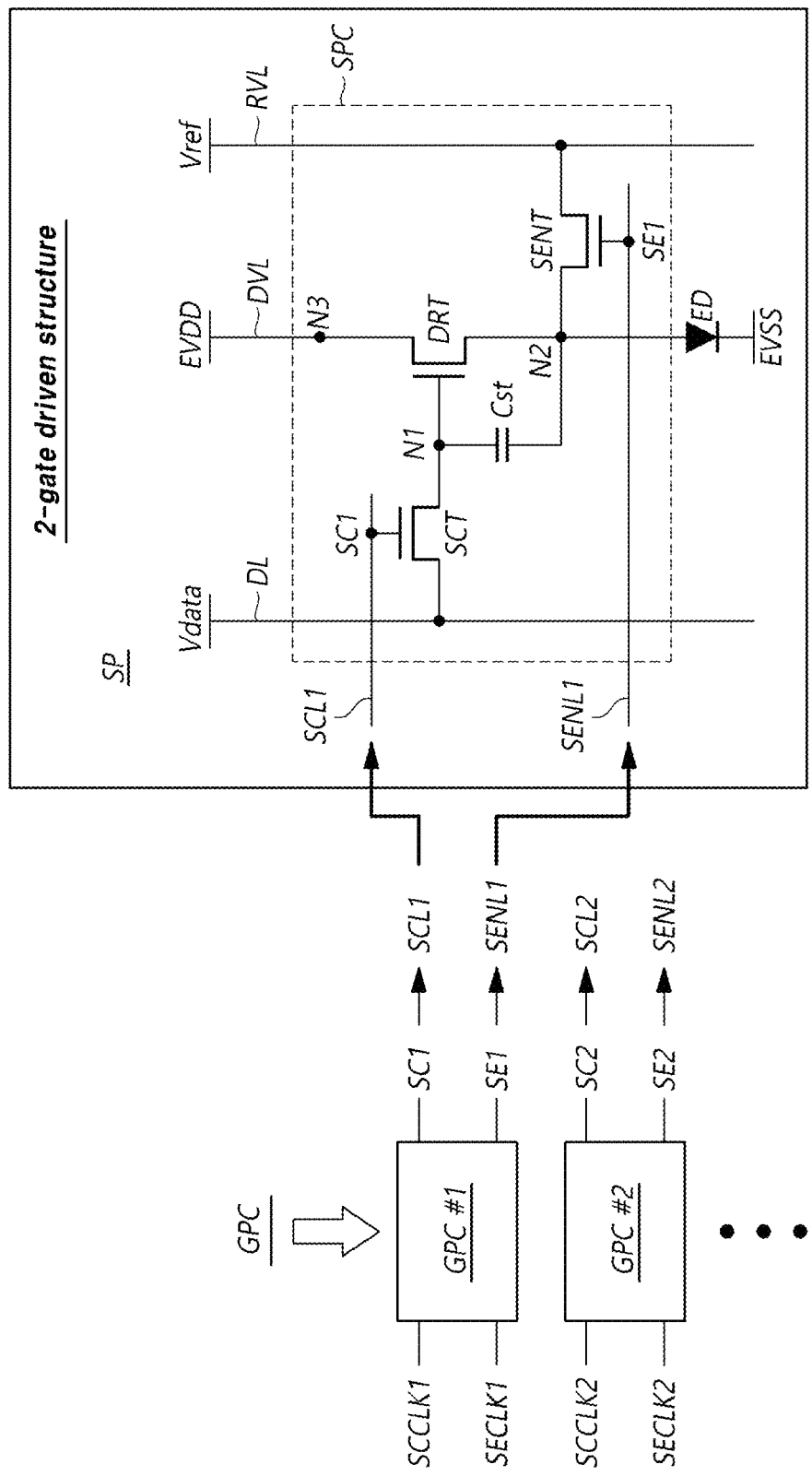
FIG. 9 illustrates inputs and outputs of an example gate driving panel circuit in the display device according to aspects of the present disclosure.

FIG. 9 illustrates inputs and outputs of an example gate driving panel circuit GPC in the display device 100 according to aspects of the present disclosure.

Referring to FIG. 9, in one or more embodiments, the gate driving panel circuit GPC may include a first gate driving panel circuit GPC #1 for outputting a first scan signal SC1 and a first sensing signal SE1, and a second gate driving panel circuit GPC #2 for outputting a second scan signal SC2 and a second sensing signal SE2.

Referring to FIG. 9, the first gate driving panel circuit GPC #1 can receive a first scan clock signal SCCLK1 and a first sensing clock signal SECLK1, and output the first scan signal SC1 and the first sensing signal SE1.

The first scan clock signal SCCLK1 and the first sensing clock signal SECLK1 can be output by a level shifter L/S.

The first scan signal SC1 and the first sensing signal SE1 can be applied to a first scan signal line SCL1 and a first sensing signal line SENL1, respectively.

The first scan signal line SCL1 and the first sensing signal line SENL1 may be connected to a first subpixel SP.

Referring to FIG. 9, the second gate driving panel circuit GPC #2 can receive a second scan clock signal SCCLK2 and a second sensing clock signal SECLK2, and output the second scan signal SC2 and the second sensing signal SE2.

The second scan clock signal SCCLK2 and the second sensing clock signal SECLK2 can be output by a level shifter L/S.

The second scan signal SC2 and the second sensing signal SE2 can be applied to a second scan signal line SCL2 adjacent to the first scan signal line SCL1 and a second sensing signal line SENL2 adjacent to the first sensing signal line SENL1, respectively.

The second scan signal line SCL2 and the second sensing signal line SENL1 may be connected to a second subpixel SP adjacent to the first subpixel SP.

Figure 10:
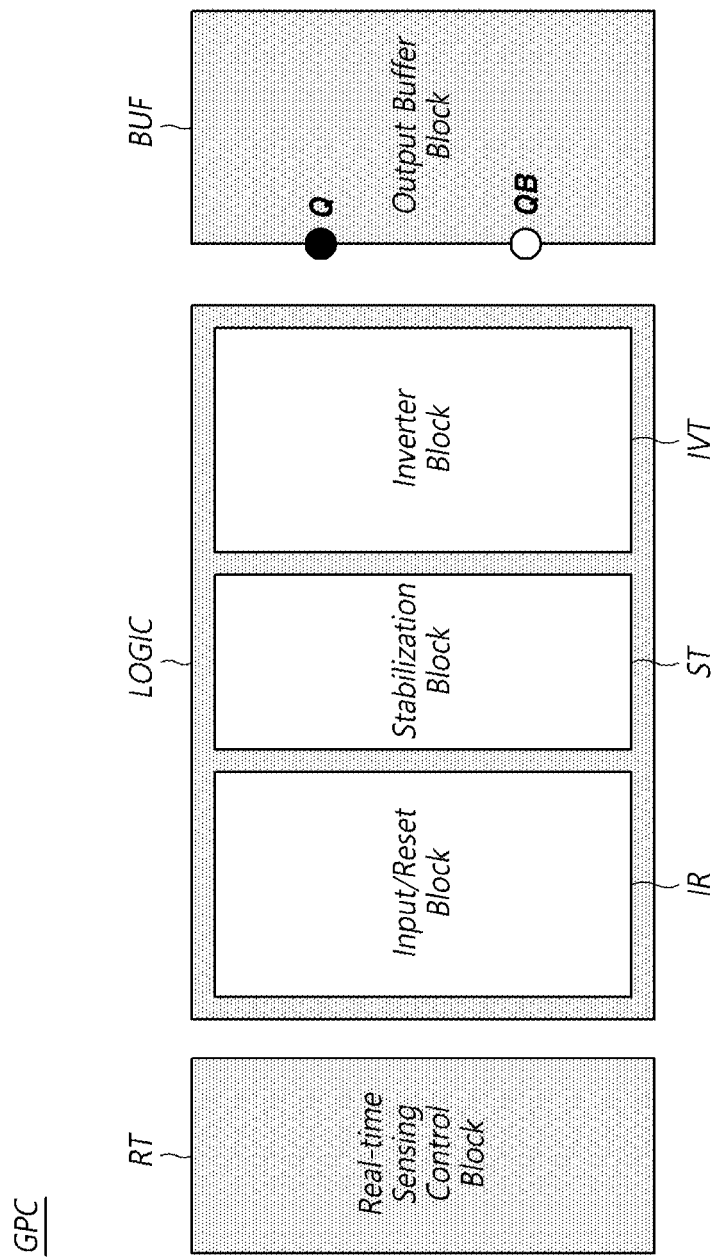
FIG. 10 illustrates an example system configuration of a gate driving panel circuit in the display device according to aspects of the present disclosure.

FIG. 10 illustrates an example system configuration of a gate driving panel circuit GPC (e.g., the gate driving panel circuit in FIG. 9) in the display device 100 according to aspects of the present disclosure.

Referring to FIG. 10, the gate driving panel circuit GPC may include an output buffer block BUF, a logic block LOGIC, and a real-time sensing control block RT.

Referring to FIG. 10, the output buffer block BUF can be configured to output two or more gate signals. For example, the output buffer block BUF included in the gate driving panel circuit GPC can output at least one scan signal SC and at least one sensing signal SE. In this example, subpixels SP included in the display device 100 may have the two-gate driven structure illustrated in FIG. 3.

Referring to FIG. 10, the output buffer block BUF can be controlled depending on respective voltage values or voltage levels of a Q node and a QB node. The operation and output of the output buffer block BUF may vary depending on the voltage values or voltage levels of the Q node and QB node.

The Q node and QB node may have different voltage levels. For example, during a first period, when a voltage of the Q node is a high level voltage, a voltage of the QB node may be a low level voltage. During a second period before or after the first period, when a voltage of the Q node is a low level voltage, a voltage of the QB node may be a high level voltage.

Referring to FIG. 10, the logic block LOGIC may be a circuit block configured to control the operation of the output buffer block BUF and implement the operation of a shift register. The logic block LOGIC can control voltages of the Q node and QB node to control the operation of the output buffer block BUF.

Referring to FIG. 10, the logic block LOGIC may include an input and reset block IR, a stabilization block ST, an inverter block IVT, and the like.

The input and reset block IR may be a circuit block configured to control charging and discharging of the Q node. The inverter block IVT can be configured to control an electrical value (or level) of the Q node or the QB node such that a voltage level resulting from inverting a voltage level of the Q node becomes a voltage level of the QB node depending on a voltage of the Q node. The stabilization block ST can be configured to stabilize the Q node and the output of the gate driving panel circuit GPC depending on a voltage of the QB node during a period during which an output signal of the gate driving panel circuit GPC has a turn-off level voltage.

Each of the input and reset block IR, the stabilization block ST, and inverter block IVT may include at least one transistor.

The real-time sensing control block RT may be a circuit block configured to control the operation of the output buffer block BUF for real-time sensing driving. The real-time sensing driving may be a sensing driving performed in real time while the display is being driven, and be a sensing driving performed in each blank period BLANK between active periods ACT (see FIG. 7). The real-time sensing driving may proceed in the second sensing mode corresponding to a fast sensing mode (see FIG. 6B). The real-time sensing driving may be a sensing driving for sensing the mobility of a corresponding driving transistor DRT of each subpixel SP (see FIG. 6B).

The real-time sensing control block RT may include at least one transistor.

The real-time sensing control block RT can be configured to control voltages of the Q node and the QB node so that the output buffer block BUF can output a scan signal SC and a sensing signal SE to a subpixel SP where real-time sensing driving is performed.

Figure 11:
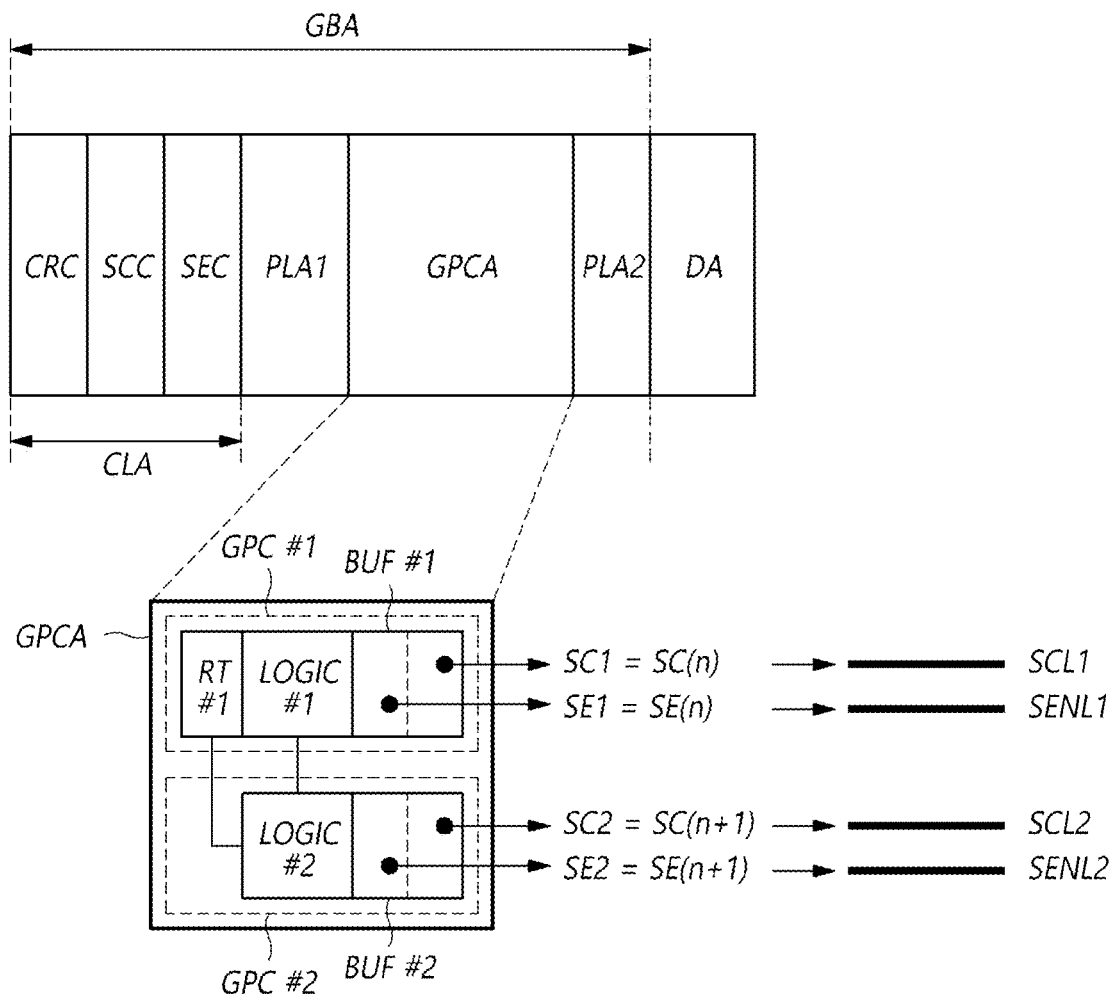
FIG. 11 illustrates an example configuration of a gate bezel area of the display panel according to aspects of the present disclosure.

FIG. 11 illustrates an example configuration of the gate bezel area GBA of the display panel 110 according to aspects of the present disclosure.

Referring to FIG. 11, in one or more embodiments, the gate bezel area GBA of the display panel 110 may include a clock signal line area CLA, a first power line area PLA1, a gate driving panel circuit area GPCA, a second power line area PLA2, and the like.

The gate driving panel circuit area GPCA may be an area in which a gate driving panel circuit GPC (e.g., the gate driving panel circuit GPC discussed above with reference to FIG. 9) is disposed. The gate driving panel circuit GPC can supply scan signals SC and sensing signals SE to subpixels SP having the two-gate driving structure.

In an embodiment, several types of lines for carrying power, voltage, and signals to the gate driving panel circuit GPC may be disposed around the gate driving panel circuit area GPCA. For example, the clock signal line area CLA, the first power line area PLA1, and the second power line area PLA2 may be disposed around the gate driving panel circuit area GPCA of the gate bezel area GBA.

For example, the clock signal line area CLA and the first power line area PLA1 may be located on a first side of the gate driving panel circuit area GPCA, and the second power line area PLA2 may be located on a second opposing side of the gate driving panel circuit area GPCA.

For example, the gate driving panel circuit area GPCA may be located on a first side of the second power line area PLA2, and the display area DA may be located on a second opposing side of the second power line area PLA2.

The clock signal line area CLA may be an area in which clock signal lines are disposed for delivering several types of clock signals to the gate driving panel circuit GPC.

The first power line area PLA1 may be an area in which at least one gate high voltage line is disposed for delivering at least one gate high voltage to the gate driving panel circuit GPC.

In an embodiment, at least one control signal line for delivering at least one control signal to the gate driving panel circuit GPC may be further disposed in the first power line area PLA1. For example, the at least one control signal may include at least one of a start signal, a reset signal, and a line selection signal.

The second power line area PLA2 may be an area in which at least one gate low voltage line is disposed for delivering at least one gate low voltage to the gate driving panel circuit GPC.

Referring to FIG. 11, in an embodiment, the clock signal line area CLA may include a carry clock signal line area CRC, a scan clock signal line area SCC, and a sensing clock signal line area SEC.

The carry clock signal line area CRC may be an area in which carry clock signal lines are disposed for delivering carry clock signals to the gate driving panel circuit GPC.

The scan clock signal line area SCC may be an area in which scan clock signal lines are disposed for delivering scan clock signals to the gate driving panel circuit GPC.

The sensing clock signal line area SEC may be an area in which sensing clock signal lines are disposed for delivering sensing clock signals to the gate driving panel circuit GPC.

An order in which the carry clock signal line area CRC, the scan clock signal line area SCC, and the sensing clock signal line area SEC are located may be set in various orders (e.g., CRC-SCC-SEC, SCC-CRC-SEC, SCC-SEC-CRC, SEC-SCC-CRC, or the like).

For example, among the carry clock signal line area CRC, the scan clock signal line area SCC, and the sensing clock signal line area SEC, the scan clock signal line area SCC may be located between the carry clock signal line area CRC and the sensing clock signal line area SEC, and the carry clock signal line area CRC may be located further away from the display area DA or the gate driving panel circuit area GPCA than the sensing clock signal line area SEC.

Referring to FIG. 11, the gate driving panel circuit GPC disposed in the gate driving panel circuit area GPCA may include a first gate driving panel circuit GPC #1 and a second gate driving panel circuit GPC #2. Each of the first gate driving panel circuit GPC #1 and the second gate driving panel circuit GPC #2 may have a separate Q node and a separate QB node.

The first gate driving panel circuit GPC #1 may include a first output buffer block BUF #1, a first logic block LOGIC #1, and a first real-time sensing control block RT #1.

The first output buffer block BUF #1 can be configured to output a first scan signal SC1 and a first sensing signal SE1 respectively to a first scan signal line SCL1 and a first sensing signal line SENL1 connected to a first subpixel SP. For example, the first scan signal SC1 may be an n-th scan signal SC(n), and the first sensing signal SE1 may be an n-th sensing signal SE(n).

The first logic block LOGIC #1 can be configured to control operation of the first output buffer block BUF #1 by controlling respective voltages of Q and QB nodes of the first gate driving panel circuit GPC #1.

The second gate driving panel circuit GPC #2 may include only a second output buffer block BUF #2 and a second logic block LOGIC #2.

The second output buffer block BUF #2 can be configured to output a second scan signal SC2 and a second sensing signal SE2 respectively to a second scan signal line SCL2 and a second sensing signal line SENL2 connected to a second subpixel SP. For example, the second scan signal SC2 may be an (n+1)-th scan signal SC(n+1), and the second sensing signal SE2 may be an (n+1)-th sensing signal SE(n+1).

The second logic block LOGIC #2 can be configured to control operation of the second output buffer block BUF #2 by controlling respective voltages of the Q node and the QB node of the second gate driving panel circuit GPC #2.

The first real-time sensing control block RT #1 may be shared by the first gate driving panel circuit GPC #1 and the second gate driving panel circuit GPC #2. Accordingly, the size of the gate bezel area GBA can be significantly reduced.

The first real-time sensing control block RT #1 can be configured to control operation of the first output buffer block BUF #1 so that the first output buffer block BUF #1 can output a first scan signal SC1 and a first sensing signal SE1 for sensing driving to a corresponding first subpixel SP where real-time sensing driving will be performed by controlling respective voltages of the Q node and QB node of the first gate driving panel circuit GPC #1 during a first real-time sensing driving period (a first blank period).

The first real-time sensing control block RT #1 can be configured to control operation of the second output buffer block BUF #2 so that the second output buffer block BUF #2 can output a second scan signal SC2 and a second sensing signal SE2 for sensing driving to a corresponding second subpixel SP where real-time sensing driving will be performed by controlling respective voltages of the Q node and QB node of the second gate driving panel circuit GPC #2 during a second real-time sensing driving period (a second blank period), which is different from the first real-time sensing driving period (the first blank period).

At least one specific node of the first logic block LOGIC #1 and at least one specific node of the second logic block LOGIC #2 may be electrically connected to each other.

Referring to FIG. 11, among the first output buffer block BUF #1, the first logic block LOGIC #1, and the first real-time sensing control block RT #1, the first real-time sensing control block RT #1 may be located furthest away from the display area DA.

Referring to FIG. 11, the gate driving panel circuit area GPCA may be disposed between the first power line area PLA1 and the second power line area PLA2.

Accordingly, at least one gate high voltage line disposed in the first power line area PLA1 and at least one gate low voltage line disposed in the second power line area PLA2 may be separated by the gate driving panel circuit GPC disposed in the gate driving panel circuit area GPCA.

According to the configuration of the power-related lines and areas discussed above, since at least one high voltage line and at least one low voltage line do not overlap with each other, one or more high voltages (e.g., GVDD, GVDD2, GVDD_o, and GVDD_e in FIG. 12) and one or more low voltages (e.g., GVSS0, GVSS1, and GVSS2 of FIG. 12) can be stabilized or stably supplied.

Figure 12:
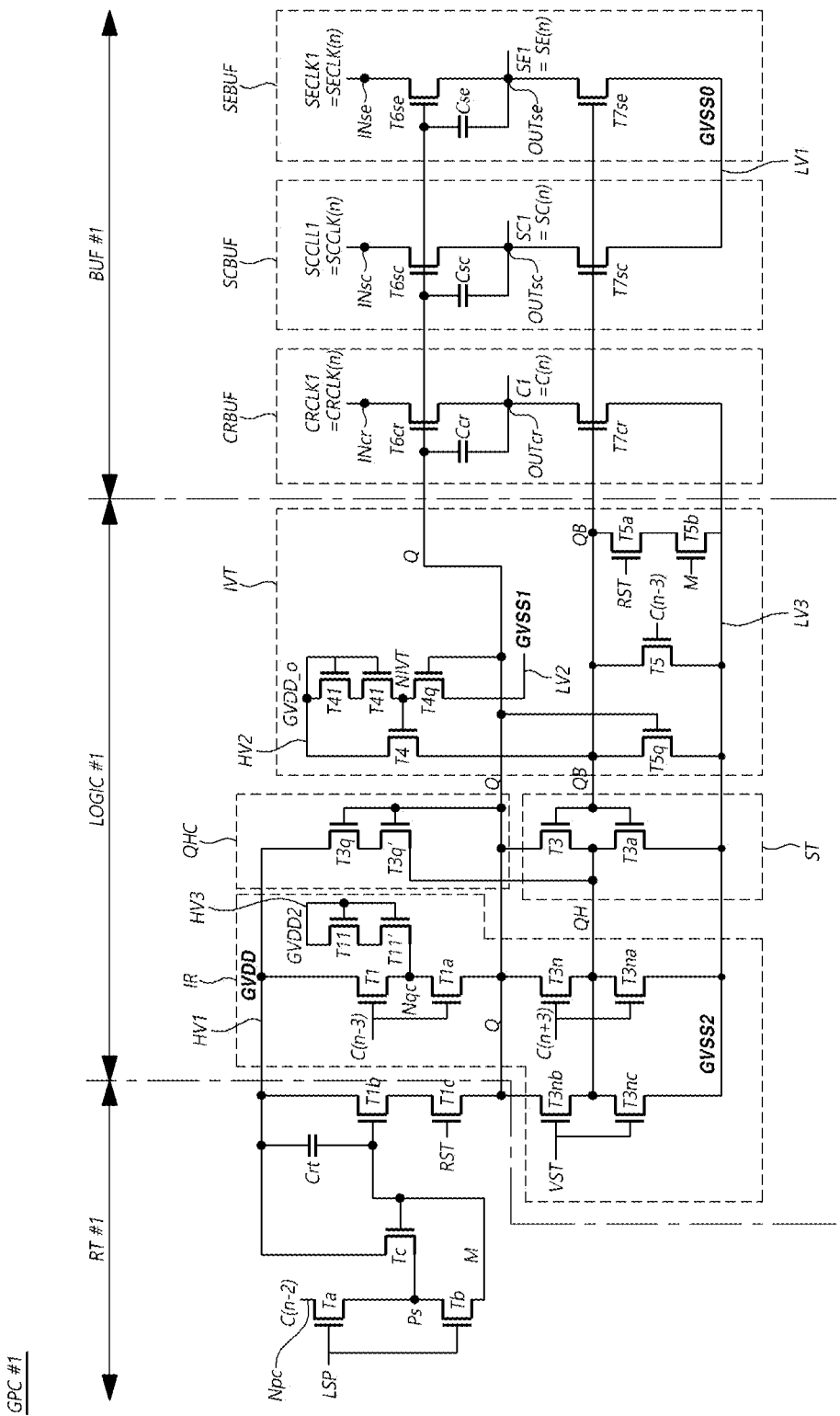
FIG. 12 illustrates an example first gate driving panel circuit included in the gate driving panel circuit according to aspects of the present disclosure.

FIG. 12 illustrates an example first gate driving panel circuit GPC #1 included in the gate driving panel circuit GPC according to aspects of the present disclosure.

In this implementation, the first gate driving panel circuit GPC #1 can be configured to output an odd-numbered n-th scan signal SC(n) and an odd-numbered n-th sensing signal SE(n). The n-th scan signal SC(n) can be supplied to an odd-numbered n-th scan signal line SCL, and the n-th sensing signal SE(n) can be supplied to an odd-numbered n-th sensing signal line SENL. Hereinafter, for convenience of description, the n-th scan signal SC(n) may be also referred to as a first scan signal SC1, and the n-th sensing signal SE(n) may be also referred to as a first sensing signal SE1.

Referring to FIG. 12, the first gate driving panel circuit GPC #1 may include a first output buffer block BUF #1, a first logic block LOGIC #1, and a first real-time sensing control block RT #1.

Referring to FIG. 12, the first output buffer block BUF #1 may include a carry output buffer CRBUF, a scan output buffer SCBUF, and a sensing output buffer SEBUF.

Referring to FIG. 12, the carry output buffer CRBUF may include a carry pull-up transistor T6$cr$ and a carry pull-down transistor T7$cr$.

The carry pull-up transistor T6$cr$ can be turned on or turned off depending on a voltage of a Q node, and thereby, control a connection between a carry clock node INcr to which an n-th carry clock signal CRCLK(n) is input and a carry output node OUTcr from which an n-th carry signal C(n) is output. Here, the n-th carry clock signal CRCLK(n) may also be referred to as a first carry clock signal CRCLK1, and the n-th carry signal C(n) may also be referred to as a first carry signal C1.

The gate node of the carry pull-up transistor T6$cr$ may be the Q node or be electrically connected to the Q node. The source node (or drain node) of the carry pull-up transistor T6$cr$ may be the carry output node OUTcr or be electrically connected to the carry output node OUTcr. The drain node (or source node) of the carry pull-up transistor T6cr may be the carry clock node INcr or be electrically connected to the carry clock node INcr.

When the carry pull-up transistor T6cr is turned on, the carry pull-up transistor T6cr can output the first carry signal C1 having a high level voltage using the first carry clock signal CRCLK1.

The carry output buffer CRBUF may further include a carry bootstrapping capacitor Ccr connected between the gate node and the source node (or drain node) of the carry pull-up transistor T6cr.

The carry pull-down transistor T7cr can be turned on or turned off depending on a voltage of a QB node, and thereby, control a connection between a third gate low voltage node LV3 to which a third gate low voltage GVSS2 is input and the carry output node OUTcr from which the n-th carry signal C(n) is output.

The gate node of the carry pull-down transistor T7cr may be the QB node or may be electrically connected to the QB node. The drain node or source node of the carry pull-down transistor T7cr may be the third gate low voltage node LV3 or be electrically connected to the third gate low voltage node LV3, and the source node or drain node of the carry pull-down transistor T7cr may be the carry output node OUTcr or be electrically connected to the carry output node OUTcr.

When the carry pull-down transistor T7cr is turned on, the carry pull-down transistor T7cr can output the first carry signal C1 having a low level voltage using the third gate low voltage GVSS2.

Referring to FIG. 12, the scan output buffer SCBUF can be configured to output an n-th scan signal SC(n)) an n-th scan clock signal SCCLK(n) having a turn-on level voltage or a turn-off level voltage to a scan output node OUTsc. The n-th scan signal SC(n) output to the scan output node OUTsc can be applied to a first scan signal line SCL1 electrically connected to the scan output node OUTsc.

Referring to FIG. 12, the scan output buffer SCBUF may include a scan pull-up transistor T6sc and a scan pull-down transistor T7sc.

The scan pull-up transistor T6sc can be turned on or turned off depending on a voltage of the Q node, and thereby, control a connection between a scan clock node INsc to which an n-th scan clock signal SCCLK(n) is input and the scan output node OUTsc from which the n-th scan signal SC(n) is output. Here, the n-th scan clock signal SCCLK(n) may also be referred to as a first scan clock signal SCCLK1, and the n-th scan signal SC(n) may also be referred to as a first scan signal SC1.

The gate node of the scan pull-up transistor T6sc may be the Q node or be electrically connected to the Q node. The source node (or drain node) of the scan pull-up transistor T6sc may be the scan output node OUTsc or be electrically connected to the scan output node OUTsc. The drain node (or source node) of the scan pull-up transistor T6sc may be the scan clock node INsc or be electrically connected to the scan clock node INsc.

When the scan pull-up transistor T6sc is turned on, the scan pull-up transistor T6sc can output the first scan signal SC1 having a turn-on level voltage (e.g., a high level voltage) using the scan clock signal SCCLK to the scan output node OUTsc. The first scan signal SC1 having the turn-on level voltage (e.g., the high level voltage) output from the scan pull-up transistor T6sc can be applied to the first scan signal line SCL1.

The scan output buffer SCBUF may further include a scan bootstrapping capacitor Csc connected between the gate node and the source node (or drain node) of the scan pull-up transistor T6sc.

The scan pull-down transistor T7sc can be turned on or turned off depending on a voltage of the QB node, and thereby, control a connection between a first gate low voltage node LV1 to which a first gate low voltage GVSS0 is input and the scan output node OUTsc from which the n-th scan signal SC(n) is output.

The gate node of the scan pull-down transistor T7sc may be the QB node or may be electrically connected to the QB node. The drain node or source node of the scan pull-down transistor T7sc may be the first gate low voltage node LV1 or be electrically connected to the first gate low voltage node LV1. The source node or drain node of the scan pull-down transistor T7sc may be the scan output node OUTsc or be electrically connected to the scan output node OUTsc.

When the scan pull-down transistor T7sc is turned on, the scan pull-down transistor T7sc can output the first scan signal SC1 having a turn-off level voltage (e.g., a low level voltage) using the first gate low voltage GVSS0 to the scan output node OUTsc. The first scan signal SC1 having the turn-off level voltage (e.g., the low level voltage) output from the scan pull-down transistor T7sc can be applied to the first scan signal line SCL1.

Referring to FIG. 12, the sensing output buffer SEBUF can be configured to output an n-th sensing signal SE(n) having a turn-on level voltage or a turn-off level voltage to a sensing output node OUTse. The n-th sensing signal SE(n) output to the sensing output node OUTse can be applied to a first sensing signal line SENL1 electrically connected to the sensing output node OUTse.

Referring to FIG. 12, the sensing output buffer SEBUF may include a sensing pull-up transistor T6se and a sensing pull-down transistor T7se.

The sensing pull-up transistor T6se can be turned on or turned off depending on a voltage of the Q node, and thereby, control a connection between a sensing clock node INse to which an n-th sensing clock signal SECLK(n) is input and the sensing output node OUTse from which the n-th sensing signal SE(n) is output. Here, the n-th sensing clock signal SECLK(n) may also be referred to as a first sensing clock signal SECLK1, and the n-th sensing signal SE(n) may also be referred to as a first sensing signal SE1.

The gate node of the sensing pull-up transistor T6se may be the Q node or be electrically connected to the Q node. The source node (or drain node) of the sensing pull-up transistor T6se may be the sensing output node OUTse or be electrically connected to the sensing output node OUTse. The drain node (or source node) of the sensing pull-up transistor T6se may be the sensing clock node INse or be electrically connected to the sensing clock node INse.

When the scan pull-up transistor T6se is turned on, the scan pull-up transistor T6se can output the first sensing signal SE1 having a turn-on level voltage (e.g., a high level voltage) using the sensing clock signal SECLK to the sensing output node OUTse. The first sensing signal SE1 having the turn-on level voltage (e.g., the high level voltage) output from the sensing pull-up transistor T6se can be applied to the first sensing signal line SENL1.

The sensing output buffer SEBUF may further include a sensing bootstrapping capacitor Cse connected between the gate node and the source node (or drain node) of the sensing pull-up transistor T6se.

The sensing pull-down transistor T7se can be turned on or turned off depending on a voltage of the QB node, and thereby, control a connection between the first gate low voltage node LV1 to which the first gate low voltage GVSS0 is input and the sensing output node OUTse from which the n-th sensing signal SE(n) is output.

The gate node of the sensing pull-down transistor T7*se* may be the QB node or may be electrically connected to the QB node. The drain node or source node of the sensing pull-down transistor T7*se* may be the first gate low voltage node LV1 or be electrically connected to the first gate low voltage node LV1. The source node (or drain node) of the sensing pull-down transistor T7*se* may be the sensing output node OUTse or be electrically connected to the sensing output node OUTse.

When the sensing pull-down transistor T7*se* is turned on, the sensing pull-down transistor T7*se* can output the first sensing signal SE1 having a turn-off level voltage (e.g., a low level voltage) using the first gate low voltage GVSS0 to the sensing output node OUTse. The first sensing signal SE1 having the turn-off level voltage (e.g., the low level voltage) output from the sensing pull-down transistor T7*se* can be applied to the first sensing signal line SENL1.

The respective gate nodes of the carry pull-up transistor T6*cr*, the scan pull-up transistor T6*sc*, and the sensing pull-up transistor T6*se* included in the first output buffer block BUF #1 may be electrically connected to each other.

The Q node may be shared by the carry output buffer CRBUF, the scan output buffer SCBUF, and the sensing output buffer SEBUF included in the first output buffer block BUF #1. The Q node may be electrically connected to the gate node of the carry pull-up transistor T6*cr*, the gate node of the scan pull-up transistor T6*sc*, and the gate node of the sensing pull-up transistor T6*se*. This structure may also be referred to as a "Q node sharing structure."

The respective gate nodes of the carry pull-down transistor T7*cr*, the scan pull-down transistor T7*sc*, and the sensing pull-down transistor T7*se* included in the first output buffer block BUF #1 may be electrically connected to each other.

The QB node may be shared by the carry output buffer CRBUF, the scan output buffer SCBUF, and the sensing output buffer SEBUF included in the first output buffer block BUF #1. The Q node may be electrically connected to the gate node of the carry pull-down transistor T7*cr*, the gate node of the scan pull-down transistor T7*sc*, and the gate node of the sensing pull-down transistor T7*se*.

Referring to FIG. 12, the first logic block LOGIC #1 may be a circuit block configured to control voltages of the Q node and QB node to control operation of the first output buffer block BUF #1, and include an input and reset block IR, a stabilization block ST, and an inverter block IVT.

Referring to FIG. 12, the input and reset block IR may be a circuit block configured to control charging and discharging of the Q node, and include a Q node charging block connected between a first gate high voltage node HV1 and the Q node and a Q node discharging block connected between the Q node and the third gate low voltage node LV3. For example, a first gate high voltage GVDD may be input to the first gate high voltage node HV1. The third gate low voltage GVSS2 may be input to the third gate low voltage node LV3.

Referring to FIG. 12, to cause the Q node to charge, the Q node charging block of the input and reset block IR may include at least one Q node charging transistor, which can be turned on or turned off by an (n−3)-th carry signal C(n−3) and thereby, control a connection between the first gate high voltage node HV1 and the Q node.

For example, the Q node charging block of the input and reset block IR may include a first Q node charging transistor T1 and a second Q node charging transistor T1*a* connected in series between the first gate high voltage node HV1 and the Q node.

The gate node of the first Q node charging transistor T1 and the gate node of the second Q node charging transistor T1*a* may be electrically connected to each other, and receive the (n−3)-th carry signal C(n−3) together.

The first Q node charging transistor T1 may be connected between the first gate high voltage node HV1 and a Q node charging control node Nqc, and the second Q node charging transistor T1*a* may be connected between the Q node charging control node Nqc and the Q node.

Referring to FIG. 12, to control the Q node charging control node Nqc, the Q node charging block of the input and reset block IR may further include a first Q node charging control transistor T11 and a second Q node charging control transistor T11' connected in series between a third gate high voltage node HV3 and the Q node charging control node Nqc. For example, a third gate high voltage GVDD2 may be applied to the third gate high voltage node HV3.

The gate node of the first Q node charge control transistor T11 and the gate node of the second Q node charge control transistor T11' may be electrically connected to each other, and be connected to the third gate high voltage node HV3 together.

Referring to FIG. 12, to cause the Q node to discharge, the Q node discharging block of the input and reset block IR may include a first Q node discharging transistor T3*n* and a second Q node discharging transistor T3*na* connected in series between the Q node and the third gate low voltage node LV3.

The first Q node discharging transistor T3*n* and the second Q node discharging transistor T3*na* can be turned on or turned off together by an (n+3)-th carry signal C(n+3), and control a connection between the Q node and the third gate low voltage node LV3.

The first Q node discharging transistor T3*n* may be connected between the Q node and a holding node (QH node), and the second Q node discharging transistor T3*na* may be connected between the holding node (QH node) and the third gate low voltage node LV3.

The gate node of the first Q node discharging transistor T3*n* and the gate node of the second Q node discharging transistor T3*na* may be electrically connected to each other, and receive the (n+3)-th carry signal C(n+3) together.

Referring to FIG. 12, to cause the Q node to discharge, the Q node discharging block of the input and reset block IR may further include a third Q node discharging transistor T3*nb* and a fourth Q node discharging transistor T3*nc* connected in series between the Q node and the third gate low voltage node LV3.

The third Q node discharging transistor T3*nb* and the fourth Q node discharging transistor T3*nc* can be turned on or turned off together by a start signal VST, and control a connection between the Q node and the third gate low voltage node LV3.

The third Q node discharging transistor T3*nb* may be connected between the Q node and the holding node (QH node), and the fourth Q node discharging transistor T3*nc* may be connected between the holding node (QH node) and the third gate low voltage node LV3.

Referring to FIG. 12, the stabilization block ST may be a circuit block configured to stabilize the Q node and the output of the gate driving panel circuit GPC depending on a voltage of the QB node during a period during which an output signal of the gate driving panel circuit GPC has a turn-off level voltage.

Referring to FIG. 12, the stabilization block ST may include a first stabilization transistor T3 and a second stabilization transistor T3a, which can be turned on or turned off depending on a voltage of the QB node and thereby, control a connection between the Q node and the third gate low voltage node LV3.

The first stabilization transistor T3 may be connected between the Q node and the holding node (QH node). The first stabilization transistor T3 can be turned on or turned off depending on a voltage of the QB node, and thereby, control a connection between the Q node and the holding node (QH node).

The second stabilization transistor T3a may be connected between the holding node (QH node) and the third gate low voltage node LV3. The second stabilization transistor T3a can be turned on or turned off depending on a voltage of the QB node, and thereby, control a connection between the holding node (QH node) and the third gate low voltage node LV3.

Referring to FIG. 12, the inverter block IVT may be a circuit block configured to control an electrical value (or level) of the Q node or the QB node such that depending on a voltage of the Q node, a voltage level resulting from inverting a voltage level of the Q node becomes a voltage level of the QB node.

Referring to FIG. 12, the inverter block IVT may include a QB node charging transistor T4 to cause the QB node to charge.

The QB node charging transistor T4 may be connected between a second gate high voltage node HV2 and the QB node. The QB node charging transistor T4 can be turned on or turned off depending on a voltage of an inverter control node NIVT, and thereby, control a connection between the second gate high voltage node HV2 and the QB node. For example, a second gate high voltage GVDD2 may be applied to the second gate high voltage node HV2.

Referring to FIG. 12, the inverter block IVT may further include a first inverter control transistor T4q for controlling the voltage of the inverter control node NIVT.

The first inverter control transistor T4q may be connected between the inverter control node NIVT and a second gate low voltage node LV2. The first inverter control transistor T4q can be turned on or turned off depending on a voltage of the Q node, and thereby, control a connection between the inverter control node NIVT and the second gate low voltage node LV2. For example, a second gate low voltage GVSS1 can be applied to the second gate low voltage node LV2.

As the Q node has a low level voltage, the first inverter control transistor T4q can be turned off. In this situation, the inverter control node NIVT may be in a state in which the second gate high voltage GVDD_o supplied by a second inverter control transistor T41 is applied. Accordingly, the QB node charging transistor T4 can be turned on, and thereby, the second gate high voltage GVDD_o can be applied to the QB node (QB node charging).

As the Q node has a high level voltage, the first inverter control transistor T4q can be turned on, and thereby, pass the second gate low voltage GVSS1 to the inverter control node NIVT. Accordingly, the QB node charging transistor T4 can be turned off, thereby preventing the second gate high voltage GVDD_o from being applied to the QB node.

Referring to FIG. 12, the inverter block IVT may further include a second inverter control transistor T41 for controlling the voltage of the inverter control node NIVT.

The second inverter control transistor T41 may be connected between the second gate high voltage node HV2 and the inverter control node NIVT. The second inverter control transistor T41 can be turned on or turned off depending on the second gate low voltage GVSS1, and thereby, control a connection between the gate high voltage node HV2 and the inverter control node NIVT.

The second inverter control transistor T41 may always remain in a turn-on state, and can pass the second gate high voltage GVDD_o to the inverter control node NIVT.

Referring to FIG. 12, to cause the QB node to discharge, the inverter block IVT may include a first QB node discharging transistor T5 connected between the QB node and the third gate low voltage node LV3.

The first QB node discharging transistor T5 can be turned on or turned off depending on an (n−3)-th carry signal C(n−3), and thereby, control a connection between the QB node and the third gate low voltage node LV3. When first QB node discharging transistor T5 is turned on, the third gate low voltage GVSS2 can be applied to the QB node. Accordingly, the QB node can be discharged.

Referring to FIG. 12, to cause the QB node to discharge, the inverter block IVT may further include a second QB node discharging transistor T5q connected between the QB node and the third gate low voltage node LV3.

The second QB node discharging transistor T5q can be turned on or turned off depending on a voltage of the Q node, and thereby, control a connection between the QB node and the third gate low voltage node LV3. When second QB node discharging transistor T5q is turned on, the third gate low voltage GVSS2 can be applied to the QB node. Accordingly, the QB node can be discharged.

Referring to FIG. 12, to cause the QB node to discharge, the inverter block IVT may further include a third QB node discharging transistor T5a and a fourth QB node discharging transistor T5b connected in series between the QB node and the third gate low voltage node LV3.

A reset signal RST can be input to the gate node of the third QB node discharging transistor T5a. That is, the third QB node discharging transistor T5a can be turned on or turned off depending on a voltage of the reset signal RST.

The gate node of the fourth QB node discharging transistor T5b may be electrically connected to an intermediate node M. That is, the fourth QB node discharging transistor T5b can be turned on or turned off depending on a voltage of the intermediate node M. For example, the intermediate node M may be a node included in the first real-time sensing control block RT #1.

Referring to FIG. 12, among the plurality of QB node discharging transistors (T5, T5q, T5a, and T5b) included in the inverter block IVT, the first QB node discharging transistor T5 and the second QB node discharging transistor T5q can be configured to discharge the QB node for display driving during an active period ACT, and the third QB node discharging transistor T5a and the fourth QB node discharging transistor T5b can be configured to discharge the QB node for sensing driving during a blank period BLANK.

Referring to FIG. 12, the first logic block LOGIC #1 may further include a holding node control block QHC for controlling a voltage of the holding node (QH node). The holding node control block QHC may be connected between the first gate high voltage node HV1 and the holding node (QH node).

Referring to FIG. 12, the holding node control block QHC may include a first holding node control transistor T3q and a second holding node control transistor T3q' connected in series between the first gate high voltage node HV1 and the holding node (QH node).

Respective gate nodes of the first holding node control transistor T3q and the second holding node control transistor T3q' may be connected to the Q node together.

When the Q node has a high level voltage, both the first holding node control transistor T3q and the second holding node control transistor T3q' can be turned on, and thereby, the first gate high voltage GVDD can be applied to the holding node (QH node). As the holding node (QH node) has the first gate high voltage GVDD, regardless of respective switching of the third Q node discharging transistor T3nb, the first Q node discharging transistor T3n, and the first stabilization transistor T3, the Q node can stably maintain a high level voltage.

Referring to FIG. 12, the first real-time sensing control block RT #1 may be a circuit block configured to control operation of the first output buffer block BUF #1 for real-time sensing driving. The first real-time sensing control block RT #1 can be configured to control a voltage of the Q node so that a first scan signal SC1 and a first sensing signal SE1 can be output at a preset timing by the first output buffer block BUF #1 during a blank period BLANK.

Referring to FIG. 12, the first real-time sensing control block RT #1 can perform a control operation so that during a blank period BLANK, the first scan signal SC1 can be output by the first output buffer block BUF #1 to a corresponding one of a plurality of scan signal lines SCL, and the first sensing signal SE1 can be output by the first output buffer block BUF #1 to a corresponding one of a plurality of sensing signal lines SENL. Through this operation, sensing driving can be performed for a subpixel (or subpixels) SP included in a corresponding one of a plurality of subpixel lines (or subpixel arrays).

Referring to FIG. 12, the first real-time sensing control block RT #1 may include a first sensing control transistor Ta, a second sensing control transistor Tb, a third sensing control transistor Tc, a fourth sensing control transistor T1b, and a fifth sensing control transistor T1c.

The first sensing control transistor Ta and the second sensing control transistor Tb may be connected in series between a previous carry input node Npc and the intermediate node M. For example, an (n−2)-th carry signal C(n−2) may be input to the previous carry input node Npc.

In order that real-time sensing driving is performed for a subpixel SP intended to receive (or to be determined to receive) the first scan signal SC1 and the first sensing signal SE1 output from the first gate driving panel circuit GPC #1, the first gate driving panel circuit GPC #1 is needed to output the first scan signal SC1 and the first sensing signal SE1 as sensing driving gate signals during a real-time sensing driving period. For example, the real-time sensing driving period may be included in a blank period BLANK.

The first real-time sensing control block RT #1 may use a line selection signal LSP so that the first scan signal SC1 and the first sensing signal SE1 can be output as sensing driving gate signals during a real-time sensing driving period.

During the real-time sensing driving period, the line selection signal LSP can be commonly input to respective gate nodes of the first sensing control transistor Ta and the second sensing control transistor Tb. For example, the line selection signal LSP may be a pulse-shaped signal, and can be commonly applied to the gate nodes of the first sensing control transistor Ta and the second sensing control transistors Tb in a period between a start time and an end time of a frame.

The third sensing control transistor Tc can be turned on or turned off depending on a voltage of the intermediate node M, and thereby, control a connection between a connection point Ps and the first gate high voltage node HV1. For example, the connection point Ps may be a point at which the first sensing control transistor Ta and the second sensing control transistor Tb are connected.

The fourth sensing control transistor T1b and the fifth sensing control transistor T1c may be connected in series between the first gate high voltage node HV1 and the Q node.

The gate node of the fourth sensing control transistor T1b may be connected to the intermediate node M. A reset signal RST can be input to the gate node of the fifth sensing control transistor T1c.

During a real-time sensing driving period, the fourth sensing control transistor T1b and the fifth sensing control transistor T1c can be turned on depending on a voltage of the intermediate node M and the reset signal RST, respectively, and thereby, pass the first gate high voltage GVDD to the Q node. Accordingly, the Q node can be charged during the real-time sensing driving period. For example, the real-time sensing driving period may be included in a blank period BLANK.

Referring to FIG. 12, the first real-time sensing control block RT #1 may include a sensing control capacitor Crt connected between the first gate high voltage node HV1 and the intermediate node M.

Figure 13A:
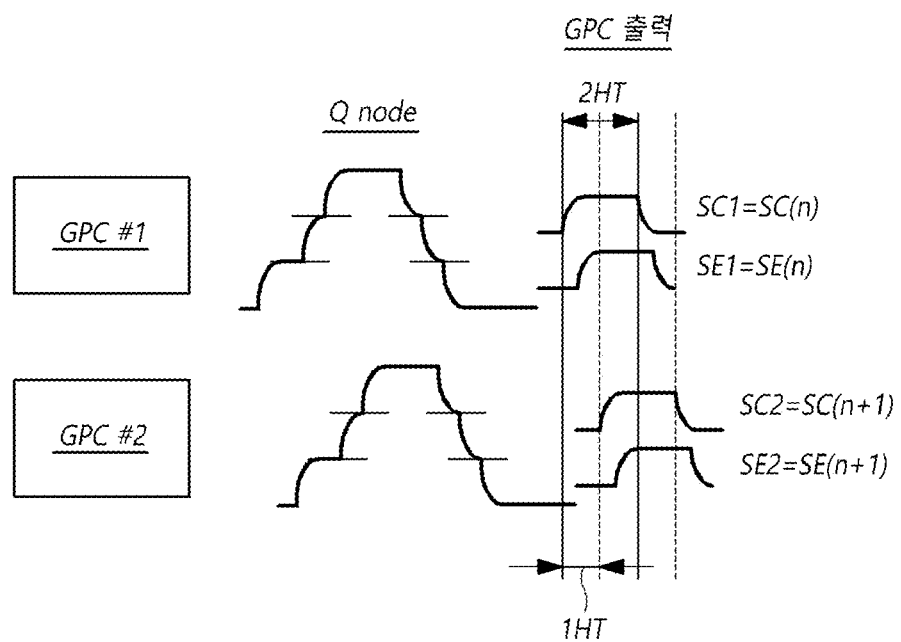
FIG. 13A illustrates respective example outputs and voltage changes at Q nodes of the first gate driving panel circuit and a second gate driving panel circuit included in the gate driving panel circuit according to aspects of the present disclosure.

FIG. 13A illustrates respective example outputs and voltage changes at Q nodes of the first gate driving panel circuit GPC #1 and the second gate driving panel circuit GPC #2 included in the gate driving panel circuit GPC according to aspects of the present disclosure.

Referring to FIG. 13A, voltage rising (boosting) may occur two or more times during a period during which a voltage of the Q node of the first gate driving panel circuit GPC #1 increases. Further, voltage rising may occur two or more times during a period during which a voltage of the Q node of the second gate driving panel circuit GPC #2 increases.

Referring to FIG. 13A, when the Q node of the first gate driving panel circuit GPC #1 has a high level voltage, the first gate driving panel circuit GPC #1 can output a first scan signal SC1 having a high level voltage and a first sensing signal SE1 having a high level voltage. A high level voltage period of the first sensing signal SE1 may proceed after a high level voltage period of the first scan signal SC1.

Referring to FIG. 13A, when the Q node of the second gate driving panel circuit GPC #2 has a high level voltage, the second gate driving panel circuit GPC #2 can output a second scan signal SC2 having a high level voltage and a second sensing signal SE2 having a high level voltage. A high level voltage period of the second sensing signal SE2 may proceed after a high level voltage period of the second scan signal SC2.

Referring to FIG. 13A, a time period of a respective high level voltage period of each of the first scan signal SC1 and the second scan signal SC2 may be two horizontal times 2HT (which may refer to a time period corresponding two horizontal periods).

Referring to FIG. 13A, the high level voltage period of the first scan signal SC1 and the high level voltage period of the second scan signal SC2 may overlap in time. A time period during which the high level voltage period of the first scan signal SC1 and the high level voltage period of the second scan signal SC2 overlap each other may be one horizontal time 1HT (which may refer to a time period corresponding one horizontal period). As described above, a gate driving scheme in which respective high level voltage periods of two scan signals (SC1 and SC2), which are output immediately adjacent to each other in time, overlap in time may be referred to as an "overlap gate driving scheme."

Referring to FIG. 13A, the high level voltage period of the first sensing signal SE1 and the high level voltage period of the second sensing signal SE2 may overlap in time. A time period during which the high level voltage period of the first sensing signal SE1 and the high level voltage period of the second sensing signal SE2 overlaps each other in time may be one horizontal time 1HT.

Figure 13B:
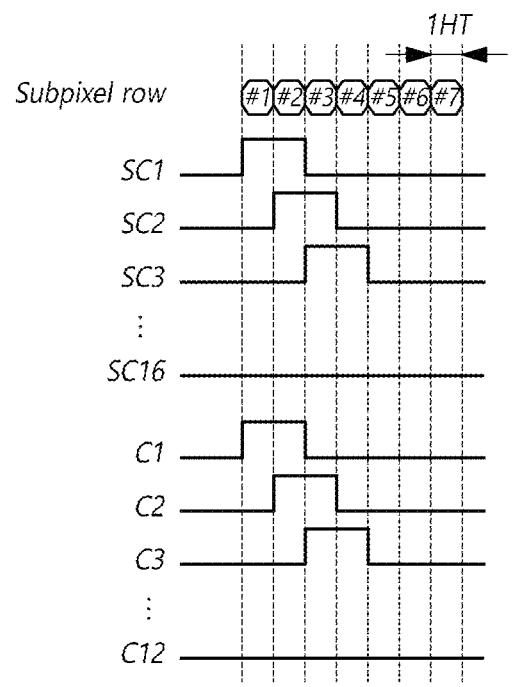
FIG. 13B illustrates example scan signals and carry signals produced from the gate driving panel circuit according to aspects of the present disclosure.

FIG. 13B illustrates example scan signals (SC1 to SC16) and carry signals (C1 to C12) produced from the gate driving panel circuit GPC in the display device 100 according to aspects of the present disclosure.

Referring to FIG. 13B, the gate driving panel circuit GPC can supply a corresponding scan signal to each of a plurality of subpixel rows (e.g., subpixel row: #1, #2, #3, . . . , and #7). The gate driving panel circuit GPC can supply a first scan signal SC1, a second scan signal SC2, and a third scan signal SC3 to a first subpixel row #1, a second subpixel row #2, and a third subpixel row #3, respectively.

A time period of a respective high level voltage period of each of the scan signals (SC1 to SC16) may be two horizontal times 2HT. The second half of the high level voltage period of the first scan signal SC1 and the first half of the high level voltage period of the second scan signal SC2 may overlap by one horizontal time 1HT. The second half of the high level voltage period of the second scan signal SC2 and the first half of the high level voltage period of the third scan signal SC3 may overlap by one horizontal time 1HT.

Referring to FIG. 13B, the carry signals (C1 to C12) can be output by circuit blocks or elements in the gate driving panel circuit GPC.

A time period of a respective high level voltage period of each of the carry signals (C1 to C12) may be two horizontal times 2HT. The second half of the high level voltage period of the first carry signal C1 and the first half of the high level voltage period of the second carry signal C2 may overlap by one horizontal time 1HT. The second half of the high level voltage period of the second carry signal C2 and the first half of the high level voltage period of the third carry signal C3 may overlap by one horizontal time 1HT.

Figure 14:
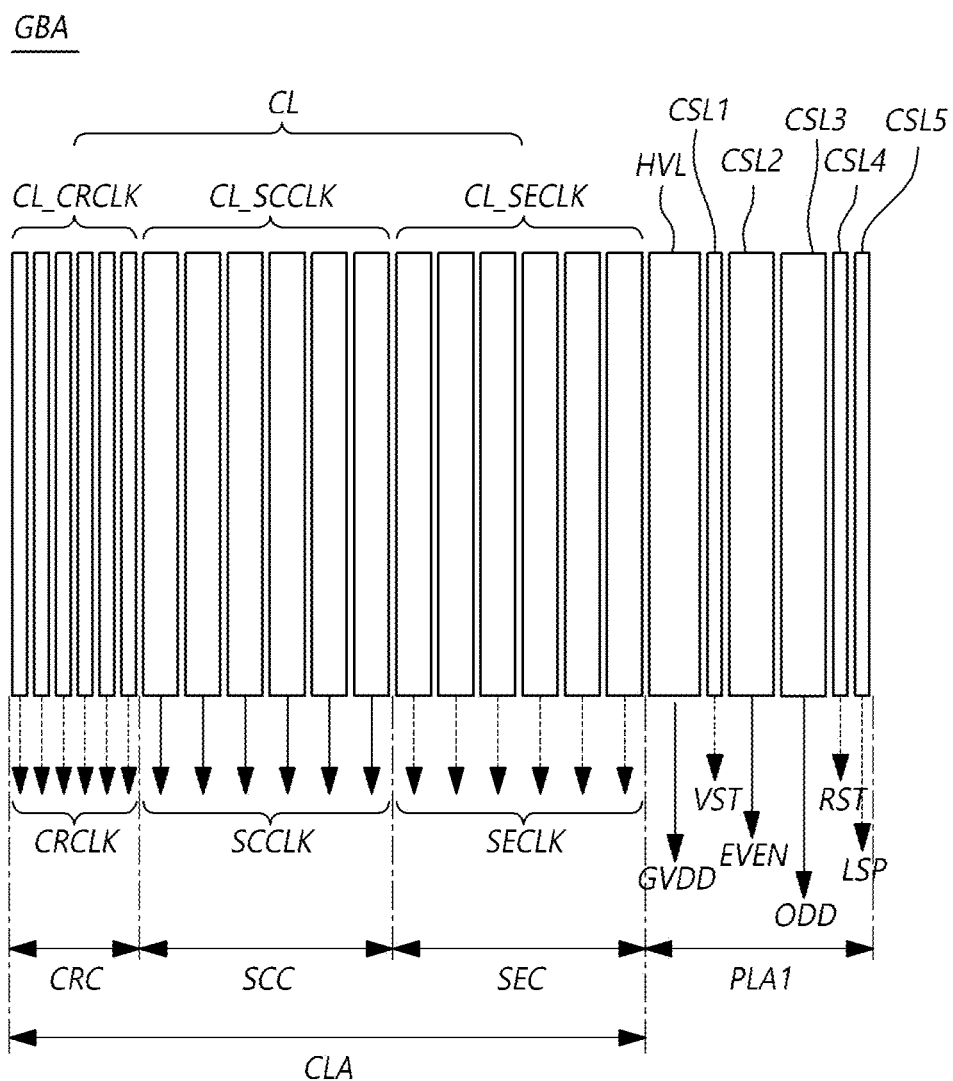
FIG. 14 illustrates an example line arrangement in a clock signal line area and a first power line area included in the gate bezel area in the non-display area of the display panel according to aspects of the present disclosure.

FIG. 14 illustrates an example line arrangement in a clock signal line area CLA and a first power line area PLA1 included in the gate bezel area GBA in the non-display area NDA of the display panel 110 according to aspects of the present disclosure.

Referring to FIG. 14, the gate bezel area GBA of the display panel 110 may include the clock signal line area CLA and the first power line area PLA1. The clock signal line area CLA and the first power line area PLA1 may be located on a first side of a gate driving panel circuit area GPCA.

Referring to FIG. 14, the clock signal line area CLA in which a plurality of clock signal lines CL are disposed may include a carry clock signal line area CRC, a scan clock signal line area SCC, and a sensing clock signal line area SEC.

Carry clock signal lines CL_CRCLK for delivering carry clock signals CRCLK to the gate driving panel circuit GPC may be disposed in the carry clock signal line area CRC.

Scan clock signal lines CL_SCCLK for delivering scan clock signals SCCLK to the gate driving panel circuit GPC may be disposed in the scan clock signal line area SCC.

Sensing clock signal lines CL_SECLK for delivering sensing clock signals SECLK to the gate driving panel circuit GPC may be disposed in the sensing clock signal line area SEC.

Among the carry clock signal line area CRC, the scan clock signal line area SCC, and the sensing clock signal line area SEC, the scan clock signal line area SCC may be located between the carry clock signal line area CRC and the sensing clock signal line area SEC, the carry clock signal line area CRC may be located furthest away from the display area DA, and the sensing clock signal line area SEC may be located closest to the display area DA.

Among the carry clock signal line area CRC, the scan clock signal line area SCC, and the sensing clock signal line area SEC, the carry clock signal line area CRC may be located furthest away from the gate driving panel circuit area GPCA, and the sensing clock signal line area SEC may be located closest to the gate driving panel circuit area GPCA.

Referring to FIG. 14, in an embodiment, a width of one scan clock signal line CL_SCCLK may be greater than that of one carry clock signal line CL_CRCLK. In an embodiment, a width of one sensing clock signal line CL_SECLK may be greater than that of one carry clock signal line CL_CRCLK.

Referring to FIG. 14, at least one gate high voltage line HVL for delivering at least one gate high voltage GVDD to the gate driving panel circuit GPC may be disposed in the first power line area PLA1.

Referring to FIG. 14, at least one control signal line may be further disposed in the first power line area PLA1. For example, the at least one control signal line may include at least one of a start signal line CSL1 for delivering a start signal VST for indicating the start of gate driving operation to the gate driving panel circuit GPC, a first driving sequence control signal line CSL2 for delivering an even-numbered driving control signal EVEN to the gate driving panel circuit GPC, a second driving sequence control signal line CSL3 for delivering an odd-numbered driving control signal ODD to the gate driving panel circuit GPC, a reset signal line CSL4 for delivering a reset signal RST for indicating the end of the gate driving operation to the gate driving panel circuit GPC, and a line selection signal line CSL5 for delivering a line selection signal LSP to the gate driving panel circuit GPC.

The gate high voltage line HVL may have a greater width than the start signal line CSL1, the reset signal line CSL4, and the line selection signal line CSL5.

For example, the first driving sequence control signal line CSL2 and the second driving sequence control signal line CSL3 may be disposed in two specific line areas in the first power line area PLA1. In another example, instead of the first driving sequence control signal line CSL2 and the second driving sequence control signal line CSL3, two gate high voltage lines may be disposed in the two specific line areas in the first power line area PLA1.

Figure 15:
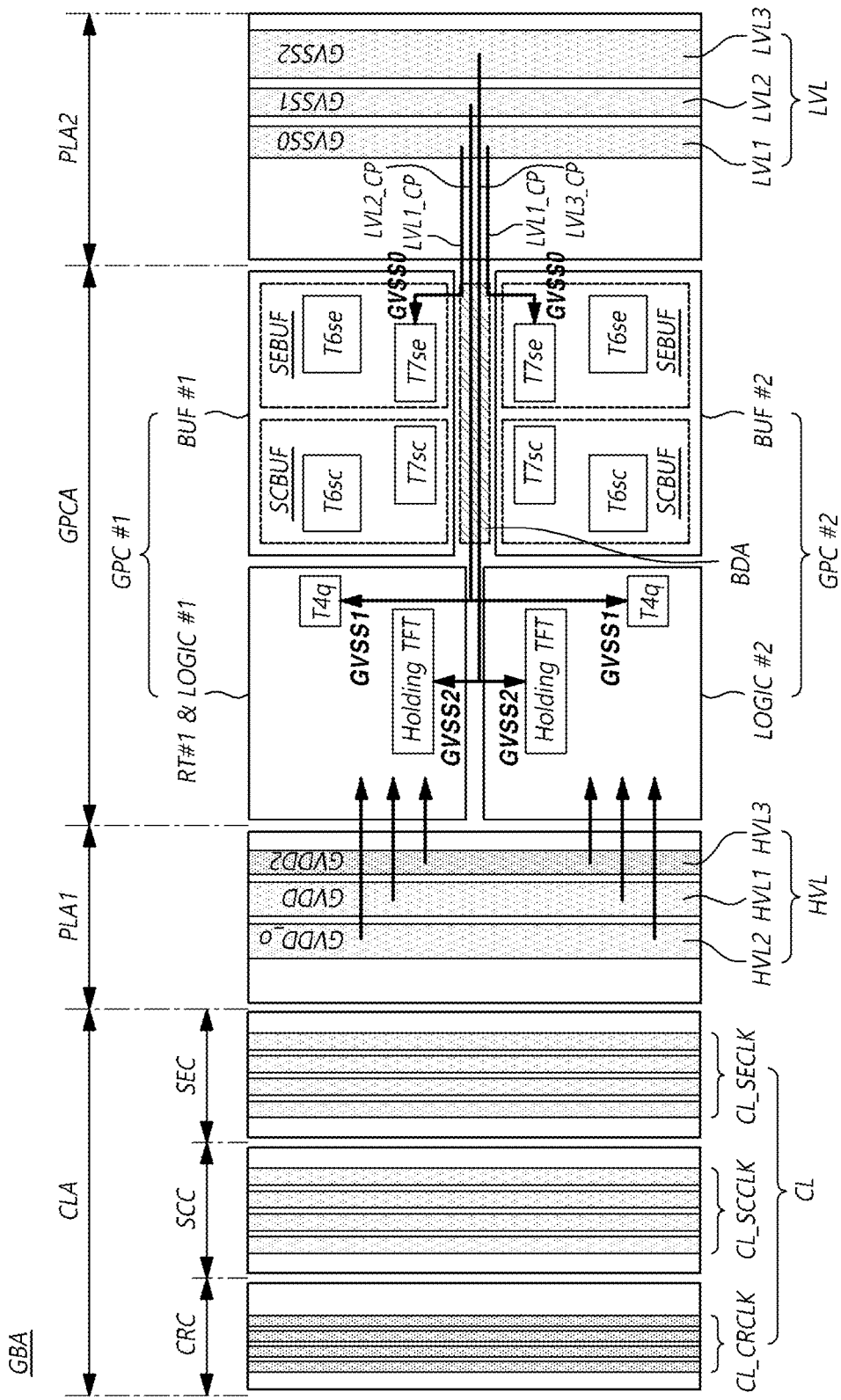
FIG. 15 is an example plan view of the gate bezel area of the display panel according to aspects of the present disclosure.

FIG. 15 is an example plan view of the gate bezel area GBA of the display panel 110 according to aspects of the present disclosure. For discussions, it is assumed that a first gate driving panel circuit (e.g., the first gate driving panel circuit GPC #1 in FIG. 11) and a second gate driving panel circuit (e.g., the second gate driving panel circuit GPC #2 in FIG. 11) are disposed in a gate driving panel circuit area GPCA (e.g., the gate driving panel circuit area GPCA in FIG. 11).

Referring to FIG. 15, the first gate driving panel circuit GPC #1 and the second gate driving panel circuit GPC #2 may be disposed in the gate driving panel circuit area GPCA.

Referring to FIG. 15, the first gate driving panel circuit GPC #1 may include a first output buffer block BUF #1, a first logic block LOGIC #1, and a first real-time sensing control block RT #1. The second gate driving panel circuit GPC #2 may include a second output buffer block BUF #2, a second logic block LOGIC #2, and the first real-time sensing control block RT #1.

Referring to FIG. 15, the first output buffer block BUF #1 of the first gate driving panel circuit GPC #1 may include a scan output buffer SCBUF for outputting a first scan signal SC1 and a sensing output buffer SEBUF for outputting a first sensing signal SE1.

The second output buffer block BUF #2 of the second gate driving panel circuit GPC #2 may include a scan output buffer SCBUF for outputting a second scan signal SC2 and a sensing output buffer SEBUF for outputting a second sensing signal SE2.

Referring to FIG. 15, the scan output buffer SCBUF included in each of the first output buffer block BUF #1 and the second output buffer block BUF #2 may include a scan pull-up transistor T6sc and a scan pull-down transistor T7sc.

The sensing output buffer SEBUF included in each of the first output buffer block BUF #1 and the second output buffer block BUF #2 may include a sensing pull-up transistor T6se and a sensing pull-down transistor T7se.

The gate bezel area GBA in the non-display area NDA of the display panel 110 may include a central area BDA for separating the first output buffer block BUF #1 and the second output buffer block BUF #2 from each other.

The display panel 110 may further include at least one first gate low voltage connection line LVL1_CP for connecting a first gate low voltage line LVL1 disposed in a second power line area PLA2 with the first output buffer block BUF #1 and the second output buffer block BUF #2.

The display panel 110 may further include at least one second gate low voltage connection line LVL2_CP for connecting a second gate low voltage line LVL2 disposed in the second power line area PLA2 with the first logic block LOGIC #1 and the second logic block LOGIC #2.

The display panel 110 may further include at least one third gate low voltage connection line LVL3_CP for connecting a third gate low voltage line LVL3 disposed in the second power line area PLA2 with the first logic block LOGIC #1 and the second logic block LOGIC #2.

The first gate low voltage connection line LVL1_CP, the second gate low voltage connection line LVL2_CP, and the third gate low voltage connection line LVL3_CP may run through the central area BDA.

Referring to FIG. 15, the scan output buffer SCBUF of the first output buffer block BUF #1 and the scan output buffer SCBUF of the second output buffer block BUF #2 may have a symmetrical structure about the central area BDA.

For example, locations or shapes of elements included in the scan output buffer SCBUF of the first output buffer block BUF #1 and locations or shapes of elements included in the scan output buffer SCBUF of the second output buffer block BUF #2 may be symmetrical about the central area BDA. For example, the elements included in the scan output buffer SCBUF may include transistors (T6sc, T7sc) and capacitors (Csc).

Referring to FIG. 15, the sensing output buffer SEBUF of the first output buffer block BUF #1 and the sensing output buffer SEBUF of the second output buffer block BUF #2 may have a symmetrical structure about the central area BDA.

For example, locations or shapes of elements included in the sensing output buffer SEBUF of the first output buffer block BUF #1 and locations or shapes of elements included in the sensing output buffer SEBUF of the second output buffer block BUF #2 may be symmetrical about the central area BDA. For example, the elements included in the sensing output buffer SEBUF may include transistors (T6se, T7se) and capacitors (Cse).

Referring to FIG. 15, a clock signal line area CLA may be located on a first side of the gate driving panel circuit area GPCA and be an area in which a plurality of clock signal lines CL are disposed.

For example, the clock signal line area CLA may include a carry clock signal line area CRC, a scan clock signal line area SCC, and a sensing clock signal line area SEC.

The plurality of clock signal lines CL may include a plurality of carry clock signal lines CL_CRCLK disposed in the carry clock signal line area CRC, a plurality of scan clock signal lines CL_SCCLK disposed in the scan clock signal line area SCC, and a plurality of sensing clock signal lines CL_SECLK disposed in the sensing clock signal line area SEC.

Since each of the plurality of carry clock signal lines CL_CRCLK, the plurality of scan clock signal lines CL_SCCLK, and the plurality of sensing clock signal lines CL_SECLK is desired to reduce load for gate driving, therefore, these lines may have a multilayer line structure.

Scan clock signals SCCLK and sensing clock signals SECLK may be more sensitive to signal delay or signal waveform changes in terms of driving than carry clock signals CRCLK. Therefore, in order to reduce the load of the plurality of scan clock signal lines CL_SCCLK and the plurality of sensing clock signal lines CL_SECLK, a line width of each of the plurality of scan clock signal lines CL_SCCLK and the plurality of sensing clock signal lines CL_SECLK may be designed to be greater than a line width of each of the plurality of carry clock signal lines CL_CRCLK.

Referring to FIG. 15, the plurality of scan clock signal lines CL_SCCLK may be disposed between the plurality of carry clock signal lines CL_CRCLK and the plurality of sensing clock signal lines CL_SECLK. The plurality of carry clock signal lines CL_CRCLK may be located further away from the gate driving panel circuit area GPCA than the plurality of sensing clock signal lines CL_SECLK.

Referring to FIG. 15, a first power line area PLA1 may be located on the first side of the gate driving panel circuit area GPCA and include at least one gate high voltage line HVL disposed in a column direction.

For example, the at least one gate high voltage line HVL may include a first gate high voltage line HVL1 for delivering a first gate high voltage GVDD to the first gate driving panel circuit GPC #1 and the second gate driving panel circuit GPC #2, a second gate high voltage line HVL2 for delivering a second gate high voltage GVDD_o to the first gate driving panel circuit GPC #1 and the second gate driving panel circuit GPC #2, and a third gate high voltage line HVL3 for delivering a third gate high voltage GVDD2 to the first gate driving panel circuit GPC #1 and the second gate driving panel circuit GPC #2.

The first gate high voltage line HVL1 may be a first gate high voltage node HV1 or may be electrically connected to the first gate high voltage node HV1. The second gate high voltage line HVL2 may be a second gate high voltage node HV2 or may be electrically connected to the second gate high voltage node HV2. The third gate high voltage line HVL3 may be a third gate high voltage node HV3 or may be electrically connected to the third gate high voltage node HV3.

The first gate high voltage GVDD, the second gate high voltage GVDD_o, and the third gate high voltage GVDD2 can be supplied to the first logic block LOGIC #1 included in the first gate driving panel circuit GPC #1 and the second logic block LOGIC #2 included in the second gate driving panel circuit GPC #2.

Among the first gate high voltage GVDD, the second gate high voltage GVDD_o, and the third gate high voltage GVDD2, the first gate high voltage GVDD can also be supplied to the first real-time sensing control block RT #1 included in the first gate driving panel circuit GPC #1.

Referring to FIG. 15, the second power line area PLA2 may be located on a second opposing side of the gate driving panel circuit area GPCA and include at least one gate low voltage line LVL disposed in the column direction.

For example, the at least one gate low voltage line LVL may include the first gate low voltage line LVL1 for delivering a first gate low voltage GVSS0 to the first gate driving panel circuit GPC #1 and the second gate driving panel circuit GPC #2, the second gate low voltage line LVL2 for delivering a second gate low voltage GVSS1 to the first gate driving panel circuit GPC #1 and the second gate driving panel circuit GPC #2, and the third gate low voltage line LVL3 for delivering a third gate low voltage GVSS2 to the first gate driving panel circuit GPC #1 and the second gate driving panel circuit GPC #2.

The first gate low voltage line LVL1 may be a first gate low voltage node LV1 or may be electrically connected to the first gate low voltage node LV1. The second gate low voltage line LVL2 may be a second gate low voltage node LV2 or may be electrically connected to the second gate low voltage node LV2. The third gate low voltage line LVL3 may be a third gate low voltage node LV3 or may be electrically connected to the third gate low voltage node LV3.

Referring to FIG. 15, the first gate low voltage GVSS0 can be supplied to the scan output buffer SCBUF and the sensing output buffer SEBUF included in the first output buffer block BUF #1 of the first gate driving panel circuit GPC #1 and be supplied to the scan output buffer SCBUF and the sensing output buffer SEBUF included in the second output buffer block BUF #2 of the second gate driving panel circuit GPC #2.

The first gate low voltage GVSS0 can be applied to respective drain nodes or source nodes of a scan pull-down transistor T7$sc$ and a sensing pull-down transistor T7$se$ included in the first output buffer block BUF #1 and be applied to respective drain nodes or source nodes of a scan pull-down transistor T7$sc$ and a sensing pull-down transistor T7$se$ included in the second output buffer block BUF #2.

The first gate low voltage connection line LVL1_CP can electrically connect respective drain nodes or source nodes of the scan pull-down transistor T7$sc$ and the sensing pull-down transistor T7$se$ included in the first output buffer block BUF #1 to the first gate low voltage line LVL1.

Further, the first gate low voltage connection line LVL1_CP can electrically connect respective drain nodes or source nodes of the scan pull-down transistor T7$sc$ and the sensing pull-down transistor T7$se$ included in the second output buffer block BUF #2 to the first gate low voltage line LVL1.

The first gate low voltage connection line LVL1_CP may be disposed in a row direction and run through the central area BDA.

Referring to FIG. 15, the second gate low voltage GVSS1 can be supplied to the first logic block LOGIC #1 of the first gate driving panel circuit GPC #1 and the second logic block LOGIC #2 of the second gate driving panel circuit GPC #2.

The second gate low voltage GVSS1 can be applied to the drain node or source node of a first inverter control transistor T4$q$ included in the first logic block LOGIC #1 and to the drain node or source node of a first inverter control transistor T4$q$ included in the second logic block LOGIC #2.

The second gate low voltage connection line LVL2_CP can electrically connect the drain node or source node of the first inverter control transistor T4$q$ included in the first logic block LOGIC #1 to the second gate low voltage line LVL2.

Further, the second gate low voltage connection line LVL2_CP can electrically connect the drain node or source node of the first inverter control transistor T4$q$ included in the second logic block LOGIC #2 to the second gate low voltage line LVL2.

Referring to FIG. 15, the third gate low voltage GVSS2 can be supplied to the first logic block LOGIC #1 of the first gate driving panel circuit GPC #1 and to the second logic block LOGIC #2 of the second gate driving panel circuit GPC #2.

The third gate low voltage GVSS2 can be applied to respective drain nodes or source nodes of holding transistors (Holding TFT) that are included in each of the first logic block LOGIC #1 and the second logic block LOGIC #2 and are connected to the third gate low voltage node LV3. The holding transistors (Holding TFT) may include a second Q node discharging transistor T3$na$, a fourth Q node discharging transistor T3$nc$, a second stabilization transistor T3$a$, a second QB node discharging transistor T5$q$, a first QB node discharging transistor T5, and a fourth QB node discharging transistor T5$b$.

The third gate low voltage connection line LVL3_CP can electrically connect the drain nodes or source nodes of the holding transistors (Holding TFT) that are included in each of the first logic block LOGIC #1 and the second logic block LOGIC #2 and connected to the third gate low voltage node LV3.

Further, the third gate low voltage GVSS2 can be applied to the drain nodes or source nodes of the carry pull-down transistors T7$cr$ included in respective carry output buffers CRBUF of the first output buffer block BUF #1 and the second output buffer block BUF #2.

As described above, since the first output buffer block BUF #1 and the second output buffer block BUF #2 have a symmetrical structure about the central area BDA, the gate low voltages (GVSS0, GVSS1, and GVSS2) can be efficiently delivered (supplied).

Hereinafter, the usage and structure of the first, second, and third gate high voltage lines (HVL1, HVL2, and HVL3) will be discussed, and the usage and structure of the first, second, and third gate low voltage lines (LVL1, LVL2, and LVL3) will be discussed.

The first gate high voltage GVDD carried through the first gate high voltage line HVL1 may be a high voltage used to cause the Q node to charge by being supplied to Q node charging blocks of respective input and reset blocks IR of the first logic block LOGIC #1 and the second logic block LOGIC #2. For example, the first gate high voltage GVDD carried through the first gate high voltage line HVL1 may be a high voltage used to cause the Q node to charge by being applied to the drain node or source node of a first Q node charging transistor T1.

Further, the first gate high voltage GVDD carried through the first gate high voltage line HVL1 may be a high voltage used to cause the Q node to charge by being supplied to the first real-time sensing control block RT #1 during a real-time sensing driving period.

The second gate high voltage GVDD_o carried through the second gate high voltage line HVL2 may be a high voltage used to cause the QB node to charge by being supplied to respective inverter blocks IVT of the first logic block LOGIC #1 and the second logic block LOGIC #2.

The third gate high voltage GVDD2 carried through the third gate high voltage line HVL3 can be applied to the drain nodes (or source nodes) and the gate nodes of respective first Q node charging control transistors T11 included in the first logic block LOGIC #1 and the second logic block LOGIC #2, and be applied to a Q node charging control node Nqc through the first Q node charging control transistors T11. The first Q node charging control transistor T11 included in each of the first logic block LOGIC #1 and the second logic block LOGIC #2 can serve to compensate for a negative threshold voltage of the first Q node charging transistor T1.

The first gate low voltage GVSS0 carried through the first gate low voltage line LVL1 can be supplied to the scan output buffer SCBUF and the sensing output buffer SEBUF of the first output buffer block BUF #1, and cause voltage levels of the first scan signal SC1 and the first sensing signal SE1 to have a turn-off voltage level. Through this, driving of the first scan signal line SCL1 and the first sensing signal line SENL1 can be turned off.

The first gate low voltage GVSS0 carried through the first gate low voltage line LVL1 can be supplied to the scan output buffer SCBUF and the sensing output buffer SEBUF of the second output buffer block BUF #2, and cause voltage levels of the second scan signal SC2 and the second sensing signal SE2 to have a turn-off voltage level. Through this, driving of the second scan signal line SCL2 and the second sensing signal line SENL2 can be turned off.

The second gate low voltage GVSS1 carried through the second gate low voltage line LVL2 may be a low voltage applied to the drain node or source node of the first inverter control transistor T4q included in the inverter block IVT of each of the first logic block LOGIC #1 and the second logic block LOGIC #2.

The second gate low voltage GVSS1 may be configured as a separate low voltage separate from the third gate low voltage GVSS2.

The third gate low voltage GVSS2 carried through the third gate low voltage line LVL3 may be a low voltage used to cause the Q node to discharge (or switch off) and the QB node to discharge (or switch off) by being supplied to each of the first logic block LOGIC #1 and the second logic block LOGIC #2.

The third gate low voltage GVSS2 carried through the third gate low voltage line LVL3 may be a power supply voltage supplied to the largest number of transistors.

Each of the first gate high voltage line HVL1, the second gate high voltage line HVL2, the first gate low voltage line LVL1, the second gate low voltage line LVL2, and the third gate low voltage line LVL3 may be desired to have a smaller line resistance because the first gate high voltage GVDD, the second gate high voltage GVDD_o, the first gate low voltage GVSS0, the second gate low voltage GVSS1, and the third gate low voltage GVSS2 directly affect respective output of the first gate driving panel circuit GPC #1 and the second gate driving panel circuit GPC #2.

Accordingly, each of the first gate high voltage line HVL1, the second gate high voltage line HVL2, the first gate low voltage line LVL1, the second gate low voltage line LVL2, and the third gate low voltage line LVL3 may have a multilayer line structure.

The first Q node charging control transistor T11 connected to the third gate high voltage line HVL3 may not require a relatively high voltage. Further, one or more lines may intersect, and overlap with, the third gate high voltage line HVL3. Considering these issues, the third gate high voltage line HVL3 may have a single-layer line structure.

Hereinafter, the multilayer line structure of the plurality of clock signal lines CL will be described with reference to FIG. 16A, and then, the multilayer line structure of each of the first gate high voltage line HVL1, the second gate high voltage line HVL2, the first gate low voltage line LVL1, the second gate low voltage line LVL2, and the third gate low voltage line LVL3 will be described with reference to FIG. 16B. Thereafter, the single-layer line structure of the third gate high voltage line HVL3 will be described with reference to FIG. 16C.

Figure 16A:
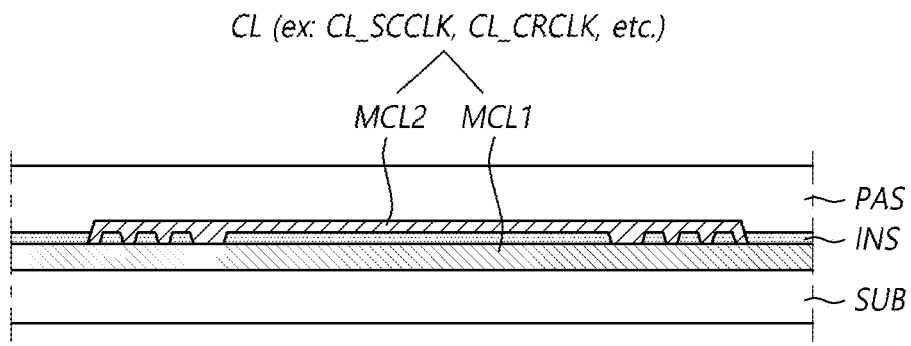
FIG. 16A illustrates an example multilayer line structure of one or more clock signal lines disposed in the gate bezel area of the display panel according to aspects of the present disclosure.

FIG. 16A illustrates an example multilayer line structure of one or more clock signal lines CL disposed in the gate bezel area GBA of the display panel 110 according to aspects of the present disclosure.

Referring to FIG. 16A, a plurality of clock signal lines CL disposed in a clock signal line area CLA may include a carry clock signal line CL_CRCLK and a scan clock signal line CL_SCCLK, and further include a sensing clock signal line. All or one or more of the plurality of clock signal lines CL may be multilayer lines. That is, at least one clock signal line CL may have a multilayer line structure.

Referring to FIG. 16A, the clock signal line(s) CL having such a multilayer line structure may include a first metal clock signal line MCL1 and a second metal clock signal line MCL2, which are electrically connected to each other. The first metal clock signal line MCL1 and the second metal clock signal line MCL2 may be located in different layers and be electrically connected to each other.

The first metal clock signal line MCL1 may be disposed in a first metal layer, which is a metal layer between a substrate SUB and an insulating layer INS on the substrate SUB.

The second metal clock signal line MCL2 may be disposed in a second metal layer, which is a metal layer between the insulating layer INS and a protective layer PAS on the insulating layer INS.

For example, the insulating layer INS may include a buffer layer and a gate insulating layer.

The second metal clock signal line MCL2 may be connected to the first metal clock signal line MCL1 through a contact hole in the insulating layer INS.

For example, a light shield may be located under an active layer (channel) of a driving transistor DRT disposed in the display area DA and may overlap with the channel of the driving transistor DRT. The insulating layer (e.g., the buffer layer) may be disposed between the channel of the driving transistor DRT and the light shield. The light shield may be formed from a first metal (e.g., a light shield metal). That is, the first metal layer may be a metal layer in which the light shield is disposed.

One of two or more capacitor electrodes constituting a storage capacitor Cst formed in the display area DA may be formed from the first metal (the light shield metal). That is, the first metal layer may be a metal layer in which one of two or more capacitor electrodes constituting the storage capacitor Cst is disposed.

In another example, the source and drain electrode of the transistor may be formed from a first metal (e.g., a source-drain metal). That is, the first metal layer may be a metal layer in which the source and drain electrodes of the transistor are disposed.

For example, a scan signal line SCL and a sensing signal line SENL may be formed from a second metal (e.g., a gate metal). That is, the second metal layer may be a metal layer in which the scan signal line SCL and the sensing signal line SENL are disposed. The second metal layer may be a metal layer in which the other one or another one of two or more capacitor electrodes constituting the storage capacitor Cst formed in the display area DA is disposed.

Figure 16B:
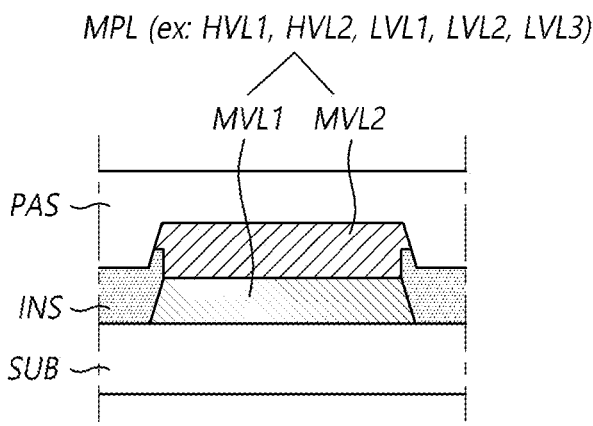
FIG. 16B illustrates an example multilayer line structure of one or more power lines disposed in the gate bezel area of the display panel according to aspects of the present disclosure.

FIG. 16B illustrates an example multilayer line structure of at least one multilayer power line MPL disposed in the gate bezel area GBA of the display panel 110 according to aspects of the present disclosure.

At least one multilayer power line MPL having a multilayer line structure may be disposed in the gate bezel area GBA.

The multilayer power line MPL may include a first metal power line MVL1 and a second metal power line MVL2. The first metal power line MVL1 and the second metal power line MVL2 may be located in different layers and may be electrically connected to each other.

The first metal power line MVL1 may be disposed in a first metal layer between a substrate SUB and an insulating layer INS on the substrate SUB. The second metal power line MVL2 may be disposed in a second metal layer between the insulating layer INS and a protective layer PAS on the insulating layer INS. For example, the insulating layer INS may include a buffer layer and a gate insulating layer.

The second metal power line MVL2 may be connected to the first metal power line MVL1 through a contact hole in the insulating layer INS.

For example, the first metal layer may be a metal layer in which a light shield located under the channel of a driving transistor DRT formed in the display area DA is disposed. The first metal layer may be a metal layer in which one of two or more capacitor electrodes constituting a storage capacitor Cst formed in the display area DA is disposed.

In another example, the first metal layer may be a metal layer constituting the source and drain electrode of the transistor.

For example, the second metal layer may be a metal layer in which a scan signal line SCL and a sensing signal line SENL are disposed. The second metal layer may be a metal layer in which the other one or another one of two or more capacitor electrodes constituting the storage capacitor Cst formed in the display area DA is disposed.

For example, the multilayer power line MPL having the multilayer line structure may include the first gate high voltage line HVL1, the second gate high voltage line HVL2, the first gate low voltage line LVL1, the second gate low voltage line LVL2, and the third gate low voltage line LVL3.

Figure 16C:
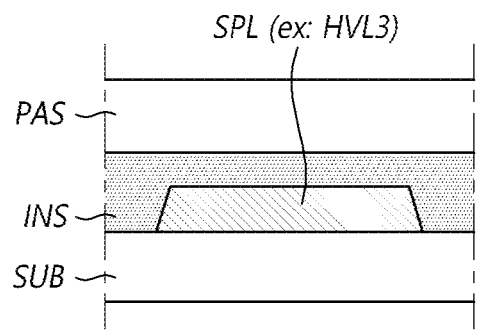
FIG. 16C illustrates an example single-layer line structure of a power line disposed in the gate bezel area of the display panel according to aspects of the present disclosure.

FIG. 16C illustrates an example single-layer line structure of at least one single-layer power line disposed in the gate bezel area GBA of the display panel 110 according to aspects of the present disclosure.

At least one single-layer power line SPL having a single-layer line structure may be disposed in the gate bezel area GBA.

The single-layer power line SPL may be disposed in a first metal layer between a substrate SUB and an insulating layer INS on the substrate SUB. For example, the insulating layer INS may include a buffer layer and a gate insulating layer.

For example, the first metal layer may be a metal layer in which a light shield located under the channel of a driving transistor DRT formed in the display area DA is disposed. The first metal layer may be a metal layer in which one of two or more capacitor electrodes constituting a storage capacitor Cst formed in the display area DA is disposed.

In another example, the first metal layer may be a metal layer constituting the source and drain electrode of the transistor.

For example, the single-layer power line SPL having the single-layer line structure may include the third gate high voltage line HVL3.

Referring to FIGS. 16A, 16B, and 16C, all or one or more of the plurality of clock signal lines CL may be multilayer lines. At least one of the plurality of gate high voltage lines HVL may be a single-layer line, and the remaining gate high voltage lines HVL may be multilayer lines. The plurality of gate low voltage lines LVL may be multilayer lines.

Figure 17:
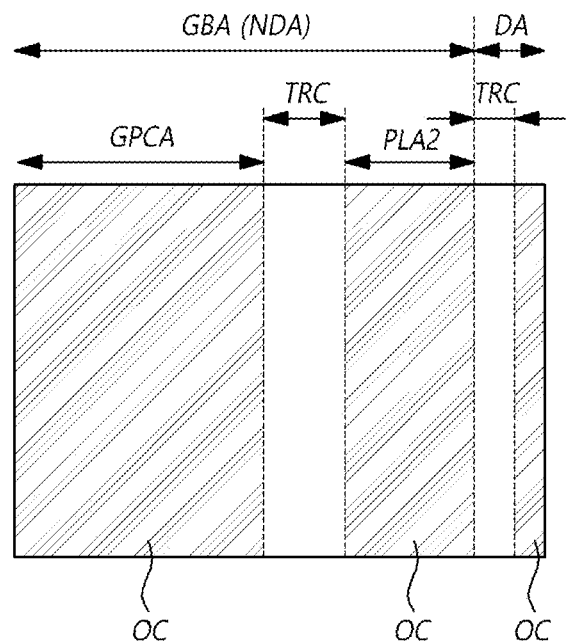
FIGS. 17 and 18 respectively are a plan view and a cross-sectional view for an example area including the gate bezel area in the display panel according to aspects of the present disclosure.

FIG. 17 is a plan view of an example area including the gate bezel area GBA in the display panel 100 according to aspects of the present disclosure.

Referring to FIG. 17, the gate bezel area GBA of the non-display area NDA may include a gate driving panel circuit area GPCA and a second power line area PLA2.

Referring to FIG. 17, an overcoat layer OC may be disposed in the gate bezel area GBA of the non-display area NDA. At least one trench TRC in which the overcoat layer OC is removed may be present in the gate bezel area GBA.

For example, the at least one trench TRC may be formed in at least one of a first area between the gate driving panel circuit area GPCA and the second power line area PLA2 and a second area between the second power line area PLA2 and the display area DA.

For example, a first trench TRC may be located in the first area between the gate driving panel circuit area GPCA and the second power line area PLA2. That is, the overcoat layer OC may be disposed in each of the gate driving panel circuit area GPCA and the second power line area PLA2, and an area (i.e., the first area) between the gate driving panel circuit area GPCA and the second power line area PLA2, in which the overcoat layer is not disposed, may correspond to the first trench TRC.

For example, a second trench TRC may additionally located in the second area between the second power line area PLA2 and the display area DA. That is, the overcoat layer OC may be disposed in each of the second power line area PLA2 and the display area DA, and an area (i.e., the second area) between the second power line area PLA2 and the display area DA, in which the overcoat layer is not disposed, may correspond to the second trench TRC.

As the display panel 110 has the above-described trench structure, the penetration of moisture H20 into an emission layer EL can be prevented.

Figure 18:
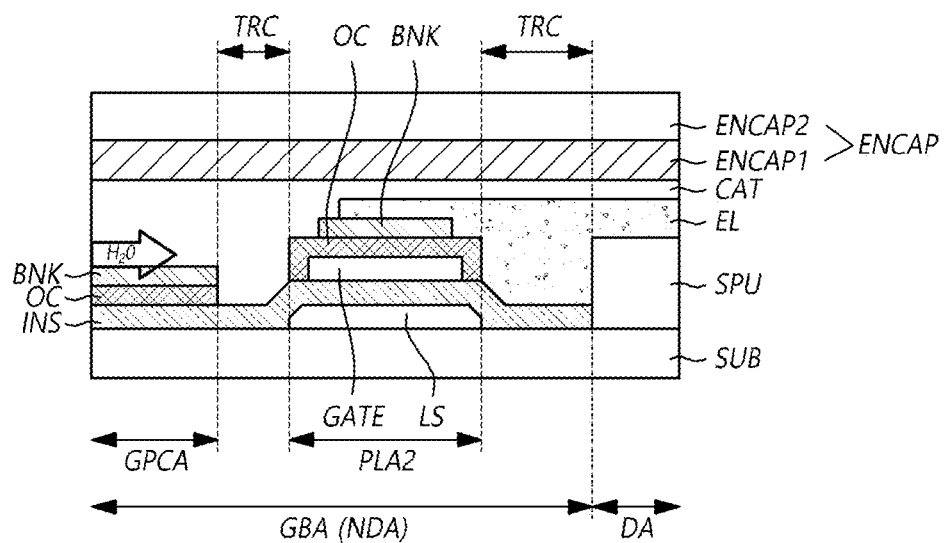

FIG. 18 is a cross-sectional view of an example area including the gate bezel area GBA in the display panel 100 according to aspects of the present disclosure.

Referring to FIG. 18, a light shield LS may be disposed on a substrate SUB in a second power line area PLA2 of the gate bezel area GBA.

In the gate bezel area GBA, an insulating layer INS may be disposed such that the insulating layer INS covers the light shield LS.

In the second power line area PLA2 of the gate bezel area GBA, a gate material layer GATE may be disposed on the insulating layer INS and overlap with the light shield LS.

In a gate driving panel circuit area GPCA of the gate bezel area GBA, an overcoat layer OC may be disposed on the insulating layer INS.

In the second power line area PLA2 of the gate bezel area GBA, the overcoat layer OC may be disposed such that the overcoat layer OC covers the gate material layer GATE on the insulating layer INS.

In a gate driving panel circuit area GPCA and the second power line area PLA2 of the gate bezel area GBA, a bank BNK may be disposed on the overcoat layer OC.

In the gate bezel area GBA, a trench TRC may be formed in an area between the gate driving panel circuit area GPCA and the second power line area PLA2, in which the overcoat layer OC and the bank BNK are not present (or removed).

In the gate bezel area GBA, an additional trench TRC may be formed in an area between the second power line area PLA2 and the display area DA, in which the overcoat layer OC and the bank BNK are not present (or removed).

Meanwhile, in the display area DA, an emission layer EL may be disposed under a cathode electrode CAT, and a subpixel section SPU may be located under the emission layer EL. The subpixel section SPU may include an anode electrode AE, transistors (DRT, SCT, SENT, and the like), and a storage capacitor Cst. The emission layer EL may extend to the gate bezel area GBA of the non-display area NDA.

For example, the emission layer EL may extend from the display area DA to the non-display area NDA and extend to an upper portion of the bank BNK in the second power line area PLA2 via the trench TRC.

In the display area DA, the cathode electrode CAT may be disposed on the emission layer EL. The cathode electrode CAT may extend to the gate bezel area GBA of the non-display area NDA. Accordingly, the cathode electrode CAT may extend from the display area DA to all or a portion of the gate driving panel circuit area GPCA.

The cathode electrode CAT may be disposed in an area in which the trench TRC between the gate driving panel circuit area GPCA and the second power line area PLA2 is present, and disposed in an area in which the trench TRC between the second power line area PLA2 and the display area DA is present.

An encapsulation layer ENCAP may be disposed on the cathode electrode CAT. The encapsulation layer ENCAP may extend from the display area DA to a portion of the non-display area NDA.

The encapsulation layer ENCAP may include a first encapsulation layer ENCAP1 on the cathode electrode CAT and a second encapsulation layer ENCAP2 on the first encapsulation layer ENCAP1. For example, the first encapsulation layer ENCAP1 may include an adhesive and/or a moisture absorbent having an encapsulation function. The first encapsulation layer ENCAP1 may include an organic material. The second encapsulation layer ENCAP2 may include a metal or an inorganic material.

Figure 19:
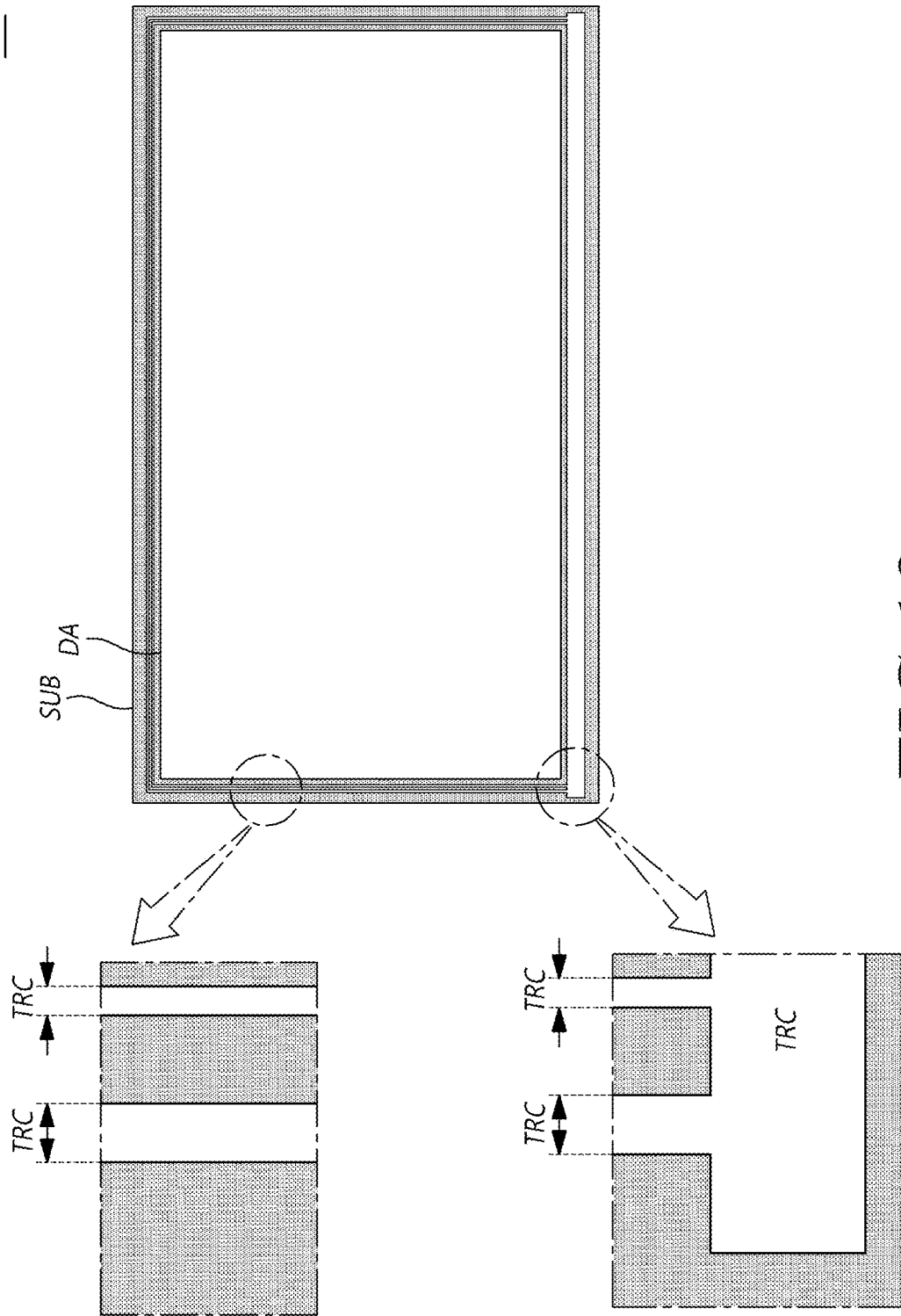
FIG. 19 is an example plan view of the display panel according to aspects of the present disclosure, and illustrates an example trench (or trenches) formed in one or more edges of the display panel.

FIG. 19 is an example plan view of the display panel 110 according to aspects of the present disclosure, and illustrates an example trench (or trenches) formed in one or more edges of the display panel 110 (e.g., upper, lower, left, and/or right edges).

Referring to FIG. 19, a trench TRC may be formed along the entire edge of the display panel 110. That is, the trench TRC may be located in the non-display area NDA such that the trench TRC surrounds the display area DA.

Referring to FIG. 19, for example, two rows of trenches TRC as shown in FIGS. 17 and 18 may be formed in three outer edges among four outer edges of the display panel 110. For example, a width of a single row of trench TRC (e.g., formed in a bottom outer edge of the display panel 110) may be greater than a width of each of the two rows of trenches TRC.

Referring to FIG. 19, for example, a single row of trench TRC may be formed in one of the four outer edges of the display panel 110. The one outer edge in which the single row of trench TRC is formed may be an area in which circuit films CF on which source driver integrated circuits SDIC are mounted are connected.

Figure 20:
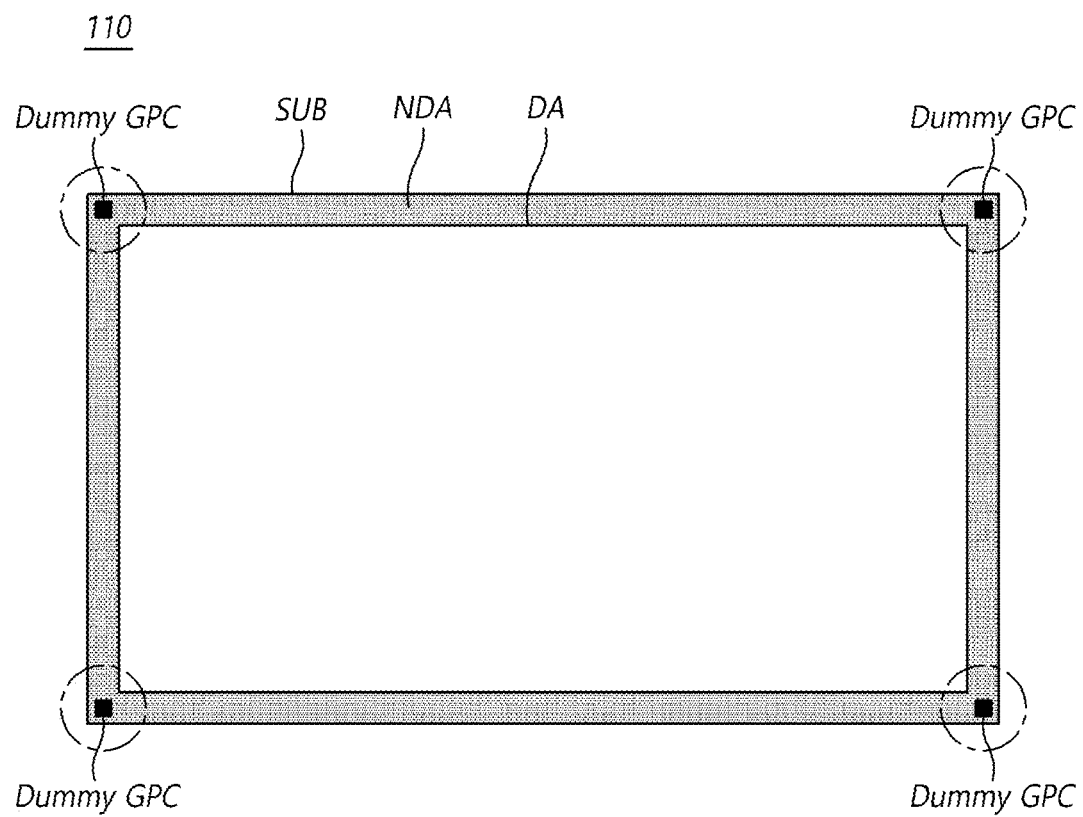
FIG. 20 is an example plan view of the display panel according to aspects of the present disclosure, and illustrates one or more example dummy gate driving panel circuits disposed in one or more corner areas of the display panel.

FIG. 20 is an example plan view of the display panel 110 according to aspects of the present disclosure, and illustrates one or more example dummy gate driving panel circuits (Dummy GPC) disposed in one or more corner areas of the display panel 110 (e.g., upper-left, upper-right, lower-left, and/or lower-rights corners).

Referring to FIG. 20, in one or more embodiments, the display panel 110 according to aspects of the present disclosure may include one or more dummy gate driving panel circuits (Dummy GPC) disposed at all, or one or more, of a plurality of corner areas (or corner points) of the non-display area DNA.

The dummy gate driving panel circuit (Dummy GPC) may have basically the same structure as the gate driving panel circuit GPC. However, the dummy gate driving panel circuit (Dummy GPC) may not be connected to a gate line GL actually used to drive the display. For example, such a gate line GL may be a scan signal line SCL or a sensing signal line SENL.

Figure 21:
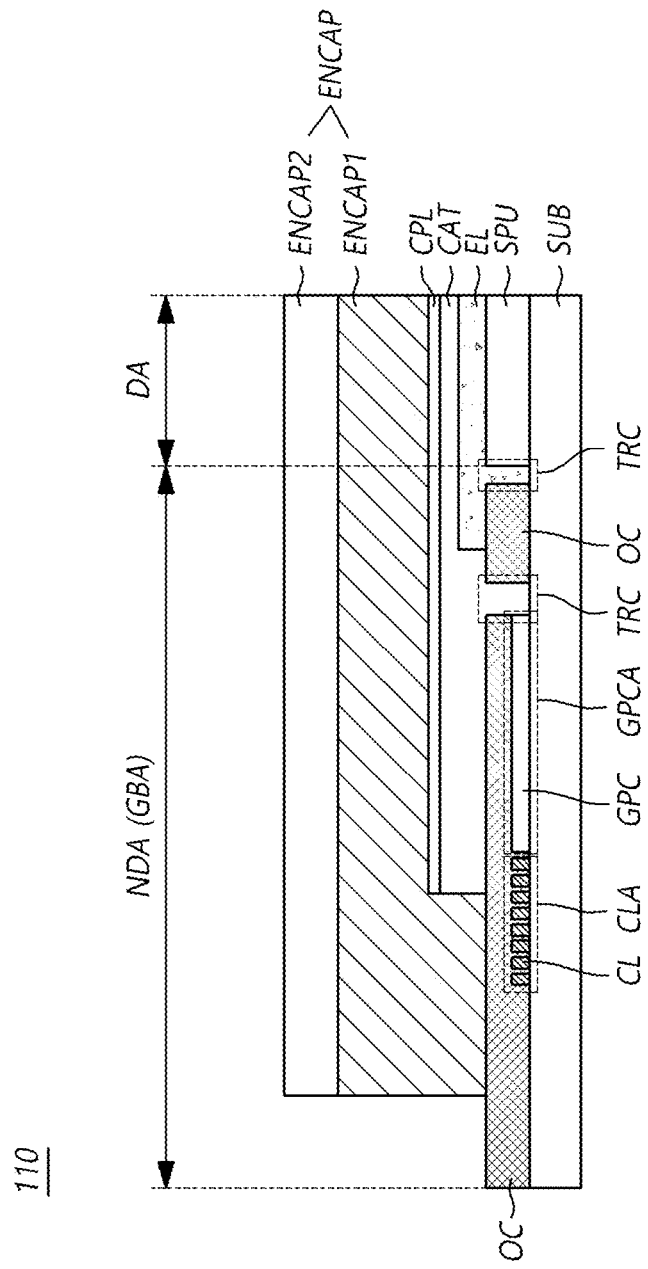
FIG. 21 is an example cross-sectional view of the display panel according to aspects of the present disclosure, and illustrates an area including the gate bezel area and a portion of display area.

FIG. 21 is an example cross-sectional view of the display panel 110 according to aspects of the present disclosure, and illustrates an area including the gate bezel area GBA and a portion of display area DA.

The cross-sectional view of FIG. 21 represents an area including the gate bezel area GBA where a gate driving panel circuit GPC is disposed and a portion of the display area DA adjacent to the gate bezel area GBA in the non-display area NDA of the display panel 110.

Referring to FIG. 21, in one or more embodiments, the display panel 110 according to aspects of the present disclosure may include a substrate SUB, the gate driving panel circuit GPC, a plurality of clock signal lines CL, an overcoat layer OC, a cathode electrode CAT, and the like.

The display area DA and the non-display area NDA may be defined on the substrate SUB.

The gate driving panel circuit GPC may be disposed on the substrate SUB, disposed in a gate driving panel circuit area GPCA included in the gate bezel area GBA of the non-display area NDA, and configured to output a corresponding gate signal to each of a plurality of gate lines GL disposed in the display area DA.

For example, the plurality of gate lines GL may include a plurality of scan signal lines SCL and a plurality of sensing signal lines SENL.

The plurality of clock signal lines CL may be disposed on the substrate SUB, and disposed in a clock signal line area CLA located on a first side of the gate driving panel circuit area GPCA in the non-display area NDA. Each of the plurality of clock signal lines CL can deliver a corresponding clock signal to the gate driving panel circuit GPC.

For example, the clock signal line area CLA may be located further away from the display area DA than the gate driving panel circuit area GPCA. For example, the clock signal line area CLA may be located in a further outer edge of the substrate SUB than the gate driving panel circuit area GPCA.

For example, the plurality of clock signal lines CL may include a plurality of carry clock signal lines CL_CRCLK, a plurality of scan clock signal lines CL_SCCLK, and a plurality of sensing clock signal lines CL_SECLK.

The overcoat layer OC may be disposed on the plurality of clock signal lines CL.

The overcoat layer OC may be disposed on the gate driving panel circuit GPC.

The cathode electrode CAT may be disposed in the display area DA and extend to the non-display area NDA.

The cathode electrode CAT may extend to the gate bezel area GBA in the non-display area NDA. For example, the cathode electrode CAT may extend to all or at least a portion of the gate driving panel circuit GPC such that the cathode electrode CAT is located on (or covers) all or at least a portion of the gate driving panel circuit GPC. According to this configuration, the cathode electrode CAT may overlap with all or at least a portion of the gate driving panel circuit GPC.

The cathode electrode CAT may extend to the gate bezel area GBA in the non-display area NDA. For example, the cathode electrode CAT may extend to all, or one or more, of the plurality of clock signal lines CL such that the cathode electrode CAT is located on (or covers) all, or one or more, of the plurality of clock signal lines CL. According to this configuration, the cathode electrode CAT may overlap with all, or one or more, of the plurality of clock signal lines CL.

A first power line area PLA1 may be disposed between the clock signal line area CLA and the gate driving panel circuit area GPCA, and a second power line area PLA2 may be disposed between the gate driving panel circuit area GPCA and the display area DA. It should be noted that, in FIG. 21, the first power line area PLA1 and the second power line area PLA2 are omitted.

Referring to FIG. 21, an emission layer EL located under the cathode electrode CAT may be disposed in the display area DA and, for example, extend to a portion of the non-display area NDA. The emission layer EL may overlap with a portion of the overcoat layer OC.

A subpixel section SPU may be located under the emission layer EL. The subpixel section SPU may include an anode electrode AE, transistors (DRT, SCT, SENT, and the like), and a storage capacitor Cst.

Referring to FIG. 21, one or more trenches TRC, which may be holes formed in the overcoat layer OC or areas in which corresponding portions of the overcoat layer OC are removed, may be present in the non-display area NDA. For example, when a plurality of trenches TRC are present, one of the plurality of trenches TRC may not overlap with the emission layer EL, and the other or another thereof may overlap with the emission layer EL. The emission layer EL may extend to the non-display area NDA and be inserted into the one or more trenches TRC formed in the overcoat layer OC.

Referring to FIG. 21, in one or more embodiments, the display panel 110 according to aspects of the present disclosure may include a capping layer CPL disposed on the cathode electrode CAT and an encapsulation layer ENCAP disposed on the capping layer CPL.

The encapsulation layer ENCAP may include a first encapsulation layer ENCAP1 and a second encapsulation layer ENCAP2. For example, the first encapsulation layer ENCAP1 may include an adhesive and/or a moisture absorbent having an encapsulation function. The first encapsulation layer ENCAP1 may include an organic material. The second encapsulation layer ENCAP2 may include a metal or an inorganic material. The second encapsulation layer ENCAP2 may be disposed such that the second encapsulation layer ENCAP2 covers the cathode electrode CAT, the capping layer CPL, and the first encapsulation layer ENCAP1.

The encapsulation layer ENCAP may overlap with the plurality of clock signal lines CL and the gate driving panel circuit GPC.

Each of the emission layer EL, the cathode electrode CAT, and the capping layer CPL may have a slightly different size or edge position from each other depending on process errors during the manufacturing process of the display panel 110. For example, the cathode electrode CAT may not overlap with all of the plurality of clock signal lines CL disposed in the clock signal line area CLA. Depending on the process errors, a portion of the cathode electrode CAT may overlap with all or one or more of the plurality of clock signal lines CL disposed in the clock signal line area CLA.

Figure 22:
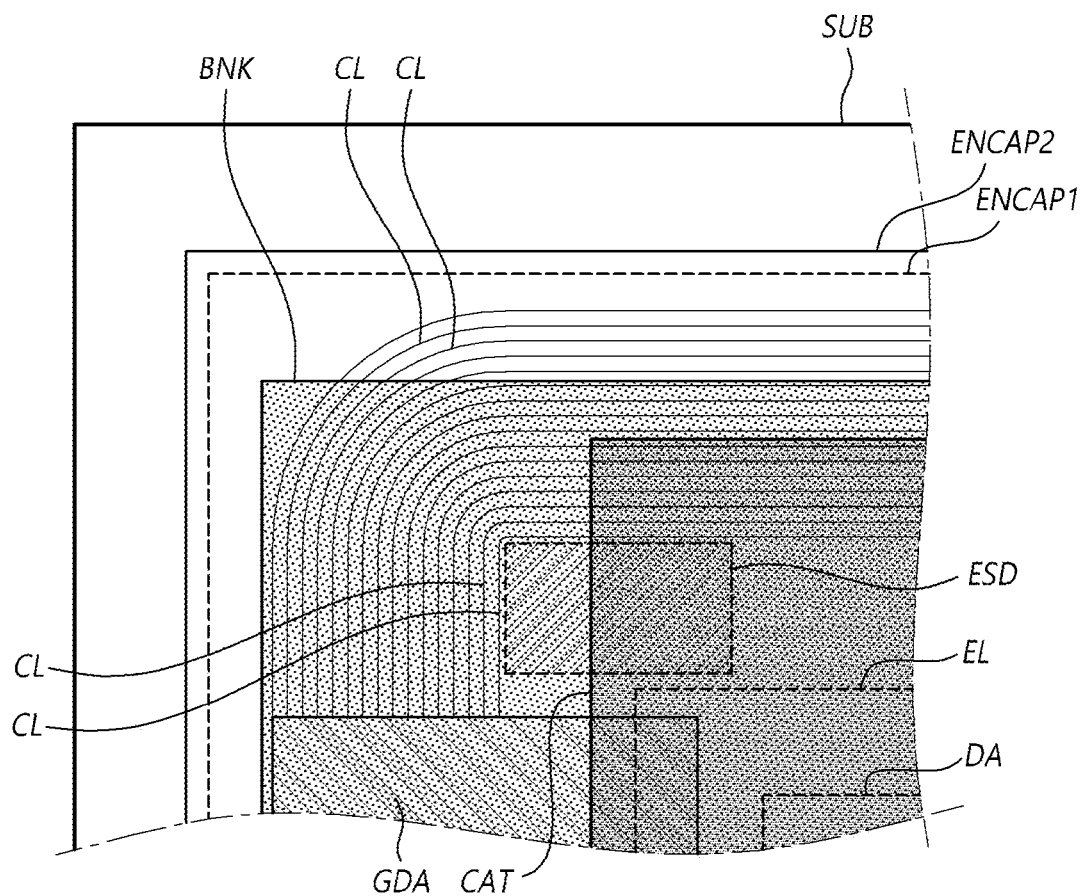
FIG. 22 is a plan view illustrating an example outer corner area of the display panel according to aspects of the present disclosure.

FIG. 22 is a plan view illustrating an example outer corner area of the substrate SUB of the display panel 110 according to aspects of the present disclosure.

Referring to FIG. 22, in one or more embodiments, the display panel 110 according to aspects of the present disclosure may include a bank BNK extending from the display area DA to the non-display area NDA, an emission layer EL (e.g., the emission layer EL discussed above with reference to FIG. 21) extending from the display area DA to the non-display area NDA, a cathode electrode CAT (e.g., the cathode electrode CAT discussed above with reference to FIG. 21) extending from the display area DA to the non-display area NDA and located on the emission layer EL, and an electrostatic discharge component ESD disposed in an outer corner area of the non-display area NDA.

Referring to FIG. 22, in one or more embodiments, a corner portion of the bank BNK, a corner portion of the cathode electrode CAT, a corner portion of a first encapsulation layer ENCAP1 (e.g., the first encapsulation layer ENCAP1 discussed above with reference to FIG. 21), and a corner portion of a second encapsulation layer ENCAP2 (e.g., the second encapsulation layer ENCAP2 discussed above with reference to FIG. 21) may be located in an outer corner area of the substrate SUB of the display panel 110.

Referring to FIG. 22, in the outer corner area of the display panel 110, among the bank BNK, the cathode electrode CAT, the first encapsulation layer ENCAP1, and the second encapsulation layer ENCAP2, the bank BNK may extend further outwardly than the cathode electrode CAT, and the first encapsulation layer ENCAP1 and the second encapsulation layer ENCAP2 may extend further outwardly than the bank BNK. The second encapsulation layer ENCAP2 may extend to a location the same as, or similar to, a location to which the first encapsulation layer ENCAP1 extends, or may extend further outwardly than the first encapsulation layer ENCAP1.

Referring to FIG. 22, a portion of a gate driving area GDA may be disposed in the outer corner area of the substrate SUB of the display panel 110.

Referring to FIG. 22, the gate driving area GDA may include the gate driving panel circuit area GPCA in which the gate driving panel circuit GPC is disposed. The gate driving area GDA may further include the clock signal line area CLA, the first power line area PLA1, and the second power line area PLA2.

Referring to FIG. 22, the gate driving area GDA may overlap with the bank BNK, the first encapsulation layer ENCAP1, and the second encapsulation layer ENCAP2. All or a portion of the gate driving area GDA may overlap with the cathode electrode CAT.

Referring to FIG. 22, the electrostatic discharge component ESD may be disposed in the outer corner area of the substrate SUB of the display panel 110. For example, the electrostatic discharge component ESD may include an electrostatic discharge circuit or an electrostatic discharge pattern.

A location at which the electrostatic discharge component ESD is disposed is not limited thereto. For example, one or more additional electrostatic discharge components ESD may be disposed in one or more other locations of the display device 100, in addition to the outer corner area shown in FIG. 26, or one or more other portions of the electrostatic discharge component ESD may be disposed in one or more other locations of the display device 100.

Referring to FIG. 22, the electrostatic discharge component ESD may overlap with the bank BNK. All or a portion of the electrostatic discharge component ESD may overlap with the cathode electrode CAT. The electrostatic discharge component ESD may overlap with the first encapsulation layer ENCAP1 and the second encapsulation layer ENCAP2.

For example, the bank BNK may be disposed on the entire top surface, or over all, of the electrostatic discharge component ESD. The cathode electrode CAT may be disposed on the top surface of, or over, a portion of the electrostatic discharge component ESD.

Referring to FIG. 22, the plurality of clock signal lines CL may be disposed along the outer corner of the substrate SUB and/or edges adjacent to the outer corner of the substrate SUB.

Referring to FIG. 22, the plurality of clock signal lines CL may overlap with the first encapsulation layer ENCAP1 and the second encapsulation layer ENCAP2. All, or one or more, of the plurality of clock signal lines CL may overlap with the cathode electrode CAT. All, or one or more, of the plurality of clock signal lines CL may not overlap with the electrostatic discharge component ESD.

Referring to FIG. 22, the emission layer EL may be disposed to extend from the display area DA to the non-display area NDA. For example, the emission layer EL may be one of components for composing one of an organic light emitting diode (OLED), a quantum dot organic light emitting diode (QD-OLED), and a light emitting diode chip (LED chip).

Referring to FIG. 22, a portion of the gate driving area GDA may overlap with the emission layer EL. The electrostatic discharge component ESD may not overlap with the emission layer EL. In one or more embodiments, the electrostatic discharge component ESD may overlap with all or a portion of the emission layer EL.

In one or more embodiments, the display panel 110 according to aspects of the present disclosure may have an improved electrostatic discharge structure.

As an example improved electrostatic discharge structure, a scan clock signal line area SCC and a sensing clock signal line area SEC are located further outwardly than a carry clock signal line area CRC.

As another example improved electrostatic discharge structure, a line width of a scan clock signal line CL_SCCLK disposed in the scan clock signal line area SCC and a line width of a sensing clock signal line CL_SECLK disposed in the sensing clock signal line area SEC are greater than a line width of a carry clock signal line CL_CRCLK disposed in a carry clock signal line area CRC.

As further another example improved electrostatic discharge structure, a channel width of a scan pull-up transistor T6$sc$ connected to the scan clock signal line CL_SCCLK disposed in the scan clock signal line area SCC and a channel width of a sensing pull-up transistor T6$se$ connected to the sensing clock signal line CL_SECLK disposed in the sensing clock signal line area SEC are greater than a channel width of a carry pull-up transistor T6$cr$ connected to the carry clock signal line CL_CRCLK disposed in the carry clock signal line area CRC.

Hereinafter, improved electrostatic discharge structures of the display panel 110 will be described. It should be noted that hereinafter, description will be provided by focusing on features or configurations that are different from the features or configurations described above, and description on features or configurations that are substantially the same as the features or configurations described above may be omitted.

Figure 23:
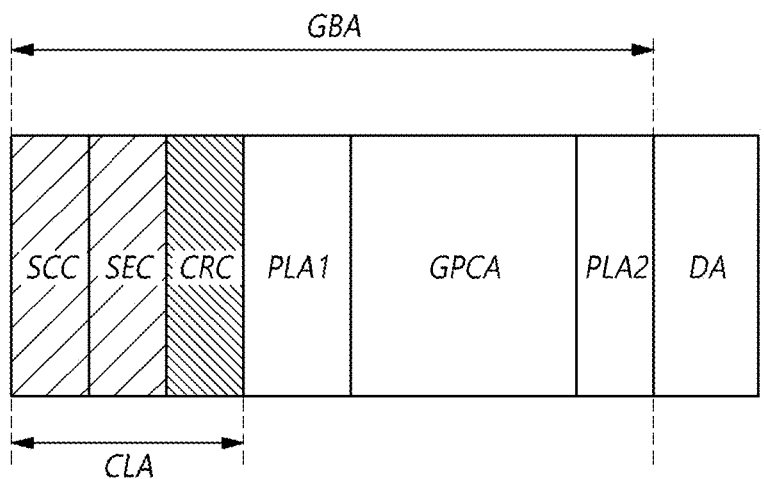
FIG. 23 illustrates an example configuration of the gate bezel area of the display panel according to aspects of the present disclosure.

FIG. 23 illustrates an example configuration of the gate bezel area GBA of the display panel 110 according to aspects of the present disclosure.

Referring to FIG. 23, as an example improved electrostatic discharge structure of the display panel 110 according to aspects of the present disclosure, a clock signal line area CLA included in the gate bezel area GBA may have a structure that is advantageous to electrostatic discharge.

To implement this configuration, among a scan clock signal line area SCC, a sensing clock signal line area SEC, and a carry clock signal line area CRC included in the clock signal line area CLA, the scan clock signal line area SCC and the sensing clock signal line area SEC may be located further outwardly than the carry clock signal line area CRC.

Referring to FIG. 23, a gate driving panel circuit GPC may be disposed in a gate driving panel circuit area GPCA in the gate bezel area GBA of the non-display area NDA, and can be configured to output a carry signal based on a carry clock signal CRCLK and output a scan signal based on a scan clock signal SCCLK.

A carry clock signal line CL_CRCLK may be disposed in the carry clock signal line area CRC in the gate bezel area GBA of the non-display area NDA, and can deliver the carry clock signal CRCLK to the gate driving panel circuit GPC.

A scan clock signal line CL_SCCLK may be disposed in the scan clock signal line area SCC in the gate bezel area GBA of the non-display area NDA, and can deliver the scan clock signal SCCLK to the gate driving panel circuit GPC.

Referring to FIG. 23, the scan clock signal line CL_SCCLK may be disposed further outwardly than the carry clock signal line CL_CRCLK. The carry clock signal line CL_CRCLK may be disposed further outwardly than the gate driving panel circuit GPC.

Referring to FIG. 23, the gate driving panel circuit GPC can be configured to additionally output a sensing signal based on a sensing clock signal SECLK.

A sensing clock signal line CL_SECLK may be disposed in the sensing clock signal line area SEC in the gate bezel area GBA of the non-display area NDA, and can deliver the sensing clock signal SECLK to the gate driving panel circuit GPC.

Referring to FIG. 23, the sensing clock signal line CL_SECLK may be disposed further outwardly than the carry clock signal line CL_CRCLK. The sensing clock signal line CL_SECLK may be disposed between the scan clock signal line CL_SCCLK and the carry clock signal line CL_CRCLK.

Referring to FIG. 23, a first power line area PLA1 may be disposed between the clock signal line area CLA and the gate driving panel circuit area GPCA. A plurality of first lines disposed in the first power line area PLA1 may include at least one gate high voltage line.

Referring to FIG. 23, a second power line area PLA2 may be disposed between the gate driving panel circuit area GPCA and the display area DA. A plurality of second lines disposed in the second power line area PLA2 may include at least one gate low voltage line.

Referring to FIG. 23, the at least one gate high voltage line disposed in the first power line area PLA1 and the at least one gate low voltage line disposed in the second power line area PLA2 may be electrically separated by the gate driving panel circuit GPC disposed in the gate driving panel circuit area GPCA.

Figure 24:
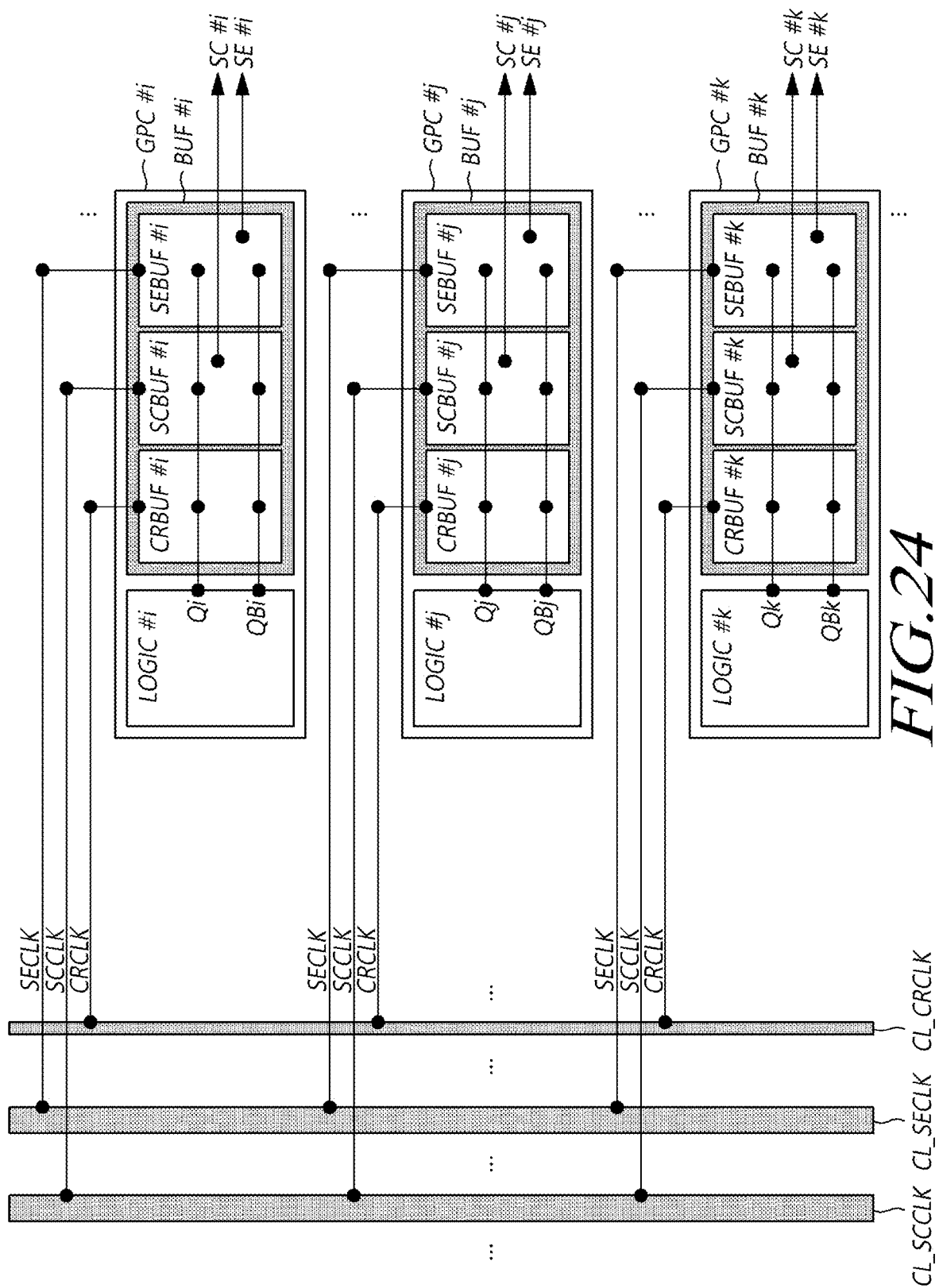
FIG. 24 illustrates an example connection structure between three clock signal lines and a gate driving panel circuit in the gate bezel area of the display panel according to aspects of the present disclosure.

FIG. 24 illustrates an example connection structure between three clock signal lines (CL_SCCLK, CL_SECLK, and CL_CRCLK) and a gate driving panel circuit GPC in the gate bezel area GBA of the display panel 110 according to aspects of the present disclosure.

Referring to FIG. 24, a plurality of scan clock signal lines CL_SCCLK, a plurality of sensing clock signal lines CL_SECLK, and a plurality of carry clock signal lines CL_CRCLK may be disposed in a clock signal line area CLA in the gate bezel area GBA of the display panel 110.

Referring to FIG. 24, a gate driving panel circuit GPC may be disposed in a gate driving panel circuit area GPCA in the gate bezel area GBA of the display panel 110. For example, the gate driving panel circuit GPC may include a plurality of stage circuits.

Referring to FIG. 24, the plurality of stage circuits included in the gate driving panel circuit GPC may include an i-th stage circuit GPC #i, a j-th stage circuit GPC #j, and a k-th stage circuit GPC #k, which are connected to one or more clock signal lines (e.g., one carry clock signal line, one scan clock signal line, and/or one sensing clock signal line). The i-th stage circuit GPC #i, the j-th stage circuit GPC #j, and the k-th stage circuit GPC #k may be referred to as an i-th gate driving panel circuit GPC #i, a j-th gate driving panel circuit GPC #j, and a k-th gate driving panel circuit GPC #k, respectively.

Referring to FIG. 24, the i-th stage circuit GPC #i, the j-th stage circuit GPC #j, and the k-th stage circuit GPC #k may be, for example, three stage circuits among a plurality of stage circuits connected to one clock signal line (e.g., one carry clock signal line, one scan clock signal line, and/or one sensing clock signal line). The values of i, j, and k may be determined depending on phases of gate driving. For example, in the case of 8-phase driving, j may be i+8*integer (e.g., i+8, i+16, . . . ), and K may be j+8*integer (e.g., j+8, j+16, . . . ). In another example, in the case of 12-phase driving, j may be i+12*integer (e.g., i+12, i+24, . . . ), and K may be j+12*integer (e.g., j+12, j+24, . . . ).

Referring to FIG. 24, one scan clock signal line CL_SCCLK may be connected to all of the i-th stage circuit GPC #i, the j-th stage circuit GPC #j, and k-th stage circuit GPC #k. One scan clock signal line CL_SCCLK can deliver a scan clock signal SCCLK to all of the i-th stage circuit GPC #i, the j-th stage circuit GPC #j, and k-th stage circuit GPC #k.

One sensing clock signal line CL_SECLK may be connected to all of the i-th stage circuit GPC #i, the j-th stage circuit GPC #j, and k-th stage circuit GPC #k. One sensing clock signal line CL_SECLK can deliver a sensing clock signal SECLK to all of the i-th stage circuit GPC #i, the j-th stage circuit GPC #j, and k-th stage circuit GPC #k.

One carry clock signal line CL_CRCLK may be connected to all of the i-th stage circuit GPC #i, the j-th stage circuit GPC #j, and k-th stage circuit GPC #k. One carry clock signal line CL_CRCLK can deliver a carry clock signal CRCLK to all of the i-th stage circuit GPC #i, the j-th stage circuit GPC #j, and k-th stage circuit GPC #k.

Referring to FIG. 24, the i-th stage circuit GPC #i may include an i-th output buffer block BUF #i for outputting an i-th scan signal SC #i and an i-th sensing signal SE #i, and an i-th logic block LOGIC #i for controlling the operation of the i-th output buffer block BUF #i. In an embodiment, the i-th stage circuit GPC #i may further include an i-th real-time sensing control block.

Referring to FIG. 24, the i-th output buffer block BUF #i may include an i-th carry output buffer CRBUF #i for outputting an i-th carry signal based on a carry clock signal CRCLK, an i-th scan output buffer SCBUF #i for outputting an i-th scan signal SC #i based on a scan clock signal SCCLK, and an i-th sensing output buffer SEBUF #i for outputting an i-th sensing signal SE #i based on a sensing clock signal SECLK.

Referring to FIG. 24, the i-th stage circuit GPC #i may include an i-th Q node Qi connected to all of the i-th carry output buffer CRBUF #i, the i-th scan output buffer SCBUF #i, and the i-th sensing output buffer SEBUF #i. The i-th stage circuit GPC #i may include an i-th QB node QBi connected to all of the i-th carry output buffer CRBUF #i, the i-th scan output buffer SCBUF #i, and the i-th sensing output buffer SEBUF #i.

Referring to FIG. 24, locations (arrangement) of the i-th carry output buffer CRBUF #i, the i-th scan output buffer SCBUF #i, and the i-th sensing output buffer SEBUF #i may be determined variously according to design requirements.

As illustrated in FIG. 24, the i-th scan output buffer SCBUF #i may be located between the i-th carry output buffer CRBUF #i and the i-th sensing output buffer SEBUF #i. The i-th carry output buffer CRBUF #i may be located further outwardly than the i-th scan output buffer SCBUF #i.

In another example, the i-th scan output buffer SCBUF #i may be located furthest outwardly, the i-th carry output buffer CRBUF #i may be located closest to the display area DA, and the i-th sensing output buffer SEBUF #i may be located between the i-th scan output buffer SCBUF #i and the i-th carry output buffer CRBUF #i. That is, the output buffers may be arranged to correspond to an arrangement of the clock signal lines.

Referring to FIG. 24, the j-th stage circuit GPC #j may include a j-th output buffer block BUF #j for outputting a j-th scan signal SC #j and a j-th sensing signal SE #j, and a j-th logic block LOGIC #j for controlling the operation of the j-th output buffer block BUF #j. In an embodiment, the j-th stage circuit GPC #j may further include a j-th real-time sensing control block.

Referring to FIG. 24, the j-th output buffer block BUF #j may include a j-th carry output buffer CRBUF #j for outputting a j-th carry signal based on a carry clock signal CRCLK, a j-th scan output buffer SCBUF #j for outputting a j-th scan signal SC #j based on a scan clock signal SCCLK, and a j-th sensing output buffer SEBUF #j for outputting a j-th sensing signal SE #j based on a sensing clock signal SECLK.

Referring to FIG. 24, the j-th stage circuit GPC #j may include a j-th Q node Qj connected to all of the j-th carry output buffer CRBUF #j, the j-th scan output buffer SCBUF #j, and the j-th sensing output buffer SEBUF #j. The j-th stage circuit GPC #j may include a j-th QB node QBj connected to all of the j-th carry output buffer CRBUF #j, the j-th scan output buffer SCBUF #j, and the j-th sensing output buffer SEBUF #j.

Referring to FIG. 24, locations (arrangement) of the j-th carry output buffer CRBUF #j, the j-th scan output buffer SCBUF #j, and the j-th sensing output buffer SEBUF #j may correspond to the locations (arrangement) of the i-th carry output buffer CRBUF #i, the i-th scan output buffer SCBUF #i, and the i-th sensing output buffer SEBUF #i.

Referring to FIG. 24, the k-th stage circuit GPC #k may include a k-th output buffer block BUF #k for outputting a k-th scan signal SC #k and a k-th sensing signal SE #k, and a k-th logic block LOGIC #k for controlling the operation of the k-th output buffer block BUF #k. In an embodiment, the k-th stage circuit GPC #k may further include a k-th real-time sensing control block.

Referring to FIG. 24, the k-th output buffer block BUF #k may include a k-th carry output buffer CRBUF #k for outputting a k-th carry signal based on a carry clock signal CRCLK, a k-th scan output buffer SCBUF #k for outputting a k-th scan signal SC #k based on a scan clock signal SCCLK, and a k-th sensing output buffer SEBUF #k for outputting a k-th sensing signal SE #k based on a sensing clock signal SECLK.

Referring to FIG. 24, the k-th stage circuit GPC #k may include a k-th Q node Qk connected to all of the k-th carry output buffer CRBUF #k, the k-th scan output buffer SCBUF #k, and the k-th sensing output buffer SEBUF #k. The k-th stage circuit GPC #k may include a k-th QB node QBk connected to all of the k-th carry output buffer CRBUF #k, the k-th scan output buffer SCBUF #k, and the k-th sensing output buffer SEBUF #k.

Referring to FIG. 24, locations (arrangement) of the k-th carry output buffer CRBUF #k, the k-th scan output buffer SCBUF #k, and the k-th sensing output buffer SEBUF #k may correspond to the locations (arrangement) of the i-th carry output buffer CRBUF #i, the i-th scan output buffer SCBUF #i, and the i-th sensing output buffer SEBUF #i.

Referring to FIG. 24, in an embodiment, a width of the scan clock signal line CL_SCCLK may be greater than that of the carry clock signal line CL_CRCLK. In an embodiment, a width of the sensing clock signal line CL_SECLK may be greater than that of the carry clock signal line CL_CRCLK.

Static electricity flowing in from an outer edge of the display panel 110 can be discharged more effectively through the scan clock signal line CL_SCCLK and the sensing clock signal line CL_SECLK, which have a greater line width and are disposed in the outer edge.

Referring to FIG. 24, each of the i-th, j-th, and k-th carry output buffers (CRBUF #i, CRBUF #j, and CRBUF #k) may include a carry pull-up transistor T6$cr$ connected between a carry clock node to which the carry clock signal CRCLK is input and a carry output node from which a carry signal is output, and a carry pull-down transistor T7$c$ connected between a third gate low voltage node LV3 different from a first gate low voltage node LV1 and the carry output node.

Referring to FIG. 24, each of the i-th, j-th, and k-th scan output buffers (SCBUF #i, SCBUF #j, and SCBUF #k) may include a scan pull-up transistor T6$sc$ connected between a scan clock node to which the scan clock signal SCCLK is input and a scan output node from which a scan signal (SC #i, SC #j, or SC #k) is output, and a scan pull-down transistor T7$sc$ connected between the first gate low voltage node LV1 and the scan output node.

Referring to FIG. 24, each of the i-th, j-th, and k-th stage circuits (GPC #i, GPC #j, and GPC #k) may include the corresponding Q node (Qi, Qj, or Qk) to which respective gate nodes of the carry pull-up transistor T6$cr$ and the scan pull-up transistor T6$sc$ are electrically connected, and the corresponding QB node (QBi, QBj, or QBk) to which respective gate nodes of the carry pull-down transistor T7$cr$ and the scan pull-down transistor T7$sc$ are electrically connected.

Referring to FIG. 24, each of the i-th, j-th, and k-th sensing output buffers (SEBUF #i, SEBUF #j, and SEBUF #k) may include a sensing pull-up transistor T6$se$ connected between a sensing clock node to which the sensing clock signal SECLK is input and a sensing output node from which a sensing signal (SE #i, SE #j, or SE #k) is output, and a sensing pull-down transistor T7$se$ connected between the first gate low voltage node LV1 and the sensing output node.

Referring to FIG. 24, each of the i-th, j-th, and k-th stage circuits (GPC #i, GPC #j, and GPC #k) may include the corresponding Q node (Qi, Qj, or Qk) to which respective gate nodes of the carry pull-up transistor T6$cr$, the scan pull-up transistor T6$sc$, and the sensing pull-up transistor T6$se$ are electrically connected, and the corresponding QB node (QBi, QBj, or QBk) to which respective gate nodes of the carry pull-down transistor T7$cr$, the scan pull-down transistor T7$sc$, and the sensing pull-down transistor T7$se$ are electrically connected.

Referring to FIG. 24, each of the i-th, j-th, and k-th logic blocks (LOGIC #i, LOGIC #j, and LOGIC #k) can control voltages of the corresponding Q node (Qi, Qj, or Qk) and QB node (QBi, QBj, or QBk).

Referring to FIG. 24, as an example improved electrostatic discharge structure of the display panel 110 according to aspects of the present disclosure, a scan clock signal line area SCC in which scan clock signal lines CL_SCCLK are disposed and a sensing clock signal line area SEC in which sensing clock signal lines CL_SECLK are disposed may be located further outwardly than a carry clock signal line area CRC in which carry clock signal lines CL_CRCLK are disposed.

Referring to FIG. 24, as another example improved electrostatic discharge structure of the display panel 110 according to aspects of the present disclosure, a line width of the scan clock signal line CL_SCCLK disposed in the scan clock signal line area SCC and a line width of the sensing clock signal line CL_SECLK disposed in the sensing clock signal line area SEC may be greater than a line width of the carry clock signal line CL_CRCLK disposed in the carry clock signal line area CRC.

Figure 25:
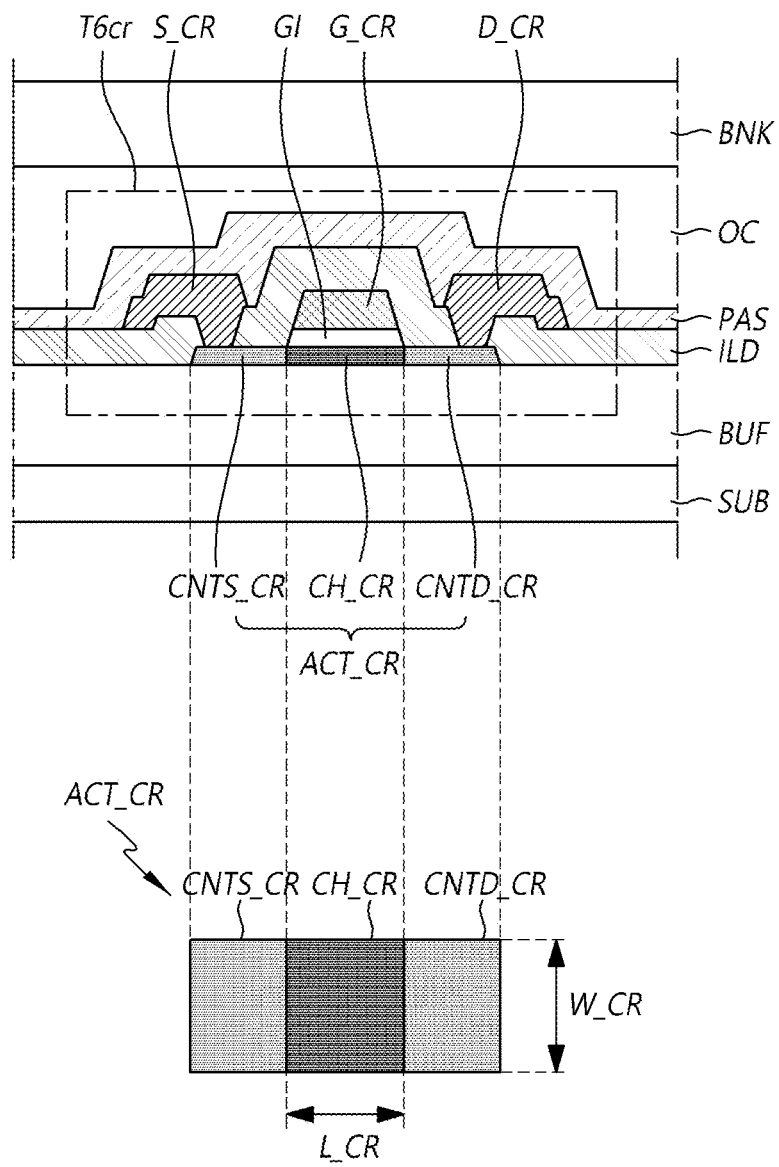
FIGS. 25 to 27 illustrates example three pull-up transistors disposed in the gate bezel area of the display panel according to aspects of the present disclosure.
Figure 26:
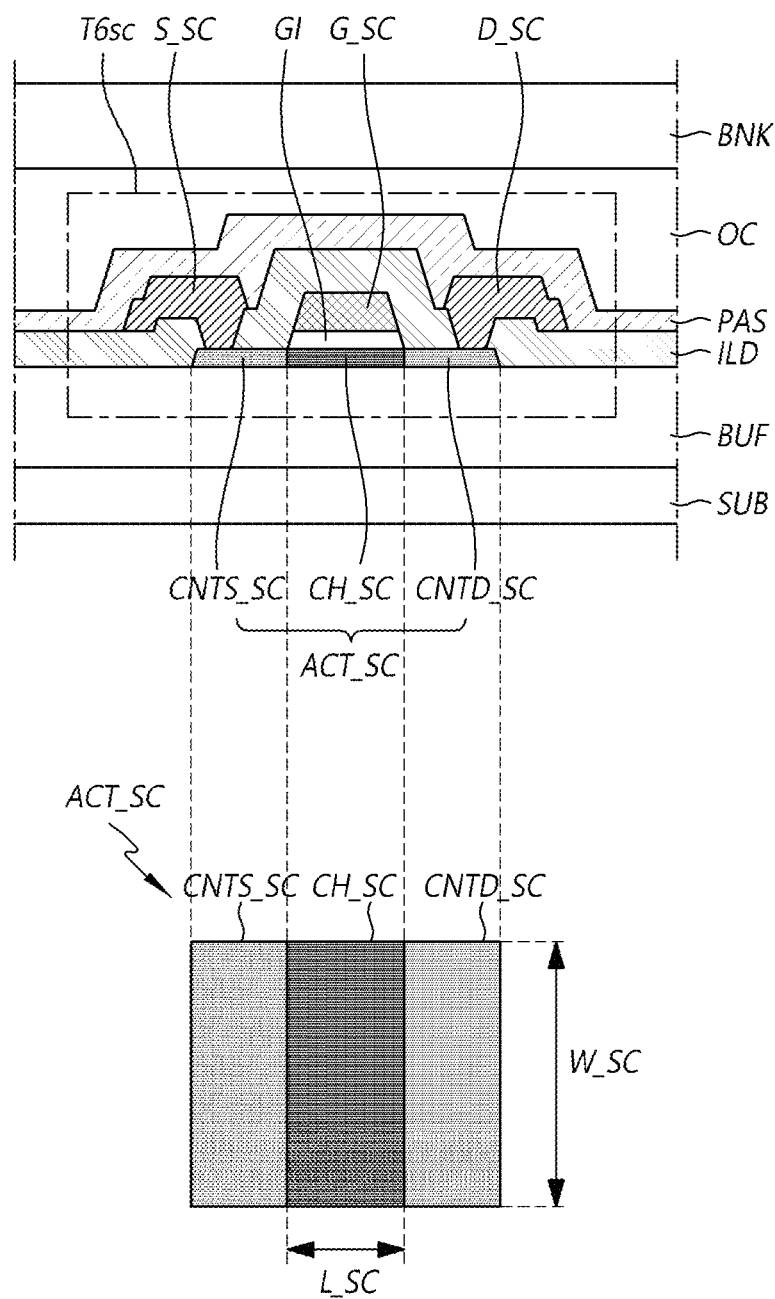
Figure 27:
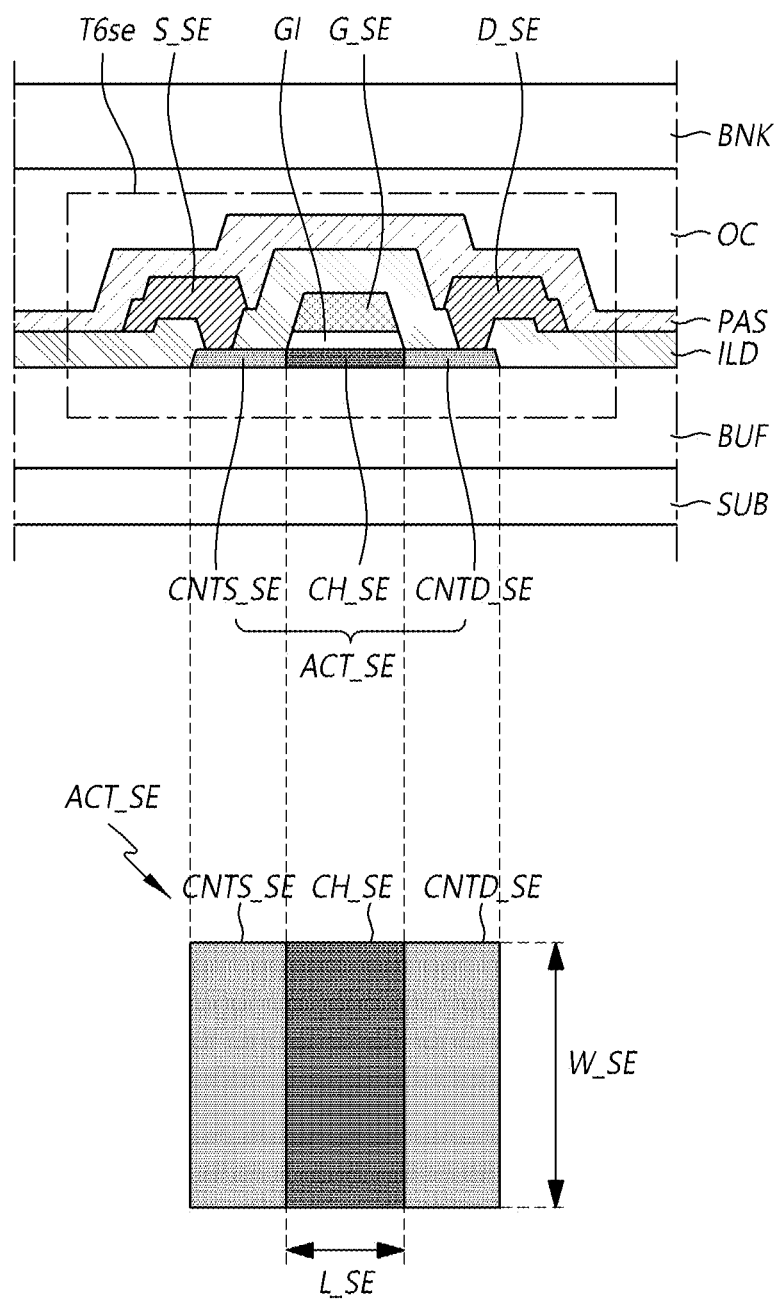

FIGS. 25 to 27 illustrates example three pull-up transistors (T6$cr$, T6$sc$, and T6$se$) disposed in the gate bezel area GBA of the display panel 110 according to aspects of the present disclosure.

Referring to FIGS. 25 to 27, the three pull-up transistors (T6$cr$, T6$sc$, and T6$se$) may be disposed on a buffer layer BUF located on a substrate SUB.

Referring to FIG. 25, the carry pull-up transistor T6$cr$ may include an active layer ACT_CR, a source electrode S_CR, a drain electrode D_CR, and a gate electrode G_CR.

The active layer ACT_CR of the carry pull-up transistor T6$cr$ may be disposed on the buffer layer BUF, and include a channel region CH_CR, a source connection portion CNTS_CR located on a first side of the channel region CH_CR and connected to the source electrode S_CR, and a drain connection portion CNTD_CR located on a second opposing side of the channel region CH_CR and connected to the drain electrode D_CR.

A gate insulating layer GI may be disposed on the channel region CH_CR of the active layer ACT_CR. The gate electrode G_CR of the carry pull-up transistor T6$cr$ may be disposed on the gate insulating layer GI and may overlap with the channel region CH_CR of the active layer ACT_CR.

An interlayer insulating layer ILD may be disposed on the gate electrode G_CR and the active layer ACT_CR. The source electrode S_CR and the drain electrode D_CR of the carry pull-up transistor T6cr may be disposed on the interlayer insulating layer ILD. The source electrode S_CR of the carry pull-up transistor T6cr may be connected to the source connection portion CNTS_CR of the active layer ACT_CR through a contact hole in the interlayer insulating layer ILD. The drain electrode D_CR of the carry pull-up transistor T6cr may be connected to the drain connection portion CNTD_CR of the active layer ACT_CR through a contact hole in the interlayer insulating layer ILD.

A protective layer PAS may be disposed on the source electrode S_CR and the drain electrode D_CR of the carry pull-up transistor T6cr. An overcoat layer OC may be disposed on the protective layer PAS, and a bank BNK may be disposed on the overcoat layer OC.

Referring to FIG. 26, the scan pull-up transistor T6sc may include an active layer ACT_SC, a source electrode S_SC, a drain electrode D_SC, and a gate electrode G_SC.

The active layer ACT_SC of the scan pull-up transistor T6sc may be disposed on a buffer layer BUF, and include a channel region CH_SC, a source connection portion CNTS_SC located on a first side of the channel region CH_SC and connected to the source electrode S_SC, and a drain connection portion CNTD_SC located on a second opposing side of the channel region CH_SC and connected to the drain electrode D_SC.

A gate insulating layer GI may be disposed on the channel region CH_SC of the active layer ACT_SC of the scan pull-up transistor T6sc. The gate electrode G_SC of the scan pull-up transistor T6sc may be disposed on the gate insulating layer GI and may overlap with the channel region CH_SC of the active layer ACT_SC.

An interlayer insulating layer ILD may be disposed on the gate electrode G_SC and the active layer ACT_SC. The source electrode S_SC and the drain electrode D_SC of the scan pull-up transistor T6sc may be disposed on the interlayer insulating layer ILD. The source electrode S_SC of the scan pull-up transistor T6sc may be connected to the source connection portion CNTS_SC of the active layer ACT_SC through a contact hole in the interlayer insulating layer ILD. The drain electrode D_SC of the scan pull-up transistor T6sc may be connected to the drain connection portion CNTD_SC of the active layer ACT_SC through a contact hole in the interlayer insulating layer ILD.

A protective layer PAS may be disposed on the source electrode S_SC and the drain electrode D_SC of the scan pull-up transistor T6sc. An overcoat layer OC may be disposed on the protective layer PAS, and a bank BNK may be disposed on the overcoat layer OC.

Referring to FIG. 27, the sensing pull-up transistor T6se may include an active layer ACT_SE, a source electrode S_SE, a drain electrode D_SE, and a gate electrode G_SE.

The active layer ACT_SE of the sensing pull-up transistor T6se may be disposed on a buffer layer BUF, and include a channel region CH_SE, a source connection portion CNTS_SE located on a first side of the channel region CH_SE and connected to the source electrode S_SE, and a drain connection portion CNTD_SE located on a second opposing side of the channel region CH_SE and connected to the drain electrode D_SE.

A gate insulating layer GI may be disposed on the channel region CH_SE of the active layer ACT_SE of the sensing pull-up transistor T6se. The gate electrode G_SE of the sensing pull-up transistor T6se may be disposed on the gate insulating layer GI and may overlap with the channel region CH_SE of the active layer ACT_SE.

An interlayer insulating layer ILD may be disposed on the gate electrode G_SE and the active layer ACT_SE. The source electrode S_SE and the drain electrode D_SE of the sensing pull-up transistor T6se may be disposed on the interlayer insulating layer ILD. The source electrode S_SE of the sensing pull-up transistor T6se may be connected to the source connection portion CNTS_SE of the active layer ACT_SE through a contact hole in the interlayer insulating layer ILD. The drain electrode D_SE of the sensing pull-up transistor T6se may be connected to the drain connection portion CNTD_SE of the active layer ACT_SE through a contact hole in the interlayer insulating layer ILD.

A protective layer PAS may be disposed on the source electrode S_SE and the drain electrode D_SE of the sensing pull-up transistor T6se. An overcoat layer OC may be disposed on the protective layer PAS, and a bank BNK may be disposed on the overcoat layer OC.

Referring to FIGS. 25 and 26, a channel length L_SC of the scan pull-up transistor T6sc may be the same as, or similar to, a channel length L_CR of the carry pull-up transistor T6cr. In contrast, a channel width W_SC of the scan pull-up transistor T6sc may be greater than a channel width W_CR of the carry pull-up transistor T6cr.

Referring to FIGS. 25 to 27, a channel length LSE of the sensing pull-up transistor T6se may be the same as, or similar to, the channel length L_CR of the carry pull-up transistor T6cr, and the channel length L_SC of the scan pull-up transistor T6sc may be the same as, or similar to, the channel length L_CR of the carry pull-up transistor T6cr. In contrast, a channel width W_SE of the sensing pull-up transistor T6se may be greater than the channel width W_CR of the carry pull-up transistor T6cr, and the channel width W_SC of the scan pull-up transistor T6sc may be greater than the channel width W_CR of the carry pull-up transistor T6cr.

FIGS. 28 to 35 illustrate example electrostatic discharge structures of three clock signal lines (CL_CRCLK, CL_SCCLK, and CL_SECLK) in the display 110 according to aspects of the present disclosure.

As described above with reference to FIG. 22, the display panel 110 according to aspects of the present disclosure may include the electrostatic discharge component ESD. As shown in FIG. 22, for example, the electrostatic discharge component ESD may be disposed in an outer corner area in the non-display area NDA of the display panel 110. The electrostatic discharge component ESD may be disposed not only in the outer corner area but also in various locations where a discharge function is required.

Figure 28:
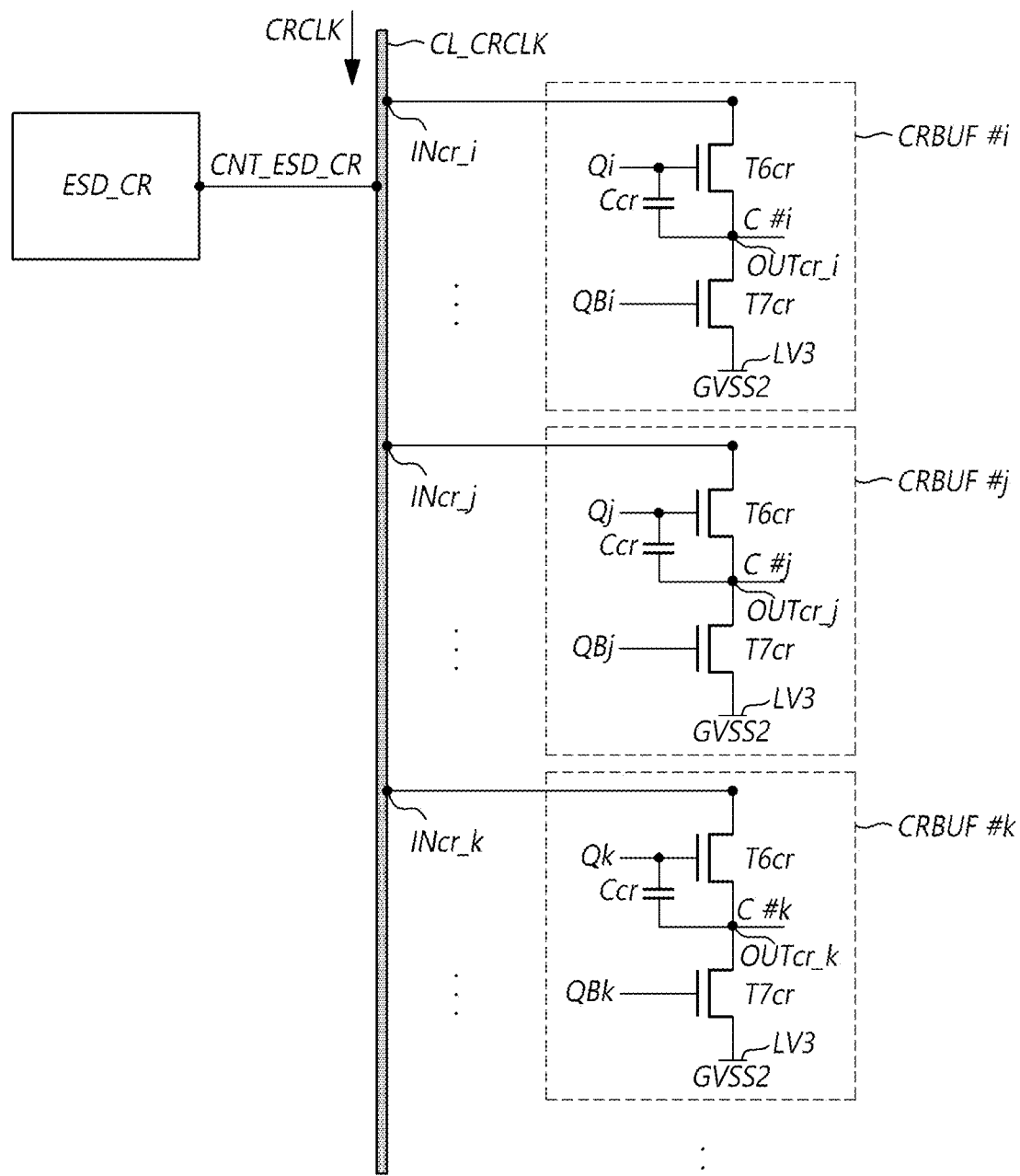
FIGS. 28 to 35 illustrate example electrostatic discharge structures of three clock signal lines in the display panel according to aspects of the present disclosure.

Referring to FIG. 28, in one or more embodiments, to discharge static electricity flowing into a carry clock signal line CL_CRCLK, the electrostatic discharge component ESD disposed in the display panel 110 may include a carry electrostatic discharge circuit ESD_CR electrically connected to the carry clock signal line CL_CRCLK.

Referring to FIG. 28, the carry clock signal line CL_CRCL may be electrically connected to a plurality of carry output buffers (CRBUF #i, CRBUF #j, and CRBUF #k) included in a plurality of stage circuits (GPC #i, GPC #j, and GPC #k).

Referring to FIG. 28, each of an i-th carry output buffer CRBUF #i, a j-th carry output buffer CRBUF #j, and a k-th carry output buffer CRBUF #k may include a corresponding carry pull-up transistor T6cr and a corresponding carry pull-down transistor T7cr.

Referring to FIG. 28, the carry pull-up transistor T6cr included in the i-th carry output buffer CRBUF #i can be turned on or turned off depending on a voltage of a gate node connected to an i-th Q node Qi, and thereby, control a connection between a carry clock node INcr_i to which a carry clock signal CRCLK is input and a carry output node OUTcr_i from which a carry signal C#i is output.

Referring to FIG. 28, a bootstrapping capacitor Ccr may be connected between the gate node and the source node of the carry pull-up transistor T6cr included in the i-th carry output buffer CRBUF #i. The gate node of the carry pull-up transistor T6cr may be connected to the i-th Q node Qi, and the source node of the carry pull-up transistor T6cr may correspond to the carry output node OUTcr_i.

Referring to FIG. 28, the carry pull-down transistor T7cr included in the i-th carry output buffer CRBUF #i can be turned on or turned off depending on a voltage of a gate node connected to an i-th QB node QBi, and thereby, control a connection between a third gate low voltage node LV3 to which a third gate low voltage GVSS2 is applied and the carry output node OUTcr_i to which the carry signal C#i is output.

Referring to FIG. 28, the carry pull-up transistor T6cr included in the j-th carry output buffer CRBUF #j can be turned on or turned off depending on a voltage of a gate node connected to a j-th Q node Qj, and thereby, control a connection between a carry clock node INcr_j to which the carry clock signal CRCLK is input and a carry output node OUTcr_j from which a carry signal C#j is output.

Referring to FIG. 28, a bootstrapping capacitor Ccr may be connected between the gate node and the source node of the carry pull-up transistor T6cr included in the j-th carry output buffer CRBUF #j. The gate node of the carry pull-up transistor T6cr may be connected to the j-th Q node Qj, and the source node of the carry pull-up transistor T6cr may correspond to the carry output node OUTcr_j.

Referring to FIG. 28, the carry pull-down transistor T7cr included in the j-th carry output buffer CRBUF #j can be turned on or turned off depending on a voltage of a gate node connected to a j-th QB node QBj, and thereby, control a connection between the third gate low voltage node LV3 to which the third gate low voltage GVSS2 is applied and the carry output node OUTcr_j to which the carry signal C#j is output.

Referring to FIG. 28, the carry pull-up transistor T6cr included in the k-th carry output buffer CRBUF #k can be turned on or turned off depending on a voltage of a gate node connected to a k-th Q node Qk, and thereby, control a connection between a carry clock node INcr_k to which the carry clock signal CRCLK is input and a carry output node OUTcr_k from which a carry signal C#k is output.

Referring to FIG. 28, a bootstrapping capacitor Ccr may be connected between the gate node and the source node of the carry pull-up transistor T6cr included in the k-th carry output buffer CRBUF #k. The gate node of the carry pull-up transistor T6cr may be connected to the k-th Q node Qk, and the source node of the carry pull-up transistor T6cr may correspond to the carry output node OUTcr_k.

Referring to FIG. 28, the carry pull-down transistor T7cr included in the k-th carry output buffer CRBUF #k can be turned on or turned off depending on a voltage of a gate node connected to a k-th QB node QBk, and thereby, control a connection between the third gate low voltage node LV3 to which the third gate low voltage GVSS2 is applied and the carry output node OUTcr_k to which the carry signal C#k is output.

Figure 29:
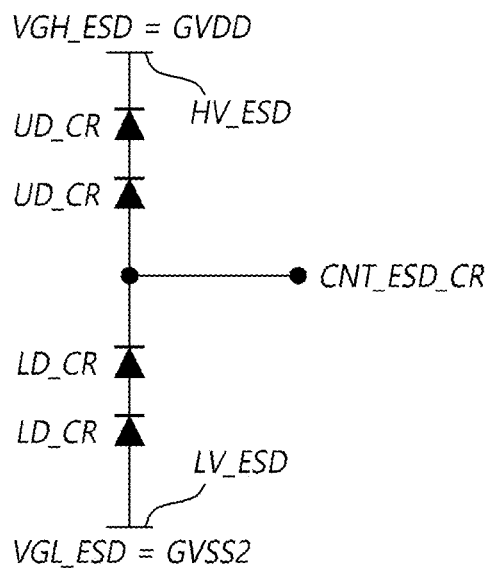

Referring to FIG. 29, the carry electrostatic discharge circuit ESD_CR may include at least one first diode UD_CR connected between a point CNT_ESD_CR electrically connected to the carry clock signal line CL_CRCLK and an electrostatic discharge high level voltage node HV_ESD, and at least one second diode LD_CR connected between the point CNT_ESD_CR electrically connected to the carry clock signal line CL_CRCLK and an electrostatic discharge low level voltage node LV_ESD.

The at least one first diode UD_CR can have a connection state in which forward current can flow from the point CNT_ESD_CR electrically connected to the carry clock signal line CL_CRCLK to the electrostatic discharge high level voltage node HV_ESD.

The at least one second diode LD_CR can have a connection state in which forward current can flow from the electrostatic discharge low level voltage node LV_ESD to the point CNT_ESD_CR electrically connected to the carry clock signal line CL_CRCLK.

A plurality of first diodes UD_CR may be connected in series to each other. A plurality of second diodes LD_CR may be connected in series to each other.

An electrostatic discharge high level voltage VGH_ESD can be applied to the electrostatic discharge high level voltage node HV_ESD. For example, the electrostatic discharge high level voltage VGH_ESD may be a first gate high voltage GVDD.

An electrostatic discharge low level voltage VGL_ESD can be applied to the electrostatic discharge low level voltage node LV_ESD. For example, the electrostatic discharge low level voltage VGL_ESD may be a third gate low voltage GVSS2.

Figure 30:
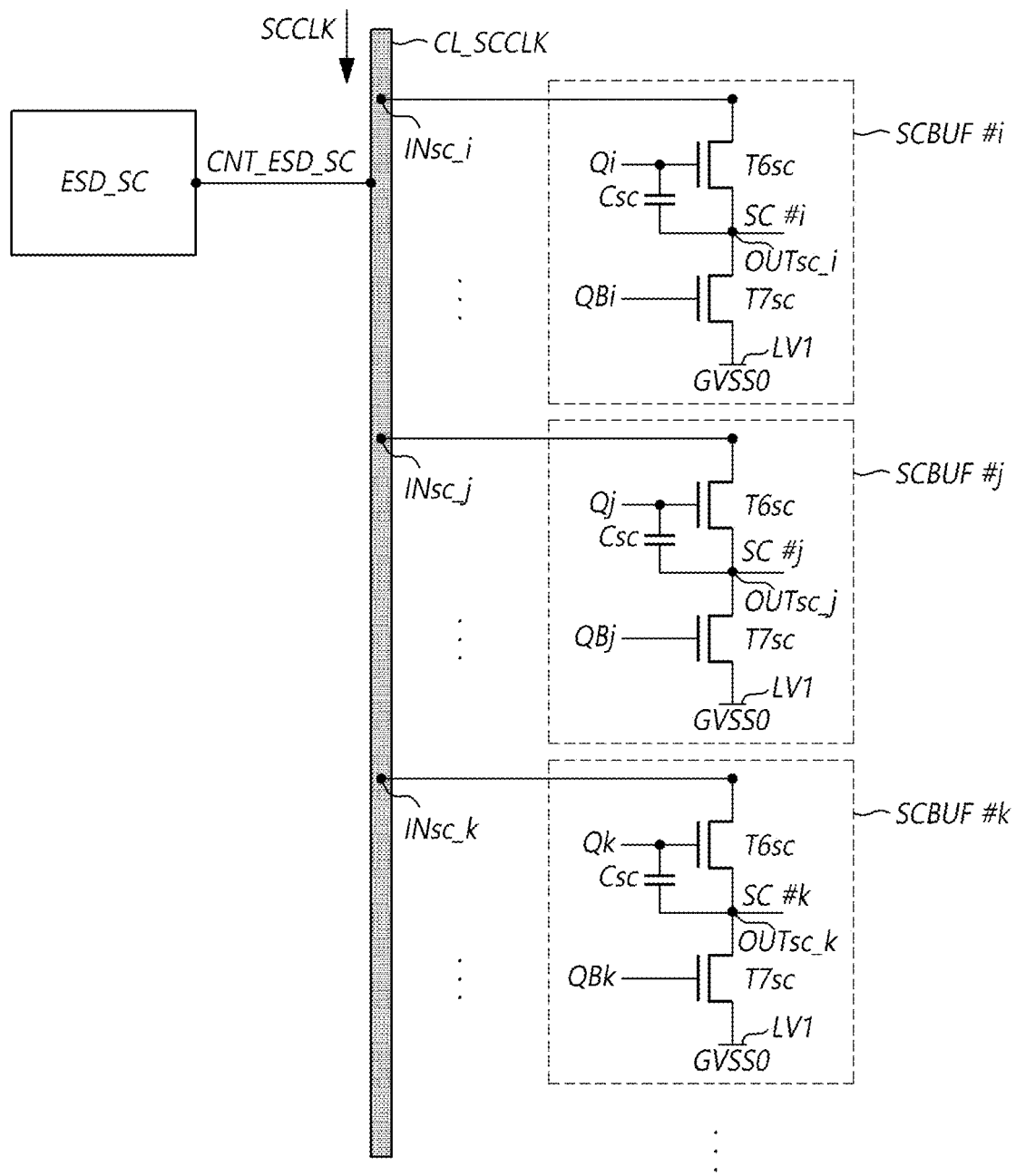

Referring to FIG. 30, a scan clock signal line CL_SCCLK may be electrically connected to a plurality of scan output buffers (SCBUF #i, SCBUF #j, and SCBUF #k) included in the plurality of stage circuits (GPC #i, GPC #j, and GPC #k).

Referring to FIG. 30, each of an i-th scan output buffer SCBUF #i, a j-th scan output buffer SCBUF #j, and a k-th scan output buffer SCBUF #k may include a corresponding scan pull-up transistor T6sc and a corresponding scan pull-down transistor T7sc Referring to FIG. 30, the scan pull-up transistor T6sc included in the i-th scan output buffer SCBUF #i can be turned on or turned off depending on a voltage of a gate node connected to an i-th Q node Qi, and thereby, control a connection between a scan clock node INsc_i to which a scan clock signal SCCLK is input and a scan output node OUTsc_i from which a scan signal SC #i is output.

Referring to FIG. 30, a bootstrapping capacitor Csc may be connected between the gate node and the source node of the scan pull-up transistor T6sc included in the i-th scan output buffer SCBUF #i. The gate node of the scan pull-up transistor T6sc may be connected to the i-th Q node Qi, and the source node of the scan pull-up transistor T6sc may correspond to the scan output node OUTsc_i.

Referring to FIG. 30, the scan pull-down transistor T7sc included in the i-th scan output buffer SCBUF #i can be turned on or turned off depending on a voltage of a gate node connected to an i-th QB node QBi, and thereby, control a connection between a first gate low voltage node LV1 to which a first gate low voltage GVSS0 is applied and the scan output node OUTsc_i to which the scan signal SC #i is output.

Referring to FIG. 30, the scan pull-up transistor T6sc included in the j-th scan output buffer SCBUF #j can be turned on or turned off depending on a voltage of a gate node connected to a j-th Q node Qj, and thereby, control a connection between a scan clock node INsc_j to which the scan clock signal SCCLK is input and a scan output node OUTsc_j from which a scan signal SC #j is output.

Referring to FIG. 30, a bootstrapping capacitor Csc may be connected between the gate node and the source node of the scan pull-up transistor T6sc included in the j-th scan output buffer SCBUF #j. The gate node of the scan pull-up transistor T6sc may be connected to the j-th Q node Qj, and the source node of the scan pull-up transistor T6sc may correspond to the scan output node OUTsc_j.

Referring to FIG. 30, the scan pull-down transistor T7sc included in the j-th scan output buffer SCBUF #j can be turned on or turned off depending on a voltage of a gate node connected to a j-th QB node QBj, and thereby, control a connection between the first gate low voltage node LV1 to which the first gate low voltage GVSS0 is applied and the scan output node OUTsc_j to which the scan signal SC #j is output.

Referring to FIG. 30, the scan pull-up transistor T6sc included in the k-th scan output buffer SCBUF #j can be turned on or turned off depending on a voltage of a gate node connected to a k-th Q node Qk, and thereby, control a connection between a scan clock node INsc_k to which the scan clock signal SCCLK is input and a scan output node OUTsc_k from which a scan signal SC #k is output.

Referring to FIG. 30, a bootstrapping capacitor Csc may be connected between the gate node and the source node of the scan pull-up transistor T6sc included in the k-th scan output buffer SCBUF #k. The gate node of the scan pull-up transistor T6sc may be connected to the k-th Q node Qk, and the source node of the scan pull-up transistor T6sc may correspond to the scan output node OUTsc_k.

Referring to FIG. 30, the scan pull-down transistor T7sc included in the k-th scan output buffer SCBUF #k can be turned on or turned off depending on a voltage of a gate node connected to a k-th QB node QBk, and thereby, control a connection between the first gate low voltage node LV1 to which the first gate low voltage GVSS0 is applied and the scan output node OUTsc_k to which the scan signal SC #k is output.

Referring to FIG. 30, in one or more embodiments, to discharge static electricity flowing into the scan clock signal line CL_SCCLK, the electrostatic discharge component ESD disposed in the display panel 110 may include a scan electrostatic discharge circuit ESD_SC electrically connected to the scan clock signal line CL_SCCLK.

Figure 31A:
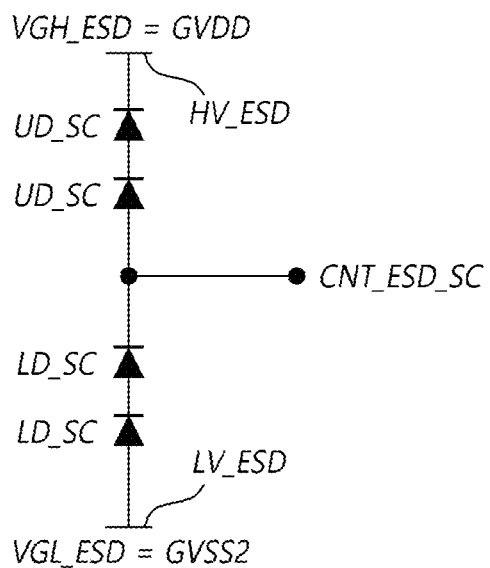
Figure 31B:
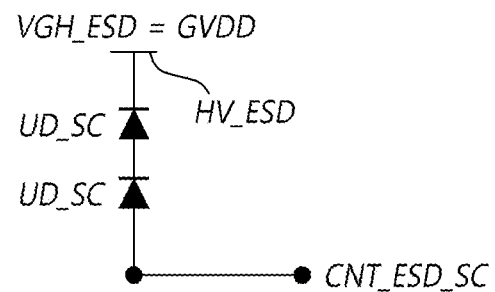

In one or more embodiments, the scan electrostatic discharge circuit ESD_SC may have the circuit configuration of FIG. 31A or FIG. 31B.

Referring to FIG. 31A, an example scan electrostatic discharge circuit ESD_SC may include at least one third diode UD_SC connected between a point CNT_ESD_SC electrically connected to the scan clock signal line CL_SCCLK and an electrostatic discharge high level voltage node HV_ESD, and at least one fourth diode LD_SC connected between the point CNT_ESD_SC electrically connected to the scan clock signal line CL_SCCLK and an electrostatic discharge low level voltage node LV_ESD.

Referring to FIG. 31B, an example scan electrostatic discharge circuit ESD_SC may include at least one third diode UD_SC connected between a point CNT_ESD_SC electrically connected to the scan clock signal line CL_SCCLK and an electrostatic discharge high level voltage node HV_ESD. Referring to FIG. 31B, the scan electrostatic discharge circuit ESD_SC may not include the at least one fourth diode LD_SC in the scan electrostatic discharge circuit ESD_SC of FIG. 31A.

The at least one third diode UD_SC in FIG. 31A or 31B can have a connection state in which forward current can flow from the point CNT_ESD_SC electrically connected to the scan clock signal line CL_SCCLK to the electrostatic discharge high level voltage node HV_ESD.

The at least one fourth diode LD_SC can have a connection state in which forward current can flow from the electrostatic discharge low level voltage node LV_ESD to the point CNT_ESD_SC electrically connected to the scan clock signal line CL_SCCLK.

A plurality of third diodes LD_SC may be connected in series to each other. A plurality of fourth diodes LD_SC may be connected in series to each other.

When the scan electrostatic discharge circuit ESD_SC has the circuit configuration of FIG. 31B, the scan electrostatic discharge circuit ESD_SC may have a different circuit configuration from the carry electrostatic discharge circuit ESD_CR.

Referring to FIGS. 28 to 31B, the scan clock signal line CL_SCCLK has a greater line width than the carry clock signal line CL_CRCLK, and the scan pull-up transistor T6sc may have a greater channel width than the carry pull-up transistor T6cr.

Accordingly, even when static electricity flows into the scan clock signal line CL_SCCLK, such static electricity can be effectively discharged through the scan clock signal line CL_SCCLK and/or the channel of the scan pull-up transistor T6sc.

Figure 32:
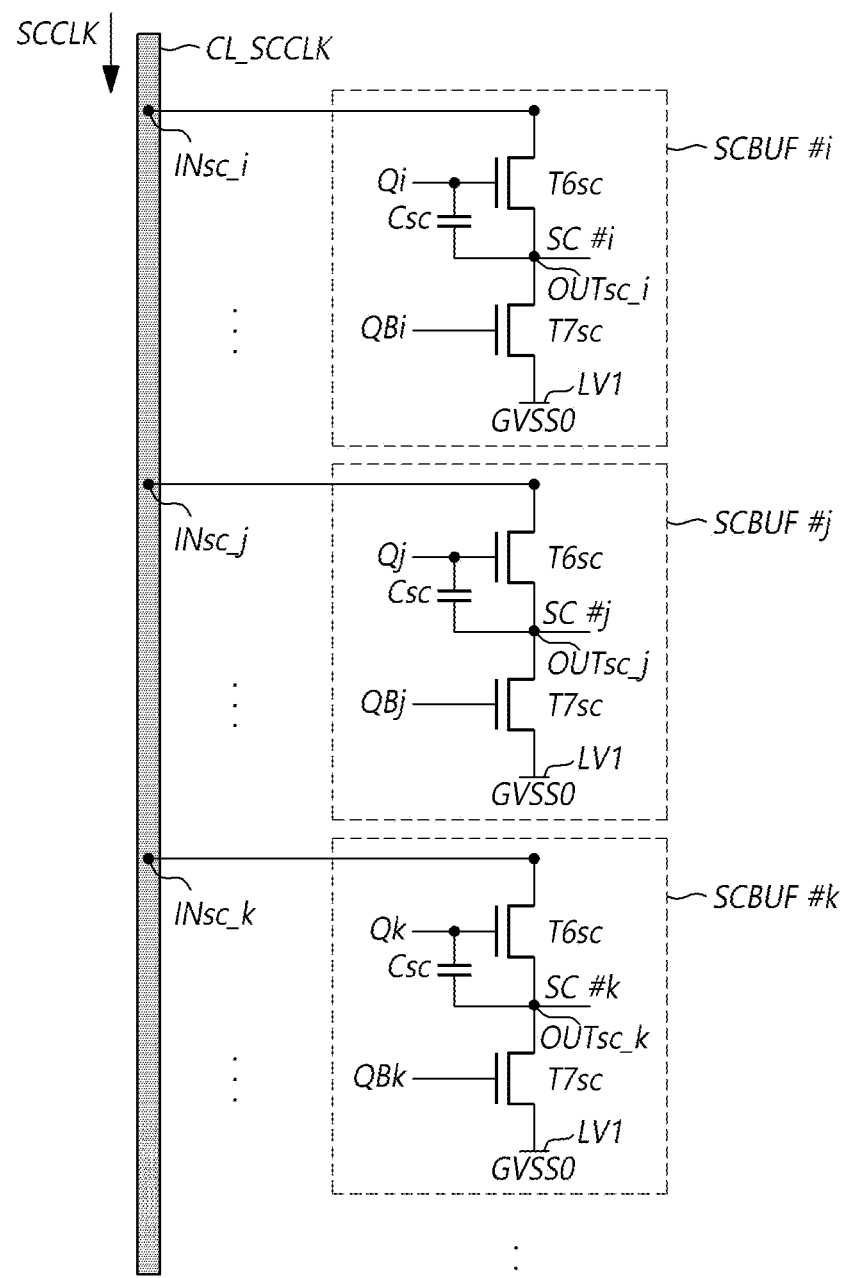

Therefore, as shown in FIG. 32, a scan electrostatic discharge circuit ESD_SC may not be connected to the scan clock signal line CL_SCCLK. In other words, referring to FIGS. 28 to 32, the carry electrostatic discharge circuit ESD_CR can be connected only to the carry clock signal line CL_CRCLK among the carry clock signal line CL_CRCLK and the scan clock signal line CL_SCCLK.

Figure 33:
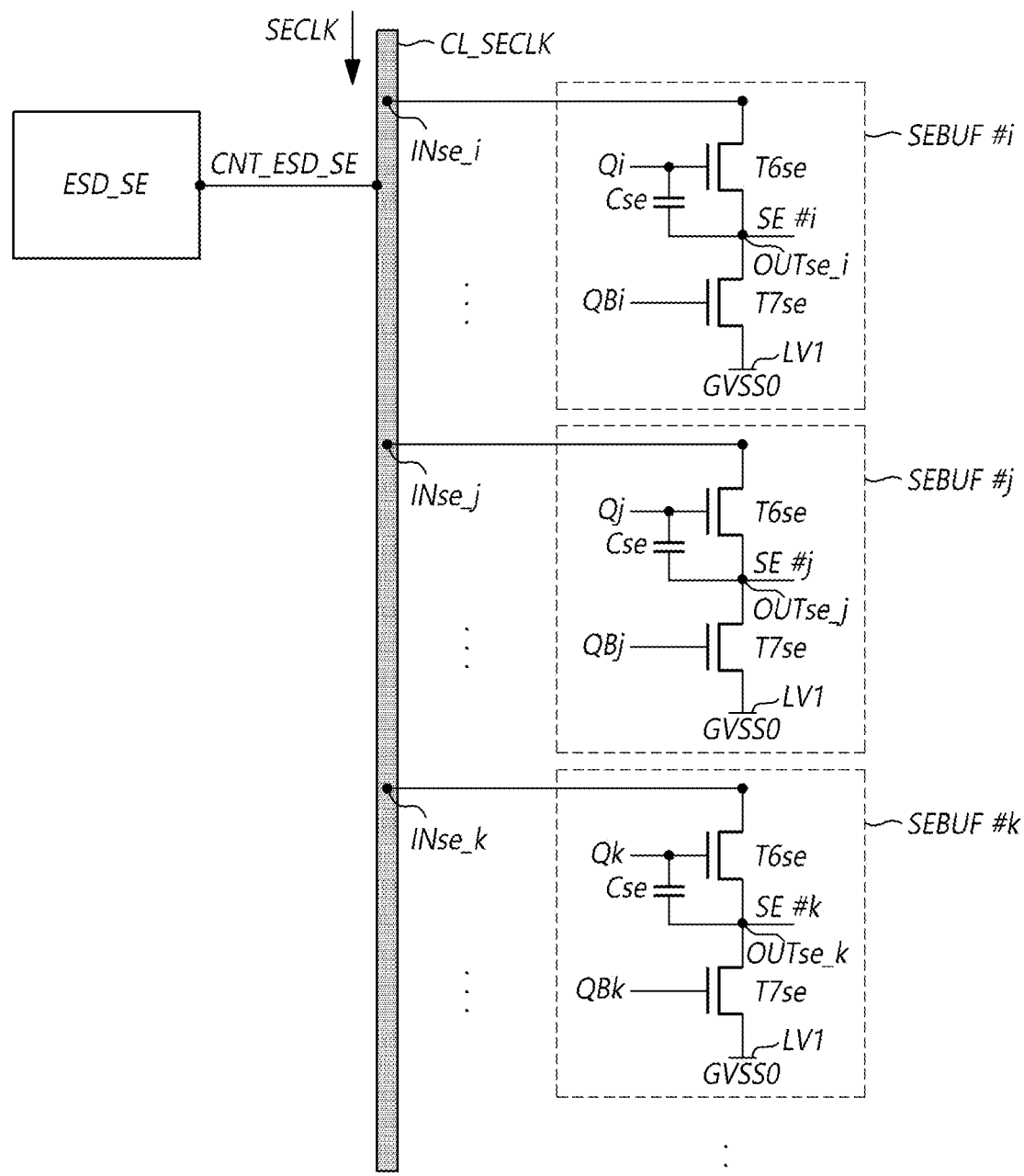

Referring to FIG. 33, a sensing clock signal line CL_SECLK may be electrically connected to a plurality of sensing output buffers (SEBUF #i, SEBUF #j, and SEBUF #k) included in the plurality of stage circuits (GPC #i, GPC #j, and GPC #k).

Referring to FIG. 33, each of an i-th sensing output buffer SEBUF #i, a j-th sensing output buffer SEBUF #j, and a k-th sensing output buffer SEBUF #k may include a corresponding sensing pull-up transistor T6se and a corresponding sensing pull-down transistor T7se Referring to FIG. 33, the sensing pull-up transistor T6se included in the i-th sensing output buffer SEBUF #i can be turned on or turned off depending on a voltage of a gate node connected to an i-th Q node Qi, and thereby, control a connection between a sensing clock node INse_i to which a sensing clock signal SECLK is input and a sensing output node OUTse_i from which a sensing signal SE #i is output.

Referring to FIG. 30, a bootstrapping capacitor Cse may be connected between the gate node and the source node of the sensing pull-up transistor T6se included in the i-th sensing output buffer SEBUF #i. The gate node of the sensing pull-up transistor T6se may be connected to the i-th Q node Qi, and the source node of the sensing pull-up transistor T6se may correspond to the sensing output node OUTse_i.

Referring to FIG. 33, the sensing pull-down transistor T7se included in the i-th sensing output buffer SEBUF #i can be turned on or turned off depending on a voltage of a gate node connected to an i-th QB node QBi, and thereby, control a connection between the first gate low voltage node LV1 to which the first gate low voltage GVSS0 is applied and the sensing output node OUTse_i to which the sensing signal SE #i is output.

Referring to FIG. 33, the sensing pull-up transistor T6*se* included in the j-th sensing output buffer SEBUF #j can be turned on or turned off depending on a voltage of a gate node connected to a j-th Q node Qj, and thereby, control a connection between a sensing clock node INse_j to which the sensing clock signal SECLK is input and a sensing output node OUTse_j from which a sensing signal SE #j is output.

Referring to FIG. 33, a bootstrapping capacitor Cse may be connected between the gate node and the source node of the sensing pull-up transistor T6*se* included in the j-th sensing output buffer SEBUF #j. The gate node of the sensing pull-up transistor T6*se* may be connected to the j-th Q node Qj, and the source node of the sensing pull-up transistor T6*se* may correspond to the sensing output node OUTse_j.

Referring to FIG. 33, the sensing pull-down transistor T7*se* included in the j-th sensing output buffer SEBUF #j can be turned on or turned off depending on a voltage of a gate node connected to a j-th QB node QBj, and thereby, control a connection between the first gate low voltage node LV1 to which the first gate low voltage GVSS0 is applied and the sensing output node OUTse_j to which the sensing signal SE #j is output.

Referring to FIG. 33, the sensing pull-up transistor T6*se* included in the k-th sensing output buffer SEBUF #k can be turned on or turned off depending on a voltage of a gate node connected to a k-th Q node Qk, and thereby, control a connection between a sensing clock node INse_k to which the sensing clock signal SECLK is input and a sensing output node OUTse_k from which a sensing signal SE #k is output.

Referring to FIG. 33, a bootstrapping capacitor Cse may be connected between the gate node and the source node of the sensing pull-up transistor T6*se* included in the k-th sensing output buffer SEBUF #k. The gate node of the sensing pull-up transistor T6*se* may be connected to the k-th Q node Qj, and the source node of the sensing pull-up transistor T6*se* may correspond to the sensing output node OUTse_k.

Referring to FIG. 33, the sensing pull-down transistor T7*se* included in the k-th sensing output buffer SEBUF #k can be turned on or turned off depending on a voltage of a gate node connected to a k-th QB node QBk, and thereby, control a connection between the first gate low voltage node LV1 to which the first gate low voltage GVSS0 is applied and the sensing output node OUTse_k to which the sensing signal SE #k is output.

Referring to FIG. 33, in one or more embodiments, to discharge static electricity flowing into the sensing clock signal line CL_SECLK, the electrostatic discharge component ESD disposed in the display panel 110 may include a sensing electrostatic discharge circuit ESD_SE electrically connected to the sensing clock signal line CL_SECLK.

Figure 34A:
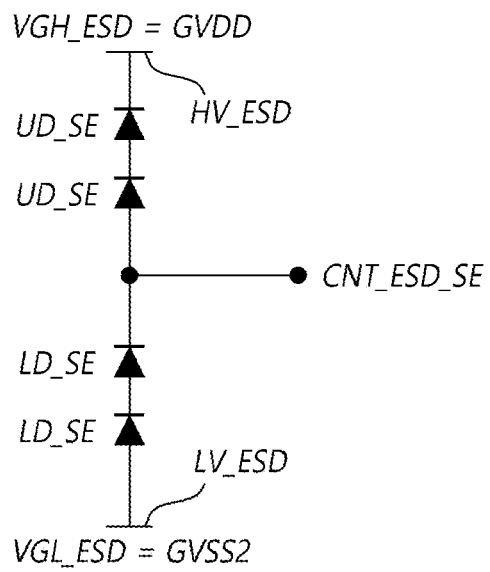
Figure 34B:
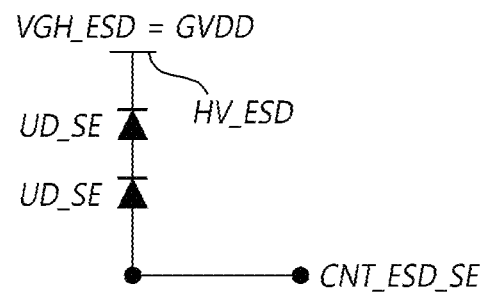

In one or more embodiments, the sensing electrostatic discharge circuit ESD_SE may have the circuit configuration of FIG. 34A or FIG. 34B.

Referring to FIG. 34A, an example sensing electrostatic discharge circuit ESD_SE may include at least one fifth diode UD_SE connected between a point CNT_ESD_SE electrically connected to the sensing clock signal line CL_SECLK and an electrostatic discharge high level voltage node HV_ESD, and at least one sixth diode LD_SE connected between the point CNT_ESD_SE electrically connected to the sensing clock signal line CL_SECLK and an electrostatic discharge low level voltage node LV_ESD.

Referring to FIG. 34B, an example sensing electrostatic discharge circuit ESD_SE may include at least one fifth diode UD_SE connected between a point CNT_ESD_SE electrically connected to the sensing clock signal line CL_SECLK and an electrostatic discharge high level voltage node HV_ESD. Referring to FIG. 34B, the sensing electrostatic discharge circuit ESD_SE may not include the at least one sixth diode LD_SE in the sensing electrostatic discharge circuit ESD_SE of FIG. 34A.

The at least one fifth diode UD_SE in FIG. 34A or 34B can have a connection state in which forward current can flow from the point CNT_ESD_SE electrically connected to the sensing clock signal line CL_SECLK to the electrostatic discharge high level voltage node HV_ESD.

The at least one sixth diode LD_SE can have a connection state in which forward current can flow from the electrostatic discharge low level voltage node LV_ESD to the point CNT_ESD_SE electrically connected to the sensing clock signal line CL_SECLK.

A plurality of fifth diodes LD_SE may be connected in series to each other. A plurality of sixth diodes LD_SE may be connected in series to each other.

When the sensing electrostatic discharge circuit ESD_SE has the circuit configuration of FIG. 34B, the sensing electrostatic discharge circuit ESD_SE may have a different circuit configuration from the carry electrostatic discharge circuit ESD_CR.

Referring to FIGS. 28 to 34B, the sensing clock signal line CL_SECLK has a greater line width than the carry clock signal line CL_CRCLK, and the sensing pull-up transistor T6*se* may have a channel width greater than the carry pull-up transistor T6*cr*.

Accordingly, even when static electricity flows into the sensing clock signal line CL_SECLK, such static electricity can be effectively discharged through the sensing clock signal line CL_SECLK and/or the channel of the sensing pull-up transistor T6*se*.

Figure 35:
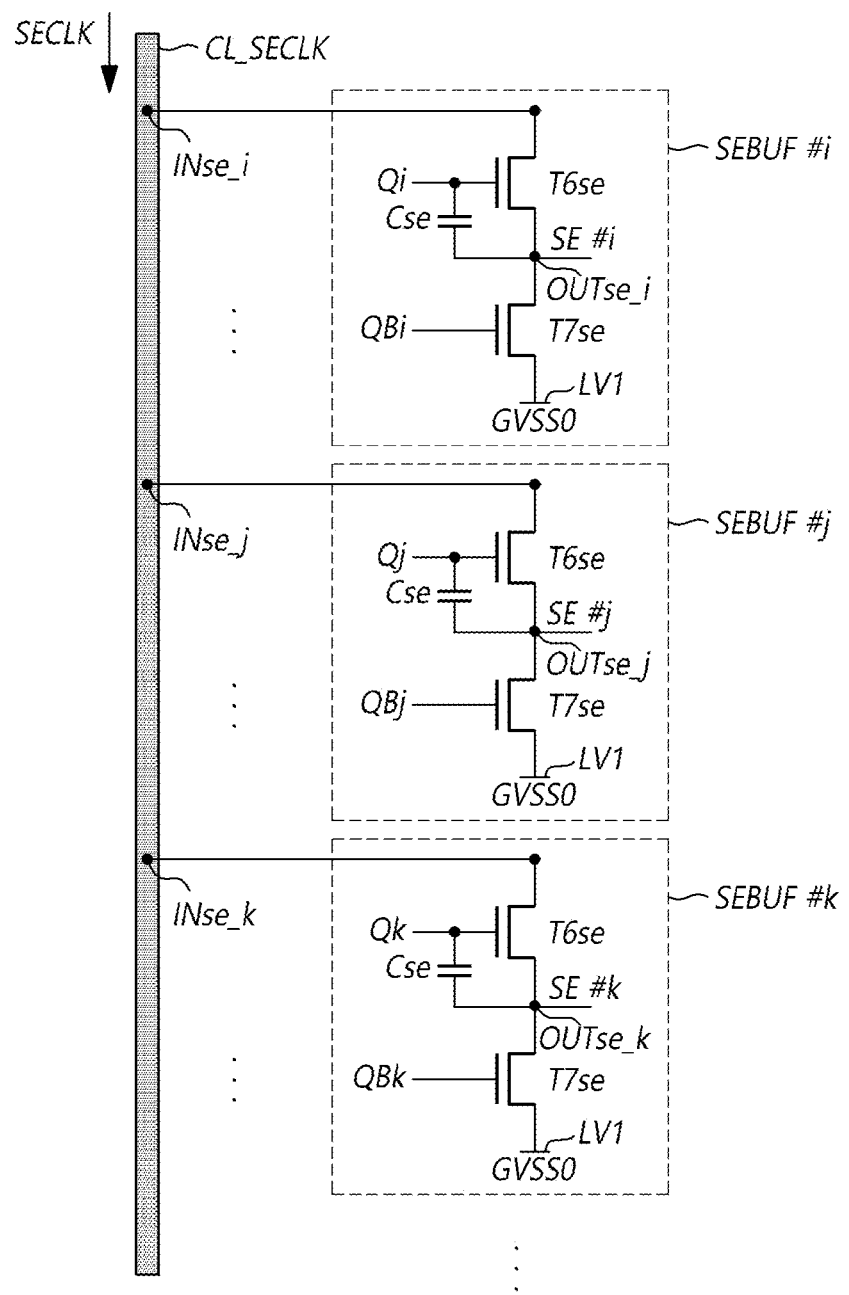

Therefore, as shown in FIG. 35, a sensing electrostatic discharge circuit ESD_SE may not be connected to the sensing clock signal line CL_SECLK. In other words, referring to FIGS. 28 to 35, the carry electrostatic discharge circuit ESD_CR may be connected only to the carry clock signal line CL_CRCLK among the carry clock signal line CL_CRCLK and the sensing clock signal line CL_SECLK.

Hereinafter, as the display panel 110 has the improved electrostatic discharge structures according to the configurations of FIGS. 28, 30, 32, 33, and 35, even when an electrostatic discharge circuit is not connected to a scan clock signal line CL_SCCLK, and static electricity flows in a scan clock signal line CL_SCCLK, the principle of enabling electrostatic discharge will be discussed with reference to FIGS. 36 and 37.

Figure 36:
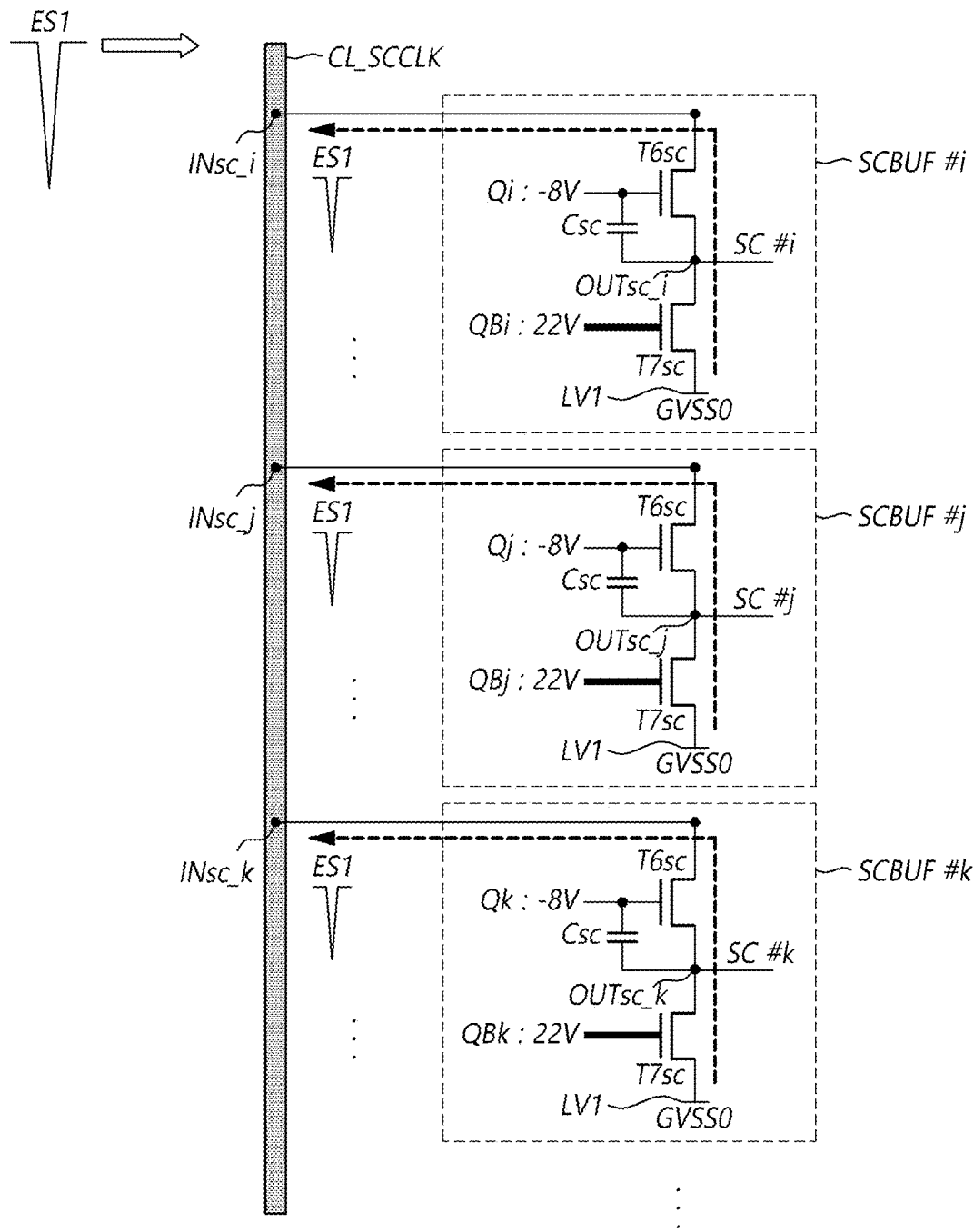
FIGS. 36 and 37 are diagrams for explaining the principle of electrostatic discharge when static electricity flows into a scan clock signal line in the display panel according to aspects of the present disclosure.
Figure 37:
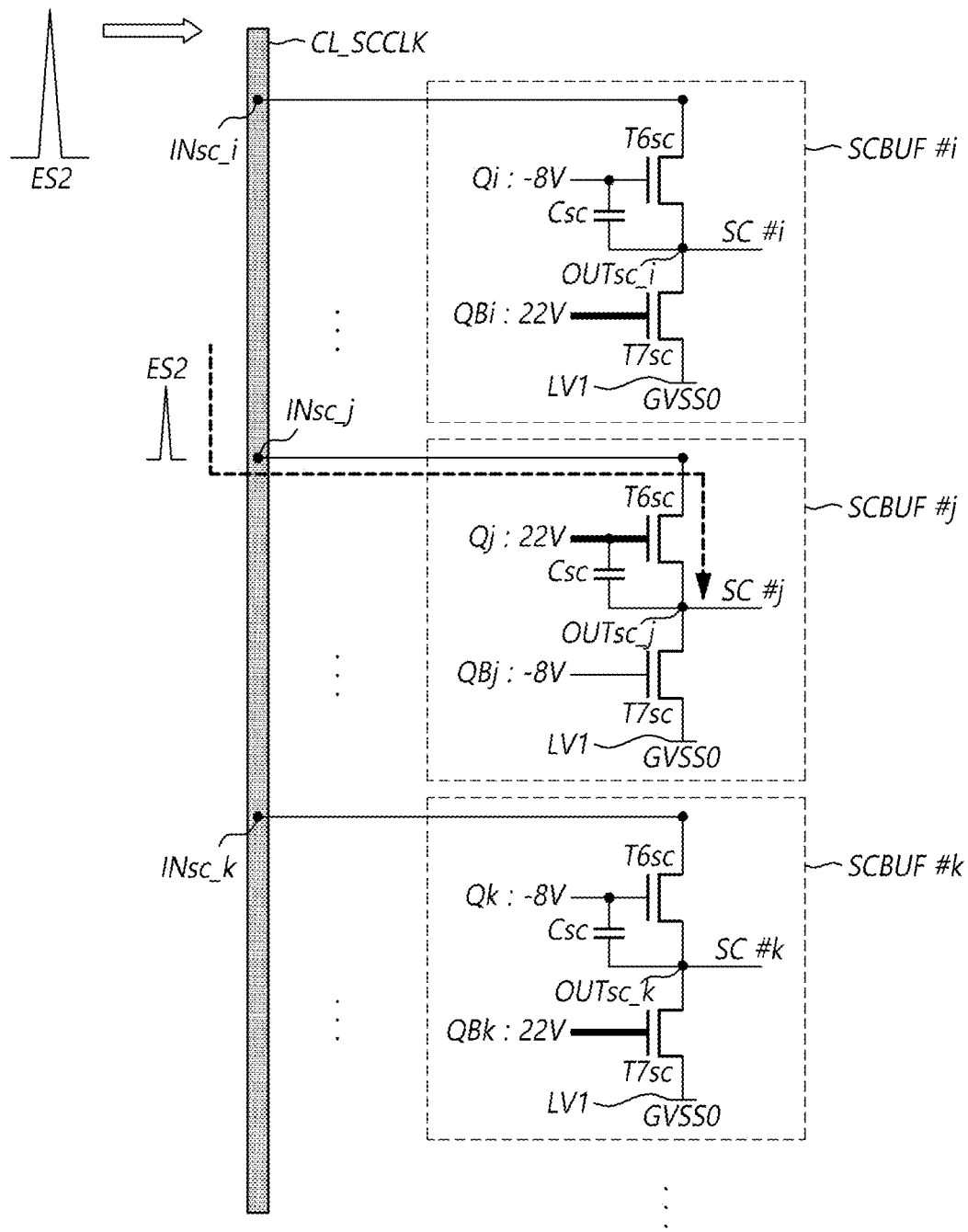

FIGS. 36 and 37 are diagrams for explaining the principle of electrostatic discharge when static electricity (ES1, or ES2) flows into a scan clock signal line CL_SCCLK in the display panel 110 according to aspects of the present disclosure.

The principle of electrostatic discharge in a situation where first static electricity ES1 with an under peak flows into a scan clock signal line CL_SCCLK will be explained with reference to FIG. 36, and the principle of electrostatic discharge in a situation where second static electricity ES2 with an over peak flows into a scan clock signal line CL_SCCLK will be explained with reference to FIG. 37.

The under peak of the first static electricity ES1 may have a very high negative voltage (e.g., −1 KV) in the negative direction. The over peak of the second static electricity ES2 may have a very high positive voltage (e.g., +1 KV) in the positive direction.

Referring to FIG. 36, when the first static electricity ES1 with such an under peak flows into a scan clock signal line CL_SCCLK, all or one or more of a plurality of scan output buffers connected to the scan clock signal line CL_SCCLK may output a scan signal with a turn-off level voltage (e.g., a low level voltage).

For example, when the first static electricity ES1 with such an under peak flows into the scan clock signal line CL_SCCLK, i-th, j-th, and k-th scan output buffers (SCBUF #i, SCBUF #j, and SCBUF #k) connected to the scan clock signal line CL_SCCLK may output scan signals (SC #i, SC #j, and SC #k) with the turn-off level voltage (e.g., the low level voltage).

In this situation, i-th, j-th, and k-th Q nodes (Qi, Qj, and Qk) respectively connected to the i-th, j-th, and k-th scan output buffers (SCBUF #i, SCBUF #j, and SCBUF #k) may be the low level voltage (e.g., −8V), and i-th, j-th, and k-th QB nodes (QBi, QBj, and QBk) respectively connected to the i-th, j-th, and k-th scan output buffers (SCBUF #i, SCBUF #j, and SCBUF #k) may be the high level voltage (e.g., 22V).

At this time, since the i-th, j-th, and k-th QB nodes (QBi, QBj, and QBk) are the high level voltage (e.g., 22V), a respective scan pull-down transistor T7sc included in each of the i-th, j-th, and k-th scan output buffers (SCBUF #i, SCBUF #j, and SCBUF #k) can be turned on. Further, even when the i-th, j-th, and k-th Q nodes (Qi, Qj, and Qk) are the low level voltage (e.g., −8V), as the first static electricity ES1 having flowed into the scan clock signal line CL_SC-CLK flows into the i-th, j-th, and k-th scan output buffers (SCBUF #i, SCBUF #j, and SCBUF #k), a respective scan pull-up transistor T6sc included in each of the i-th, j-th, and k-th scan output buffers (SCBUF #i, SCBUF #j, and SCBUF #k) can be turned on.

When the first static electricity ES1 having flowed into the scan clock signal line CL_SCCLK flows into the i-th, j-th, and k-th scan output buffers (SCBUF #i, SCBUF #j, and SCBUF #k), all of the respective scan pull-up transistor T6sc and scan pull-down transistor T7sc included in each of the i-th, j-th, and k-th scan output buffers (SCBUF #i, SCBUF #j, and SCBUF #k) can be in the turn-on state. The first static electricity ES1 having flowed into the scan clock signal line CL_SCCLK can be discharged to a first gate low voltage node LV1 through the scan pull-up transistor T6sc and the scan pull-down transistor T7sc.

In this way, when the first static electricity ES1 flows into the scan clock signal line CL_SCCLK, even when there is no electrostatic discharge circuit connected to the scan clock signal line CL_SCCLK, the first static electricity ES1 can be discharged through the first gate low voltage node LV1.

Referring to FIG. 37, when the second static electricity ES2 with such an over peak flows into a scan clock signal line CL_SCCLK, one or more of a plurality of scan output buffers connected to the scan clock signal line CL_SCCLK may output a scan signal with a turn-on level voltage (e.g., a high level voltage).

For example, when the second static electricity ES2 with such an over peak flows into the scan clock signal line CL_SCCLK, among i-th, j-th, and k-th scan output buffers (SCBUF #i, SCBUF #j, and SCBUF #k) connected to the scan clock signal line CL_SCCLK, the i-th and k-th scan output buffers (SCBUF #i and SCBUF #k) may output scan signals (SC #i and SC #k) with a turn-off level voltage (e.g., a low level voltage), and the j-th scan output buffer SCBUF #j may output a scan signal SC #j with the turn-on level voltage (e.g., the high level voltage).

In this situation, i-th and k-th Q nodes (Qi and Qk) respectively connected to the i-th and k-th scan output buffers (SCBUF #i and SCBUF #k) may be the low level voltage (e.g., −8V), and i-th, and k-th QB nodes (QBi and QBk) respectively connected to the i-th and k-th scan output buffers (SCBUF #i and SCBUF #k) may be the high level voltage (e.g., 22V). Further, a j-th Q node Qj connected to the j-th scan output buffer SCBUF #j may be the high level voltage (e.g., 22V), and a j-th QB node QBj connected to the j-th scan output buffer SCBUF #j may be the low level voltage (e.g., −8V).

At this time, since the j-th Q node Qj is the high level voltage (e.g., 22V), a scan pull-up transistor T6sc included in the j-th scan output buffer SCBUF #j can be turned on.

Referring to FIG. 37, the second static electricity ES2 having flowed into the scan clock signal line CL_SCCLK can be discharged to the active layer of the scan pull-up transistor T6sc included in the j-th scan output buffer SCBUF #j, which is one of the plurality of scan output buffers (SCBUF #i, SCBUF #j, and SCBUF #k).

The display panel 110 according to the embodiments described above may include a substrate SUB including a display area DA in which an image can be displayed and a non-display area NDA different from the display area DA, and a gate driving panel circuit GPC disposed in the non-display area NDA, configured to output a first signal based on a first clock signal, and configured to output a second signal based on a second clock signal.

The display panel 110 according to the embodiments described above may include a first clock signal line disposed in the non-display area NDA and delivering the first clock signal to the gate driving panel circuit GPC, and a second clock signal line disposed in the non-display area NDA and delivering the second clock signal to the gate driving panel circuit GPC.

In display panel 110 according to the embodiments described above, the second clock signal line may be disposed further outwardly than the first clock signal line, and a width of the second clock signal line may be greater than that of the first clock signal line.

For example, the first clock signal line may be a carry clock signal line CL_CRCLK. The second clock signal line may be a scan clock signal line CL_SCCLK or a sensing clock signal line CL_SECLK.

In this case, the first signal generated based on the first clock signal may be a signal (e.g., a carry signal) not applied to the display area DA, and the second signal may be a signal (e.g., a scan signal or a sensing signal) applied to the display area DA.

The embodiments of the touch display device 100 according to aspects of the present disclosure described above can be briefly discussed as follows.

According to the embodiment described herein, a display device (e.g., the display device 100) can be provided that includes a substrate including a display area in which images can be displayed and a non-display area different from the display area, a gate driving panel circuit disposed in the non-display area, configured to output a carry signal based on a carry clock signal, and configured to output a scan signal based on a scan clock signal, a carry clock signal line disposed in the non-display area and delivering the carry clock signal to the gate driving panel circuit, and a scan clock signal line disposed in the non-display area and delivering the scan clock signal to the gate driving panel circuit.

The scan clock signal line may be located further outwardly than the carry clock signal line.

The carry clock signal line may be located further outwardly than the gate driving panel circuit.

Further, the gate driving panel circuit can be configured to additionally output a sensing signal based on a sensing clock signal.

The display device may further include a sensing clock signal line disposed in the non-display area and delivering the sensing clock signal to the gate driving panel circuit.

The sensing clock signal line may be located further outwardly than the carry clock signal line. The sensing clock signal line may be disposed between the scan clock signal line and the carry clock signal line.

The gate driving panel circuit may include an output buffer block including a scan output buffer for outputting the scan signal based on the scan clock signal and a carry output buffer for outputting the carry signal based on the carry clock signal, and a logic block for controlling operation of the output buffer block.

The scan output buffer may include a scan pull-up transistor connected between a scan clock node to which the scan clock signal is input and a scan output node from which the scan signal is output, and a scan pull-down transistor connected between a first gate low voltage node and the scan output node.

The carry output buffer may include a carry pull-up transistor connected between a carry clock node to which the carry clock signal is input and a carry output node from which the carry signal is output, and a carry pull-down transistor connected between a gate low voltage node different from the first gate low voltage node and the carry output node.

The gate driving panel circuit may include a Q node to which respective gate nodes of the carry pull-up transistor and the scan pull-up transistor are electrically connected, and a QB node to which respective gate nodes of the carry pull-down transistor and the scan pull-down transistor are electrically connected.

The logic block can control respective voltages of the Q node and the QB node.

A channel width of the scan pull-up transistor may be greater than a channel width of the carry pull-up transistor.

The output buffer block may further include a sensing output buffer for outputting the sensing signal based on the sensing clock signal.

The sensing output buffer may include a sensing pull-up transistor connected between a sensing clock node to which the sensing clock signal is input and a sensing output node from which the sensing signal is output, and a sensing pull-down transistor connected between the first gate low voltage node and the sensing output node.

The gate driving panel circuit may include a Q node to which respective gate nodes of the carry pull-up transistor, the scan pull-up transistor, and the sensing pull-up transistor are electrically connected, and a QB node to which respective gate nodes of the carry pull-down transistor, the scan pull-down transistor, and the sensing pull-down transistor are electrically connected.

The logic block can control respective voltages of the Q node and the QB node.

A channel width of the sensing pull-up transistor may be greater than that of the carry pull-up transistor, and a channel width of the scan pull-up transistor may be greater than that of the carry pull-up transistor.

The display device may further include a carry electrostatic discharge circuit electrically connected to the carry clock signal line, and a scan electrostatic discharge circuit electrically connected to the scan clock signal line.

The carry electrostatic discharge circuit and the scan electrostatic discharge circuit may have different circuit configurations from each other.

The carry electrostatic discharge circuit may include at least one first diode connected between a point electrically connected to the carry clock signal line and an electrostatic discharge high level voltage node, and at least one second diode connected between the point electrically connected to the carry clock signal line and an electrostatic discharge low level voltage node.

Compared with the carry electrostatic discharge circuit, the scan electrostatic discharge circuit may include at least one third diode connected between a point electrically connected to the scan clock signal line and an electrostatic discharge high level voltage node.

In an embodiment, the display device may further include an electrostatic discharge circuit electrically connected to only the carry clock signal line among the carry clock signal line and the scan clock signal line.

In an embodiment, the display device may further include a plurality of scan output buffers connected to the scan clock signal line.

Each of the plurality of scan output buffers may include a scan pull-up transistor connected between a scan output node and the scan clock signal line, and a scan pull-down transistor connected between the first gate low voltage node and the scan output node.

When first static electricity with an under-peak flows into the scan clock signal line, the first static electricity can be discharged from the scan clock signal line to the first gate low voltage node through the scan pull-up transistor and scan pull-down transistor included in each of the plurality of scan output buffers.

When second static electricity with an over-peak flows into the scan clock signal line, the second static electricity can be discharged into the active layer of the scan pull-up transistor included in one of the plurality of scan output buffers.

A width of the scan clock signal line may be greater than a width of the carry clock signal line.

A scan signal may be applied to the display area, and a carry signal may not be applied to the display area.

In an embodiment, the display device may include at least one gate high voltage line disposed between the carry clock signal line and the gate driving panel circuit, and at least one gate low voltage line disposed between the gate driving panel circuit and the display area.

According to the embodiment described herein a display panel (e.g., the display panel 110) can be provided that includes a substrate including a display area in which images can be displayed and a non-display area different from the display area, a gate driving panel circuit disposed over the substrate, disposed in the non-display area, configured to output a first signal based on a first clock signal, and configured to output a second signal based on a second clock signal, a first clock signal line disposed over the substrate, disposed in the non-display area, and delivering the first clock signal to the gate driving panel circuit, and a second clock signal line disposed over the substrate, disposed in the non-display area, and delivering the second clock signal to the gate driving panel circuit.

The second clock signal line may be disposed further outwardly than the first clock signal line, and a width of the second clock signal line may be greater than a width of the first clock signal line.

Among the first signal and the second signal, the second signal may be a signal applied to the display area.

According to the embodiments described herein, a gate driving panel circuit having a structure suitable for the gate-in-panel (GIP) type and a display device including the gate driving panel circuit may be provided.

According to the embodiments described herein, a display panel and a display device may be provided that have an effective electrostatic discharge structure.

According to the embodiments described herein, a display panel and a display device may be provided that have a clock signal line arrangement structure that is advantageous to electrostatic discharge.

According to the embodiments described herein, a display panel and a display device may be provided that have a scan pull-up transistor that is advantageous to electrostatic discharge.

According to the embodiments described herein, a display device may be provided that has a wiring structure for stably supplying various types of signals or power to a gate driving panel circuit disposed in a display panel.

According to the embodiments described herein, since a display panel and a display device are designed to include a gate driving panel circuit disposed on a substrate of the display panel and formed during the manufacturing process of the display panel or the display device, advantage of enabling process optimization of the display panel and the display device can be provided.

The embodiments of the present disclosure described above have been described for illustrative purposes; those skilled in the art will appreciate that various modifications, additions and substitutions are possible, without departing from the scope and spirit of the invention as disclosed in the accompanying claims. Although the example embodiments have been described for illustrative purposes, a person skilled in the art will appreciate that various modifications and applications are possible without departing from the essential characteristics of the present disclosure. For example, the specific components of the example embodiments may be variously modified.

What is claimed is:

1. A display device, comprising:
   a substrate comprising a display area in which images are displayed and a non-display area different from the display area;
   a gate driving panel circuit disposed in the non-display area, configured to output a carry signal based on a carry clock signal, and configured to output a scan signal based on a scan clock signal;
   a carry clock signal line disposed in the non-display area and delivering the carry clock signal to the gate driving panel circuit; and
   a scan clock signal line disposed in the non-display area and delivering the scan clock signal to the gate driving panel circuit,
   wherein the scan clock signal line is located further outwardly than the carry clock signal line.

2. The display device of claim 1, wherein the carry clock signal line is located further outwardly than the gate driving panel circuit.

3. The display device of claim 1, further comprising a sensing clock signal line disposed in the non-display area and delivering a sensing clock signal to the gate driving panel circuit,
   wherein the gate driving panel circuit is configured to additionally output a sensing signal based on the sensing clock signal, and
   wherein the sensing clock signal line is located further outwardly than the carry clock signal line.

4. The display device of claim 3, wherein the sensing clock signal line is disposed between the scan clock signal line and the carry clock signal line.

5. The display device of claim 1, wherein the gate driving panel circuit comprises:
   an output buffer block comprising a scan output buffer for outputting the scan signal based on the scan clock signal and a carry output buffer for outputting the carry signal based on the carry clock signal; and
   a logic block for controlling operation of the output buffer block,
   wherein the scan output buffer comprises:
      a scan pull-up transistor connected between a scan clock node to which the scan clock signal is input and a scan output node from which the scan signal is output; and
      a scan pull-down transistor connected between a first gate low voltage node and the scan output node, and
   wherein the carry output buffer comprises:
      a carry pull-up transistor connected between a carry clock node to which the carry clock signal is input and a carry output node from which the carry signal is output; and
      a carry pull-down transistor connected between a second gate low voltage node different from the first gate low voltage node and the carry output node.

6. The display device of claim 5, wherein the gate driving panel circuit comprises:
   a Q node to which respective gate nodes of the carry pull-up transistor and the scan pull-up transistor are electrically connected; and
   a QB node to which respective gate nodes of the carry pull-down transistor and the scan pull-down transistor are electrically connected, and
   wherein the logic block controls respective voltages of the Q node and the QB node.

7. The display device of claim 5, wherein a channel width of the scan pull-up transistor is greater than a channel width of the carry pull-up transistor.

8. The display device of claim 5, wherein the output buffer block further comprises a sensing output buffer for outputting the sensing signal based on the sensing clock signal, and
   wherein the sensing output buffer comprises:
      a sensing pull-up transistor connected between a sensing clock node to which the sensing clock signal is input and a sensing output node from which the sensing signal is output; and
      a sensing pull-down transistor connected between the first gate low voltage node and the sensing output node.

9. The display device of claim 8, wherein the gate driving panel circuit comprises:
   a Q node to which respective gate nodes of the carry pull-up transistor, the scan pull-up transistor, and the sensing pull-up transistor are electrically connected; and a QB node to which respective gate nodes of the carry pull-down transistor, the scan pull-down transistor, and the sensing pull-down transistor are electrically connected, and wherein the logic block controls respective voltages of the Q node and the QB node.

10. The display device of claim 8, wherein a channel width of the sensing pull-up transistor is greater than that of the carry pull-up transistor, and a channel width of the scan pull-up transistor is greater than that of the carry pull-up transistor.

11. The display device of claim 1, further comprising:
an electrostatic discharge circuit electrically connected to only the carry clock signal line among the carry clock signal line and the scan clock signal line.

12. The display device of claim 1, further comprising:
a carry electrostatic discharge circuit electrically connected to the carry clock signal line; and
a scan electrostatic discharge circuit electrically connected to the scan clock signal line,
wherein the carry electrostatic discharge circuit and the scan electrostatic discharge circuit have different circuit configurations from each other.

13. The display device of claim 12, wherein the carry electrostatic discharge circuit comprises:
at least one first diode connected between a point electrically connected to the carry clock signal line and an electrostatic discharge high level voltage node; and
at least one second diode connected between the point electrically connected to the carry clock signal line and an electrostatic discharge low level voltage node, and
wherein the scan electrostatic discharge circuit comprises at least one third diode connected between a point electrically connected to the scan clock signal line and the electrostatic discharge high level voltage node.

14. The display device of claim 1, further comprising a plurality of scan output buffers connected to the scan clock signal line,
wherein each of the plurality of scan output buffers comprises:
a scan pull-up transistor connected between a scan output node and the scan clock signal line; and
a scan pull-down transistor connected between a first gate low voltage node and the scan output node.

15. The display device of claim 14, wherein when first static electricity with an under-peak flows into the scan clock signal line, the first static electricity is discharged from the scan clock signal line to the first gate low voltage node through the scan pull-up transistor and scan pull-down transistor included in each of the plurality of scan output buffers.

16. The display device of claim 14, wherein when second static electricity with an over-peak flows into the scan clock signal line, the second static electricity is discharged into an active layer of the scan pull-up transistor included in one of the plurality of scan output buffers.

17. The display device of claim 1, wherein a width of the scan clock signal line is greater than a width of the carry clock signal line.

18. The display device of claim 1, further comprising:
at least one gate high voltage line disposed between the carry clock signal line and the gate driving panel circuit; and
at least one gate low voltage line disposed between the gate driving panel circuit and the display area.

19. A display panel, comprising:
a substrate comprising a display area in which images are displayed and a non-display area different from the display area;
a gate driving panel circuit disposed in the non-display area, configured to output a first signal based on a first clock signal, and configured to output a second signal based on a second clock signal;
a first clock signal line disposed in the non-display area, and delivering the first clock signal to the gate driving panel circuit; and
a second clock signal line disposed over the substrate, disposed in the non-display area, and delivering the second clock signal to the gate driving panel circuit,
wherein the second clock signal line is disposed further outwardly than the first clock signal line, and a width of the second clock signal line is greater than that of the first clock signal line.

20. The display panel of claim 19, wherein among the first signal and the second signal, the second signal is a signal applied to the display area.

\* \* \* \* \*